US009042156B2

(12) United States Patent  
Nakura et al.

(10) Patent No.: US 9,042,156 B2
(45) Date of Patent: May 26, 2015

(54) SEMICONDUCTOR MEMORY DEVICE AND SEMICONDUCTOR DEVICE

(71) Applicants: SHARP KABUSHIKI KAISHA, Osaka (JP); ELPIDA MEMORY, INC., Tokyo (JP)

(72) Inventors: Mitsuru Nakura, Osaka (JP); Nobuyoshi Awaya, Osaka (JP); Kazuya Ishihara, Osaka (JP); Akiyoshi Seko, Tokyo (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 464 days.

(21) Appl. No.: 13/647,573

(22) Filed: Oct. 9, 2012

(65) Prior Publication Data

US 2013/0088911 A1    Apr. 11, 2013

(30) Foreign Application Priority Data

Oct. 7, 2011    (JP) .................................. 2011-223087

(51) Int. Cl.
G11C 11/00 (2006.01)
G11C 13/00 (2006.01)

(52) U.S. Cl.
CPC ........ G11C 13/0028 (2013.01); G11C 13/0002 (2013.01); G11C 13/004 (2013.01); G11C 13/0069 (2013.01); G11C 2013/0073 (2013.01); G11C 2013/0078 (2013.01); G11C 2213/79 (2013.01)

(58) Field of Classification Search
CPC ............. G11C 13/0069; G11C 13/004; G11C 13/0007; G11C 2233/70; G11C 2213/79

USPC ..................... 365/148, 158, 171, 173, 189.16
See application file for complete search history.

(56) References Cited

U.S. PATENT DOCUMENTS

| 6,815,744 | B1 * | 11/2004 | Beck et al. ..................... 257/295 |
| 2007/0206403 | A1 | 9/2007 | Shirahama et al. |
| 2008/0151652 | A1 | 6/2008 | Oh et al. |
| 2010/0214818 | A1 | 8/2010 | Kitagawa et al. |
| 2010/0226164 | A1 | 9/2010 | Nagashima et al. |
| 2011/0128773 | A1 | 6/2011 | Azuma et al. |
| 2011/0128776 | A1 * | 6/2011 | Katoh et al. .................. 365/148 |
| 2011/0216577 | A1 * | 9/2011 | Tomotani et al. ............. 365/148 |

(Continued)

FOREIGN PATENT DOCUMENTS

CN    102067234 A    5/2011
JP    2007-133930    5/2007

(Continued)

Primary Examiner — Gene Auduong
(74) Attorney, Agent, or Firm — Nixon & Vanderhye, P.C.

(57) ABSTRACT

A semiconductor memory device includes a writing circuit and a reading circuit. The writing circuit executes a setting action for converting a resistance of a variable resistance element to a low resistance by applying current from one end side to the other end side of a memory cell via the variable resistance element, and a resetting action for converting the resistance to a high resistance by applying current from the other end side to the one end side via the variable resistance element. The reading circuit executes a first reading action for reading a resistance state of the variable resistance element by applying current from one end side to the other end side of the memory cell via the variable resistance element, and a second reading action for reading the resistance state by applying current from the other end side to the one end side via the variable resistance element.

17 Claims, 29 Drawing Sheets

(56) References Cited

U.S. PATENT DOCUMENTS

2012/0069626 A1* 3/2012 Nakano et al. ................ 365/148
2012/0069633 A1* 3/2012 Katoh ........................... 365/148

FOREIGN PATENT DOCUMENTS

| | | |
|---|---|---|
| JP | 2007-234133 | 9/2007 |
| JP | 2009-99199 | 5/2009 |
| JP | 2010-049776 | 3/2010 |
| JP | 2010-198702 | 9/2010 |
| KR | 10-2008-0057659 A | 6/2008 |

* cited by examiner

| Switch | Case where each switch is in the ON state |
|---|---|
| SW1 | Page Reading Action, Setting Verification Action |
| SW2 | Preliminary Reading Action, Resetting Verification Action |
| SW3 | Page Reading Action |
| SW4 | Page Reading Action |
| SW5 | Data Input Process for Page Progamming Action |
| SW6 | Setting Verification Action |
| SW7 | Preliminary Reading Action, Resetting Verification Action |
| SW8 | From after Data Input Process for Page Programming Action to before the start of the first Setting Action |

FIG. 9

| Setting Verification Action | | | Preliminary Reading Action Resetting Verification Action | |
|---|---|---|---|---|
| Expected Value in Data Register | Resistance State of Variable Resistance Element Setting State: "1" Resetting State: "0" | WDATA in Judgment Register | Resistance State of Variable Resistance Element Setting State: "1" Resetting State: "0" | WDATA in Judgment Register |
| 1 | 1 | 0 | 1 | 1 |
| 0 | 1 | 0 | 1 | 0 |
| 1 | 0 | 1 | 0 | 1 |
| 0 | 0 | 0 | 0 | 1 |

FIG. 11

SEMICONDUCTOR MEMORY DEVICE AND SEMICONDUCTOR DEVICE

CROSS REFERENCE TO RELATED APPLICATION

This Nonprovisional application claims priority under 35 U.S.C. §119(a) on Patent Application No. 2011-223087 filed in Japan on Oct. 7, 2011 the entire contents of which are hereby incorporated by reference.

BACKGROUND OF THE INVENTION

1. Field of the Invention

The present invention primarily relates to a semiconductor memory device having a memory cell array configured by arranging a plurality of memory cells that include a variable resistance element for storing information based on an electrical operation characteristic in which the electrical resistance varies due to the application of electrical stress, in a row direction and a column direction, respectively.

2. Description of the Related Art

A non-volatile memory represented by a flash memory is used as a large-capacity and small-size information recording medium in vast areas including computers, communications, measurement instruments, automatic control devices, and household appliances used around individuals, and the demand for a inexpensive non-volatile memory with large capacity is extremely high. This is due to reasons that since a non-volatile memory can be electrically written and data thereof is not erased even when the power supply is turned off, the non-volatile memory can exhibit the functions of an easily portable memory card, cell phone, or data storage and program storage that stores data in a non-volatile manner as the default settings for device operation.

However, a flash memory cannot perform high-speed operations since the erasing action in which the data is erased at a logical value "1" consumes more time period, as compared to a programming action in which the data is written at a logical value "0". As regards the erasing action, although an improvement in speed can be achieved by performing the erasing action in a block unit, there still exists a problem that erasure performed in the block unit does not allow writing to be performed through random access.

Therefore, currently, as an alternative to the flash memory, new types of non-volatile memory are being researched extensively. Among these, a resistance-change memory using the phenomenon of occurrence of a resistance change due to the application of electric voltage on a metal oxide film is more beneficial as compared to a flash memory from the viewpoint of the miniaturization limit, and furthermore, due to the capability of low-voltage operation and high-speed data writing, recently its research and development are being performed increasingly.

A writing characteristic (programming and erasing characteristic) of a variable resistance element having these metal oxides is that in the case of a drive method called bipolar switching, when a voltage pulse is applied on the element in a reversed polarity in the programming action and the erasing action, respectively, the electrical resistance of the element either increases (converts to high resistance) or decreases (converts to low resistance) in accordance with the polarity of the voltage pulse, and as a result, by applying a logical value as data to each electrical resistance state, the variable resistance element can be used as a memory element.

A characteristic of the memory device using the variable resistance element having the metal oxide is that since both the programming action and the erasing action can be performed with a high speed at low voltage, high-speed writing is possible for arbitrary address. Therefore, since the data, which has conventionally been used after being developed in a DRAM, can be used in a non-volatile memory, such a memory device is expected to make a great contribution to the reduction of power consumption and improvement in usability of mobile devices. On the other hand, there are unresolved problems resulting from the driving methods specific to bipolar switching.

In order to write a precise resistance value as the storage information in a variable resistance element, and to improve the reliability of a memory element, it is preferable to repeatedly perform a writing action for changing the electrical resistance of the variable resistance element in a selected memory cell, and a reading action (verifying action) for verifying the resistance value that has been written. According to the verifying action, after a voltage pulse for the writing action has been applied to the variable resistance element in the selected memory cell, a voltage pulse for the verifying action is applied, and by detecting, by a sense amplifier, the electric current flowing in the selected memory cell or the voltage variation owing to the electric current and the like, it is verified as to whether or not the electrical resistance of the variable resistance element caused by the writing action has changed up to a desired resistance value (for example, see JP 2009-99199 A). For convenience of explanation below, it is assumed that a memory cell array is formed by arranging a plurality of memory cells in the row direction and the column direction, respectively, and while every one end of the memory cells in the same column is connected to a common bit line, every other end of all memory cells is connected to a common source plate. It is to be noted that the problem explained below is the same even for an array configuration in which every other end of the memory cells in the same row or the same column is connected to a common source line.

Conventionally, because the normal reading action for the memory cells that have already been written, and the verifying action are both performed by using the same sense amplifier, each action is executed by applying a voltage pulse of the same polarity. Therefore, when the writing action is performed based on the bipolar switching action, even if the polarity of the voltage pulse applied to the variable resistance element is different between the writing action for converting the resistance state of the variable resistance element to a low resistance (hereinafter, referred to as the "setting action"), and the writing action for converting the resistance state of the variable resistance element to a high resistance (hereinafter, referred to as the "resetting action"), the polarity of the voltage pulses applied to the variable resistance element during the verifying actions for these is the same.

In the setting action, if it is determined that the electrical resistance of the variable resistance element is not sufficiently converted to a low resistance during the verifying action after the setting action, a repeated setting action is executed. The verifying action is performed for the repeated setting action as well, and until it is determined that the electrical resistance of the variable resistance element has been sufficiently converted to a low resistance, or until the frequency of the repeated setting action reaches the prescribed frequency, the repeated setting action and its verifying action are repeated. If the polarity of the voltage pulse applied to the variable resistance element is the same between the setting action and its verifying action, the electric potential of the source plate and an unselected bit line may be retained as the reference electric potential and need not be changed, during the repetitive action.

Even in the resetting action, similar to the setting action, if it is determined that the electrical resistance of the variable resistance element is not sufficiently converted to a high resistance during the verifying action after the resetting action, a repeated resetting action is executed. The verifying action is performed for the repeated resetting action as well, and until it is determined that the electrical resistance of the variable resistance element has been sufficiently converted to a high resistance, or until the frequency of the repeated resetting action reaches the prescribed frequency, the repeated resetting action and its verifying action are repeated. As described above, if the polarity of the voltage pulse applied to the variable resistance element is the same between the setting action and its verifying action, the polarity of the voltage pulse applied to the variable resistance element is different between the resetting action and its verifying action. As a result, each time a resetting action is performed, the source plate and the unselected bit line must be precharged to a predetermined reset electric potential, and each time a verifying action is performed, the electric potential of the source plate and the unselected bit line must be discharged to the reference electric potential. As described above, every time the repeated resetting action and its verifying action are repeated, the precharging and discharging are also repeated for the source plate and the unselected bit line. Although the size of the source plate depends on the array size, the total wiring length might be long (the total area is large when the source plate is formed on a plane surface), and the source plate might have a parasitic capacitance of a few 100 pF. Even the total wiring length of the unselected bit line depends on the total number of bit lines, however, generally, since the number of unselected bit lines is extremely large than the number of selected bit lines, unselected bit lines occupy a considerable proportion of the total bit-line wiring length, and might have a parasitic capacitance of a few 100 pF, similar to a source plate. As a result, by charging and discharging such a large parasitic capacitance, the power consumption during the resetting action increases, which poses a problem. Additionally, if such a large parasitic capacitance is charged rapidly, a large spike noise occurs in the power supply potential because of which precharging cannot be performed at a high speed, and the time period of the resetting action increases, thus posing a problem. Particularly, when the predetermined reset electric potential is to be generated in an internal booster circuit, it becomes necessary to sufficiently control the output current of the driver that drives the reset electric potential such that the current supply capability of the booster circuit is not exceeded. These are the factors that cause a decline in the throughput of the repetitive action in the resetting action.

When the polarity of the voltage pulse applied to the variable resistance element is the same between the setting action and its verifying action, then as described above, the problems of increased power consumption and occurrence of noise are seen in the resetting action. Conversely, when the polarity of the voltage pulse applied to the variable resistance element is the same between the resetting action and its verifying action, the aforementioned problems of increased power consumption and occurrence of noise are seen in the setting action.

SUMMARY OF THE INVENTION

In view of the above problems specific to the bipolar switching, an object of the present invention is to provide a semiconductor memory device or a semiconductor device, by which each verifying action performed after two types of writing actions with different polarities of voltage applied to a variable resistance element can be performed at a low power consumption and a high speed.

In order to achieve the object described above, the present invention provides a semiconductor memory device including a memory cell array configured by arranging a plurality of memory cells, each of which includes a variable resistance element for storing information based on a variation in electrical resistance, in a row direction and a column direction, respectively, such that one ends of the memory cells of the same column are connected to a common first control line, and the other ends of the memory cells of at least the same row or the same column are connected to a common second control line; a selection circuit for selecting the memory cell to be written or read; a writing circuit for changing an electrical resistance of the variable resistance element of the selected memory cell; and a reading circuit for reading a resistance state of the variable resistance element of the selected memory cell, wherein the writing circuit is configured to execute each of a setting action in which the electrical resistance of the variable resistance element is converted to a low resistance by applying an electric current from the one end side to the other end side of the memory cell via the variable resistance element, and a resetting action in which the electrical resistance of the variable resistance element is converted to a high resistance by applying an electric current from the other end side to the one end side of the memory cell via the variable resistance element, and the reading circuit is configured to execute each of a first reading action in which the resistance state of the variable resistance element is read by applying an electric current from the one end side to the other end side of the memory cell via the variable resistance element, and a second reading action in which the resistance state of the variable resistance element is read by applying an electric current from the other end side to the one end side of the memory cell via the variable resistance element.

The semiconductor memory device having the aforementioned characteristics is further preferably configured such that, in a case where the writing circuit performs the setting action, the reading circuit is activated at a predetermined timing, and performs the setting verification action to determine whether the setting action is complete or not by reading the resistance state of the memory cell which is the target of the setting action through the first reading action, and in a case where the writing circuit performs the resetting action, the reading circuit is activated at a predetermined timing, and performs the resetting verification action to determine whether the resetting action is complete or not by reading the resistance state of the memory cell which is the target of the resetting action through the second reading action.

Additionally, the semiconductor memory device having the aforementioned characteristics is preferably configured such that the memory cell is configured by connecting the variable resistance element and a current control element in series.

Additionally, the semiconductor memory device having the aforementioned characteristics is also preferably configured such that the reading circuit electrically connects to either one of the first control line and the second control line to which the selected memory cell is connected, and then detects an electric current flowing in either of the control lines, or variation in voltage that occurs therein, so as to read the resistance state of the selected memory cell through an activated reading action that is either one of the first reading action and the second reading action.

Additionally, the semiconductor memory device having the aforementioned characteristics is also preferably configured such that the reading circuit includes a first reading circuit that executes the first reading action and a second reading circuit that executes the second reading action, the first reading circuit electrically connects to either one of the first control line and the second control line to which the selected memory cell is connected, and the second reading circuit electrically connects to the other of the first control line and the second control line to which the selected memory cell is connected, and then each of the first reading circuit and the second reading circuit detects the electric current flowing in either the first or the second control line to which each of the first reading circuit and the second reading circuit is electrically connected, or the magnitude or variation in voltage that occurs therein, so as to read the resistance state of the selected memory cell.

Additionally, the semiconductor memory device having the aforementioned characteristics is also preferably configured such that the reading circuit includes two types of sense amplifiers which have circuit configurations symmetrical to each other, and use active elements opposite to each other in conductivity type and electric field direction, and while one of the two types of sense amplifiers is used for the first reading action, the other is used for the second reading action.

Additionally, the semiconductor memory device having the aforementioned characteristics is also preferably configured such that, in a case where the read circuit performs a reading action that is an independent action and accompanies neither the setting action nor the resetting action, to read the resistance state of the memory cell in an already-written state in which either the setting action or the resetting action is complete, the reading circuit performs a predetermined reading action that is one of the first reading action and the second reading action.

According to the semiconductor memory device having the aforementioned characteristics, at the time of reading the resistance state of the variable resistance element, the reading circuit can execute the two reading actions including the first reading action in which reading is performed by applying an electric current from the one end side to the other end side of the memory cell via the variable resistance element, and the second reading action in which the reading is performed in the reverse manner by applying an electric current from the other end side to the one end side of the memory cell via the variable resistance element. Therefore, the first reading action in which the electric current is applied in the same direction as the setting action can be used in the setting verification action that determines whether or not the electrical resistance of the variable resistance element is appropriately converted to a low resistance after the setting action in which the electric current is applied from one end side of the memory cell to the other end side via the variable resistance element. Additionally, the second reading action in which the electric current is applied in the same direction as the resetting action can be used in the resetting verification action that determines whether or not the electrical resistance of the variable resistance element is appropriately converted to a high resistance after the resetting action in which the electric current is applied from the other end side of the memory cell to the one end side via the variable resistance element. As a result, because the polarity of the voltage applied to the selected memory cell, which is the target of the setting action or the resetting action, is the same as that during the setting action or the resetting action, and that during verifying these actions, it is possible to move the process from the setting action or the resetting action to the verifying action only by keeping the electric potential of one of the first and second control lines fixed, and by changing the level of the electric potential of the other of the first and second control lines without reversing the polarity. This means that for an unselected memory cell, which is not the target of the setting action or the resetting action and is connected to one of the first and second control lines that has a fixed electric potential, when the process moves into the verifying action, the unselected state of the unselected memory cell can be retained without changing the electric potential of the unselected control line that is the other of the first and second control lines. That is, because it is possible to move to the verifying action without a change in the electric potential of the unselected control line having a large parasitic capacitance during both the setting action and the resetting action, the entire writing process including the verifying action can be performed at a low power consumption and high speed.

Additionally, if the memory cell is configured by connecting the variable resistance element and the current control element in series, then by controlling the conduction and non-conduction of the current control element of the memory cell, the selection and non-selection of the memory cell can be separated clearly. That is, in an unselected memory cell, the electric current between both ends of the memory cell is intercepted. As a result, due to the setting action or the resetting action for a selected memory cell, invalid writing in which the variable resistance element of an unselected memory cell is mistakenly converted to a low resistance or a high resistance can be prevented. Additionally, it is possible to prevent an interferential electric current from an unselected memory cell from mixing into the electric current flowing across a selected memory cell during the first reading action or the second reading action, and improve an operating margin and speed of the reading action.

BRIEF DESCRIPTION OF THE DRAWINGS

FIG. 9 is a list table illustrating the switching conditions of switches SW1 through SW8 shown in FIG. 8.

FIG. 11 is a list table illustrating the relationship among the expected values stored in the data register, the resistance state of the variable resistance element, and the logical values (level of the signal WDATA) written into the judgment register.

DETAILED DESCRIPTION OF THE INVENTION

The embodiments of the semiconductor memory device according to the present invention (hereinafter, appropriately abbreviated as "the device of the present invention") will be described below in detail with reference to drawings.

First Embodiment

Figure 1:
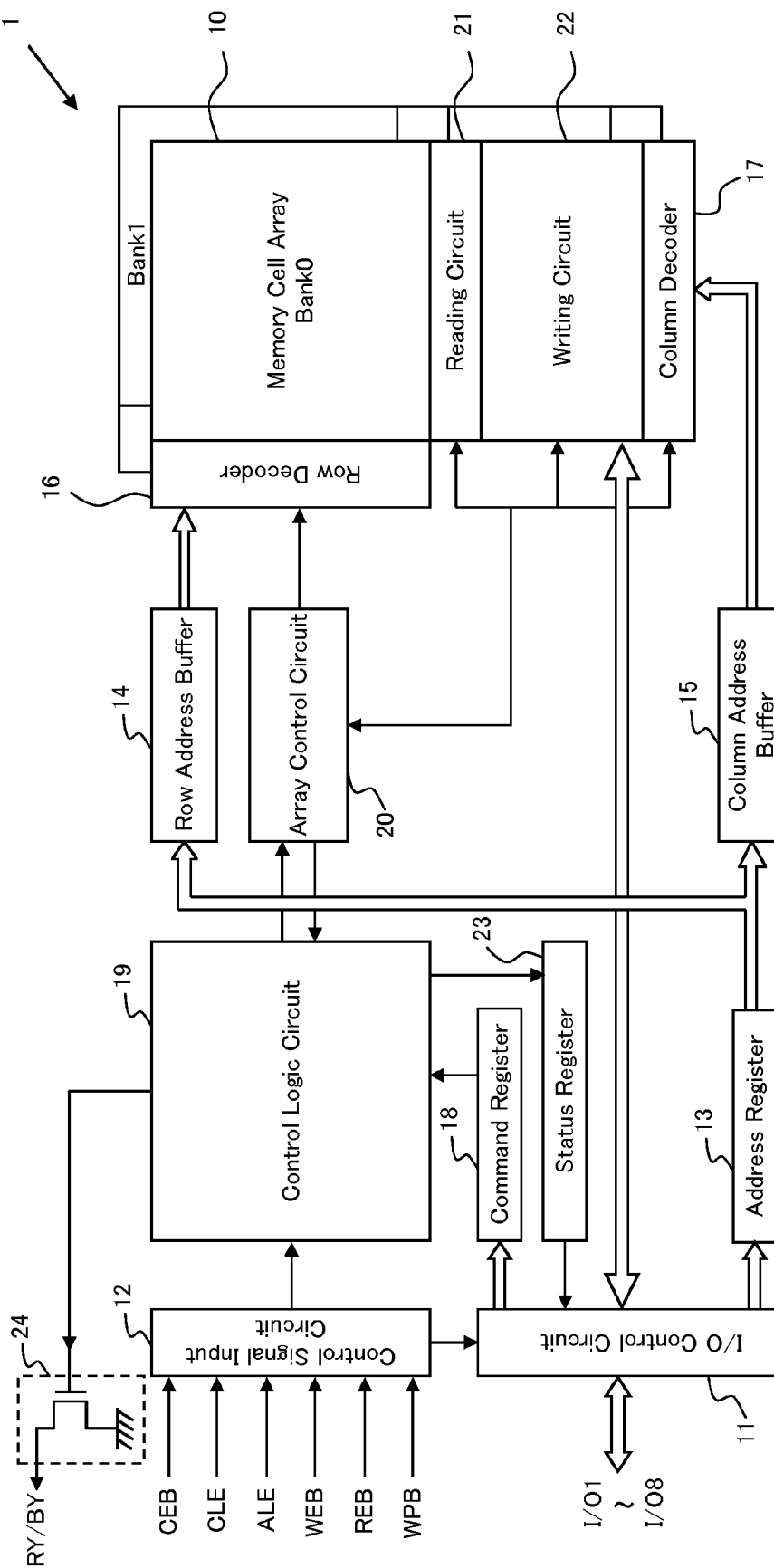
FIG. 1 is a block diagram illustrating an outline of a block configuration of a semiconductor memory device according to the present invention.

FIG. 1 is a block diagram illustrating an outline of a block configuration of the device of the present invention according to a first embodiment. As illustrated in FIG. 1, the device 1 of the present invention includes a memory cell array 10, an I/O control circuit 11, a control signal input circuit 12, an address register 13, a row address buffer 14, a column address buffer 15, a row decoder 16, a column decoder 17, a command register 18, a control logic circuit 19, an array control circuit 20, a reading circuit 21, a writing circuit 22, a status register 23, and a state signal output circuit 24. In the present embodiment, a memory cell array bank (hereinafter, simply called a "bank") includes the memory cell array 10, the row decoder 16, the column decoder 17, the reading circuit 21, and the writing circuit 22, and a plurality of such banks are provided, and as an example, FIG. 1 illustrates a case with two banks.

Figure 2:
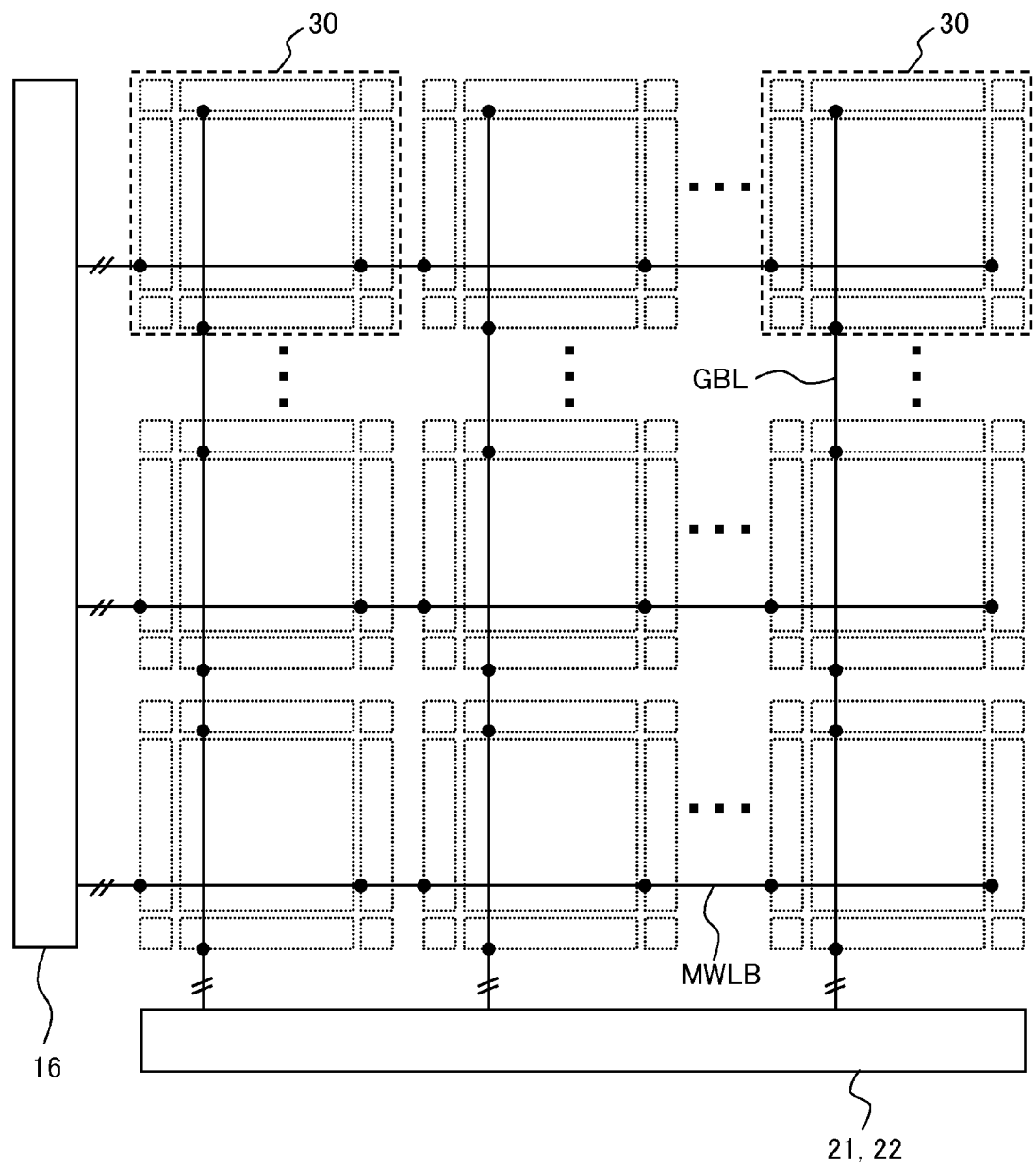
FIG. 2 is a block diagram illustrating an outline of a block configuration of a memory cell array shown in FIG. 1.

As illustrated in FIG. 2, the memory cell array 10 is configured with being divided up into a plurality of blocks 30. The blocks 30 are arranged in a matrix shape in the row direction and column direction, respectively, and while each block 30 of the same row is interconnected with one or a plurality of main word lines MWLB extending in the row direction, each block 30 of the same column is interconnected with one or a plurality of global bit lines GBL extending in the column direction. Each main word line MWLB is connected to the row decoder 16, and each global bit line GBL is connected to the reading circuit 21 and the writing circuit 22, respectively. In the present embodiment, two main word lines MWLB and two global bit lines GBL are assigned to each block 30, and if the number of the blocks 30 arranged in the column direction (number of block rows) is assumed as M, and the number of the blocks 30 arranged in the row direction (number of block columns) is assumed as N, the total number of the main word lines MWLB will be 2M and the total number of the global bit lines GBL will be 2N.

Figure 3:
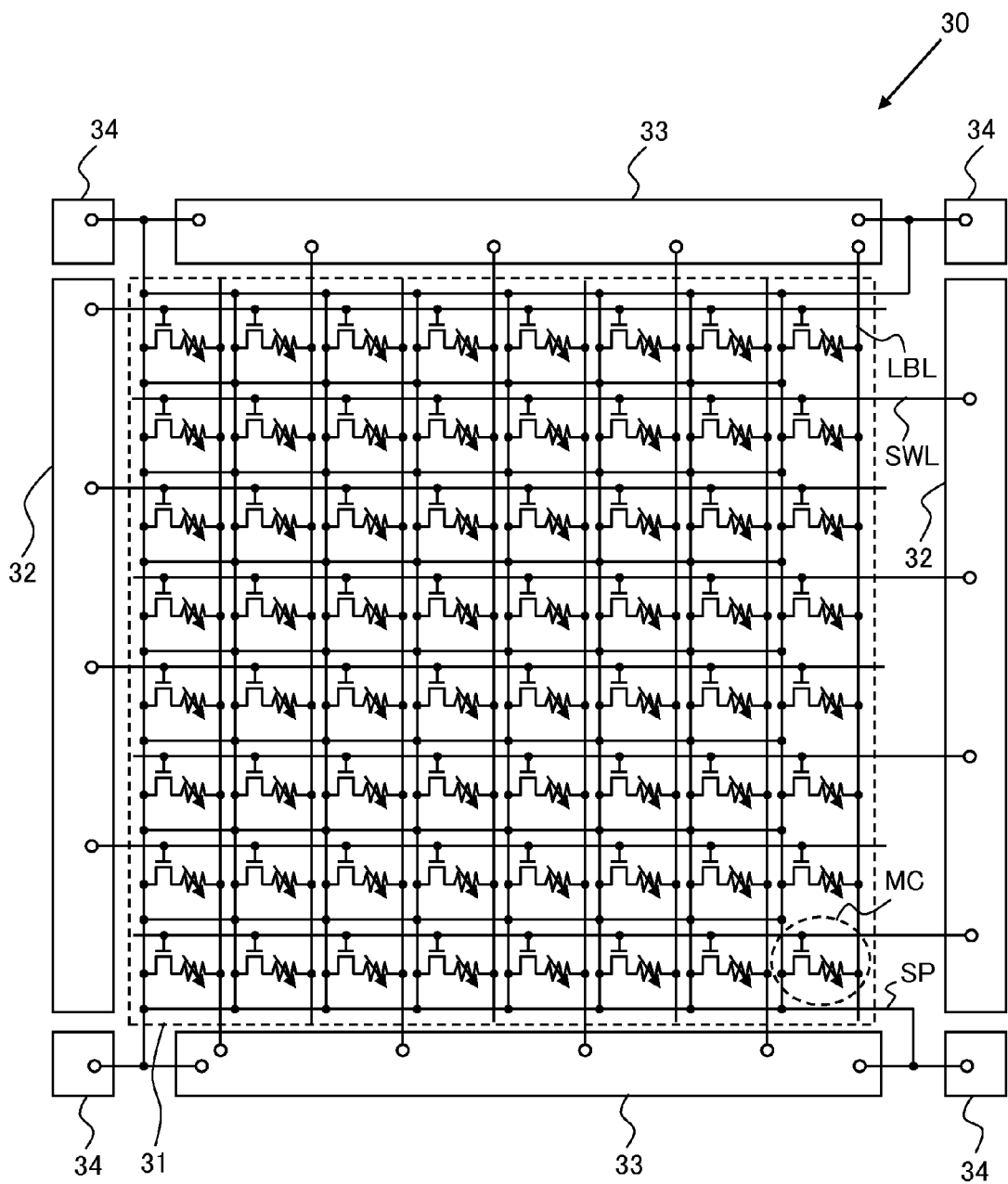
FIG. 3 is a block diagram illustrating an outline of a block configuration of a block shown in FIG. 2, and an example of a circuit configuration of a memory cell sub-array.

As shown in FIG. 3, a block 30 includes a memory cell sub-array (hereinafter, simply abbreviated as a "sub-array") 31, a sub-word line driver 32, a bit line selector 33, and a source plate driver 34.

Figure 4:
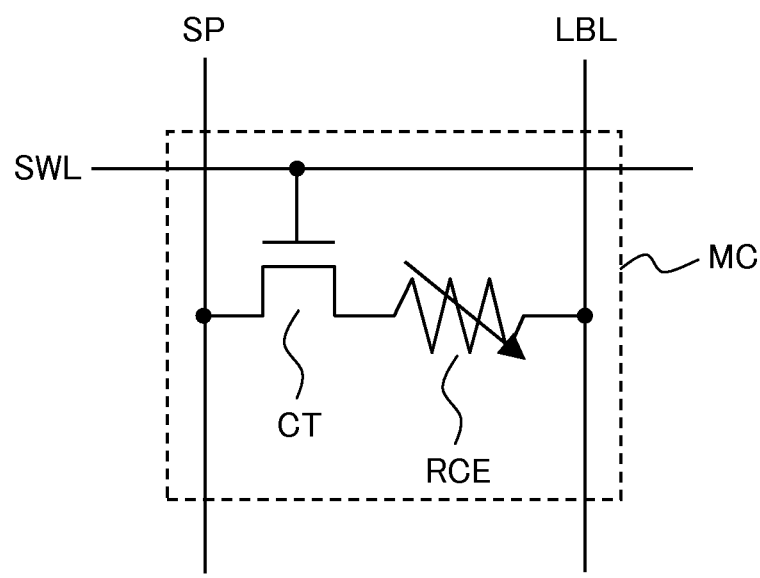
FIG. 4 is an equivalent circuit diagram illustrating an example of a memory cell having a three-terminal structure used in the semiconductor memory device according to the present invention.

The sub-array 31 is configured by arranging a plurality of memory cells MC, in matrix, in the row direction and the column direction, respectively. As shown in FIG. 4, a memory cell MC has a three-terminal structure configured by connecting an end of a variable resistance element RCE, and one of the source and drain of the cell transistor CT. The gate of the cell transistor CT of each memory cell MC in the same row is connected to one sub-word line SWL extending in the row direction, the other end of the variable resistance element RCE of each memory cell MC in the same column is connected to one local bit line LBL extending in the column direction, and the other of the source and drain of each cell transistor CT of all the memory cells MC in the sub-array 31 is connected to a common source plate SP. FIG. 3 illustrates a configuration example in which the memory cells MC are arranged in eight rows×eight columns, and eight sub-word lines SWL and eight local bit lines LBL are provided in each block 30. It is to be noted that in a memory cell MC, the arrangement of the variable resistance element RCE and the cell transistor CT may be interchanged.

The variable resistance element RCE is a non-volatile memory element that has an element structure including a variable resistor between two electrodes such that the electrical resistance state, as stipulated according to the current-voltage characteristics between the two electrodes, transitions between two or more resistance states that vary due to the electrical stress applied between the two electrodes, and the variable resistance element stores information by retaining one of the resistance states in a non-volatile manner. In the present embodiment, for convenience of explanation, of the two electrodes of the variable resistance element RCE, the one end that is connected to a cell transistor CT is called a first electrode, and the other end that is connected to a local bit line LBL is called a second electrode.

In the present embodiment, the variable resistance element RCE is assumed to be a variable resistance element having resistance switching characteristics that the electrical resistance is converted to a low resistance by applying an electric current from the second electrode side to the first electrode side, and conversely, the electrical resistance is converted to a high resistance by applying an electric current from the first electrode side to the second electrode side. Thus, the resistance switching action in which the direction of application of the electric current is reversed between conversion to a low resistance and conversion to a high resistance is called a bipolar switching action. In the present embodiment, the action for converting the electrical resistance of the variable resistance element RCE to a low resistance is called a setting action, and the action for converting the electrical resistance to a high resistance is called a resetting action, and both actions are together called the writing action. Additionally, in the present embodiment, the logical value "1" is assigned to the state where the electrical resistance of the variable resistance element RCE is in a low resistance (setting state), and the logical value "0" is assigned to the state where the electrical resistance of the variable resistance element RCE is in a high resistance (resetting state), such that binary information is stored for one bit depending on the electrical resistance state of the variable resistance element RCE. It is to be noted that in the present embodiment, positive logic is adopted, and the logical value "1" is assigned to a high signal level, and the logical value "0" is assigned to a low signal level.

Figure 5:
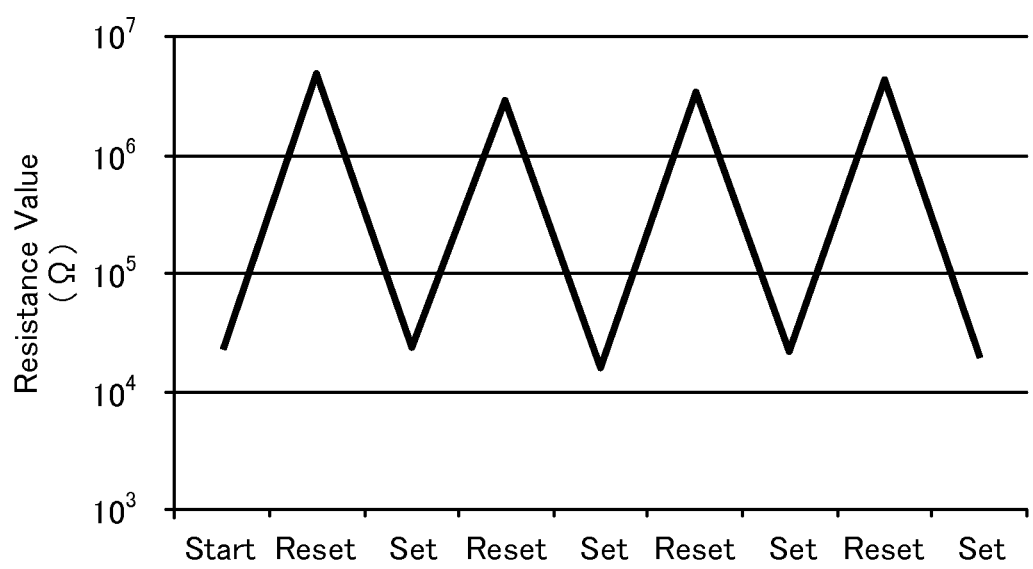
FIG. 5 is a diagram illustrating an example of a measurement result of a bipolar switching action of a variable resistance element.

The variable resistance element RCE in which a resistance variation occurs as a result of the bipolar switching action includes various element structures and material configurations. For example, a variable resistance element having a variable resistor including the oxide or oxynitride of at least any one metal from among Al, Hf, Ni, Co, Ta, Zr, W, Ti, Cu, V, Zn, and Nb can be used. As an example, FIG. 5 shows the variation in the electrical resistance of a variable resistance element when a structure in which a variable resistor is sandwiched between an upper electrode and a lower electrode is prepared as a variable resistance element by using Ta as the upper electrode, TiN as the lower electrode, and an Hf oxide film with a film thickness of 3 nm as the variable resistor, and with the lower electrode as the reference, the setting action is performed by applying a positive-voltage pulse (1.8 V, 50 nsec), and the resetting action is performed by applying a negative-voltage pulse (−1.6 V, 50 nsec). It is to be noted that the variable resistance element RCE used in the device 1 of the present invention is not limited to those described above as long as a resistance variation occurs therein as a result of the bipolar switching action.

On the other hand, MOS transistors such as a planar MOS transistor in which the source and the drain are arranged in a direction parallel to the substrate surface, and a vertical MOS transistor in which the source and the drain are arranged in a direction vertical to the substrate surface can be used as the cell transistor CT.

Depending on structure of the cell transistor CT, the source plate SP can have various forms. For example, when the cell transistor CT is a planar MOS transistor, as illustrated in FIG. 3, the source plate SP is preferably configured either in the shape of a line or a lattice extending in the row direction or the column direction, so as not to cross over the other signal wirings such as a sub-word line SWL and a local bit line LBL. Furthermore, in the case of a vertical MOS transistor, in addition to the configuration in the shape of a line or a lattice, a configuration in a shape of a plate is also possible.

Figure 6:
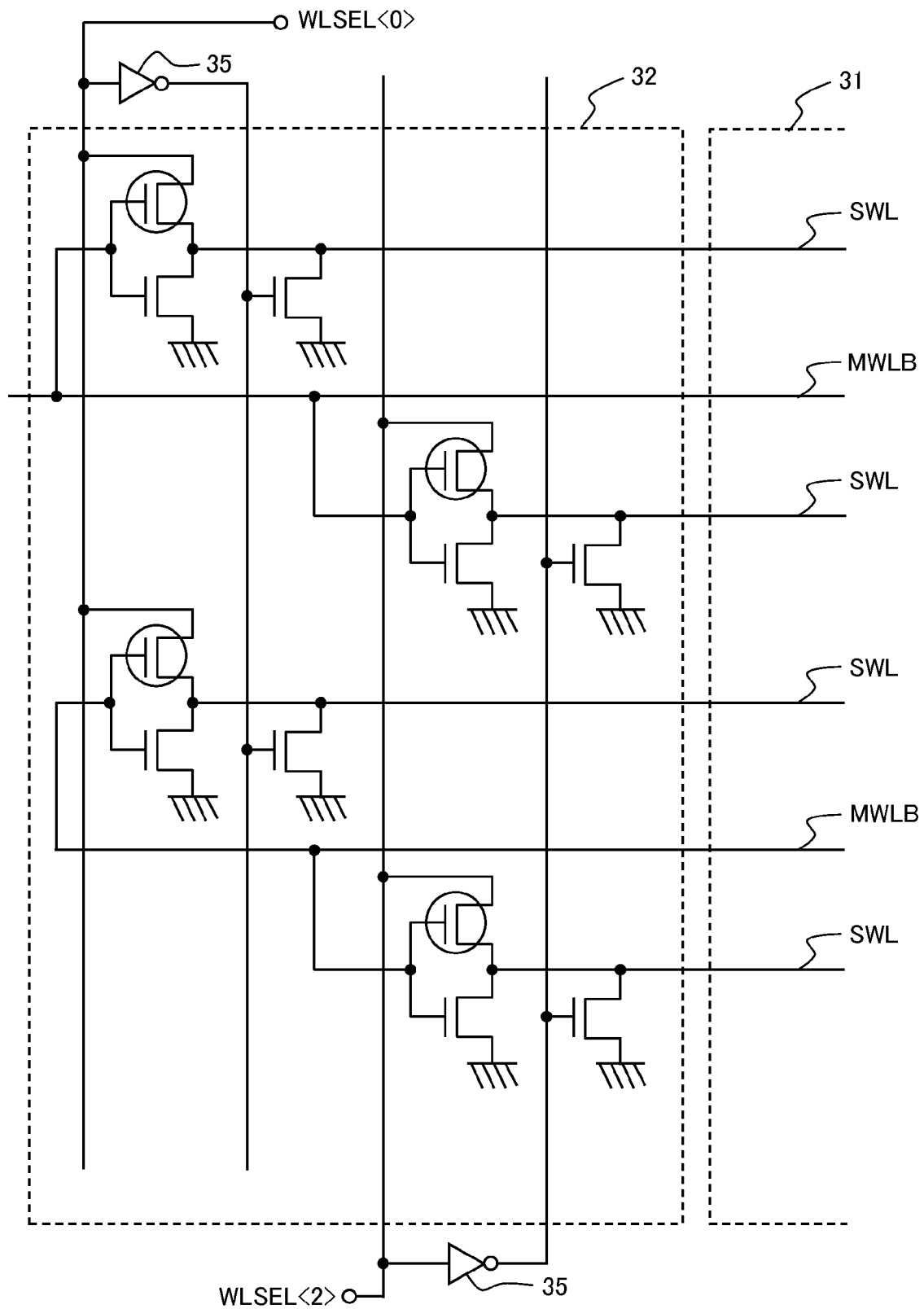
FIG. 6 is a circuit diagram illustrating an example of a circuit configuration of a sub-word line driver shown in FIG. 3.

As shown in FIG. 3, each sub-word line driver 32 is arranged in the row direction (horizontal in FIG. 3) of a single sub-array 31 and is configured to drive the odd-numbered sub-word lines SWL by the sub-word line driver 32 on one side and to drive the even-numbered sub-word lines SWL by the sub-word line driver 32 on the other side. As shown in FIG. 6, one main word line MWLB branches into two sub-word lines SWL in each sub-word line driver 32, and one of a total of four sub-word lines SWL is selected by any one of sub-word line selection signals WLSEL <0 to 3>. The two main word lines MWLB connected to the blocks 30 in the same row are selected when either of them is at a low level. Of the two main word lines MWLB that are connected to the unselected blocks 30, both are at a high level. The selected one sub-word line SWL of the four sub-word lines SWL corresponding to the selected main word line MWLB is driven to a high level, and the three unselected sub-word lines SWL are driven to a low level, by the one set of horizontal sub-word line drivers 32. All of the four sub-word lines SWL corresponding to the unselected main word line MWLB are driven to a low level by the inverse signal of the sub-word line selection signals WLSEL <0 to 3>. A circuit 35 for generating the inverse signal is provided at each of the four corners of every block 30.

Figure 7:
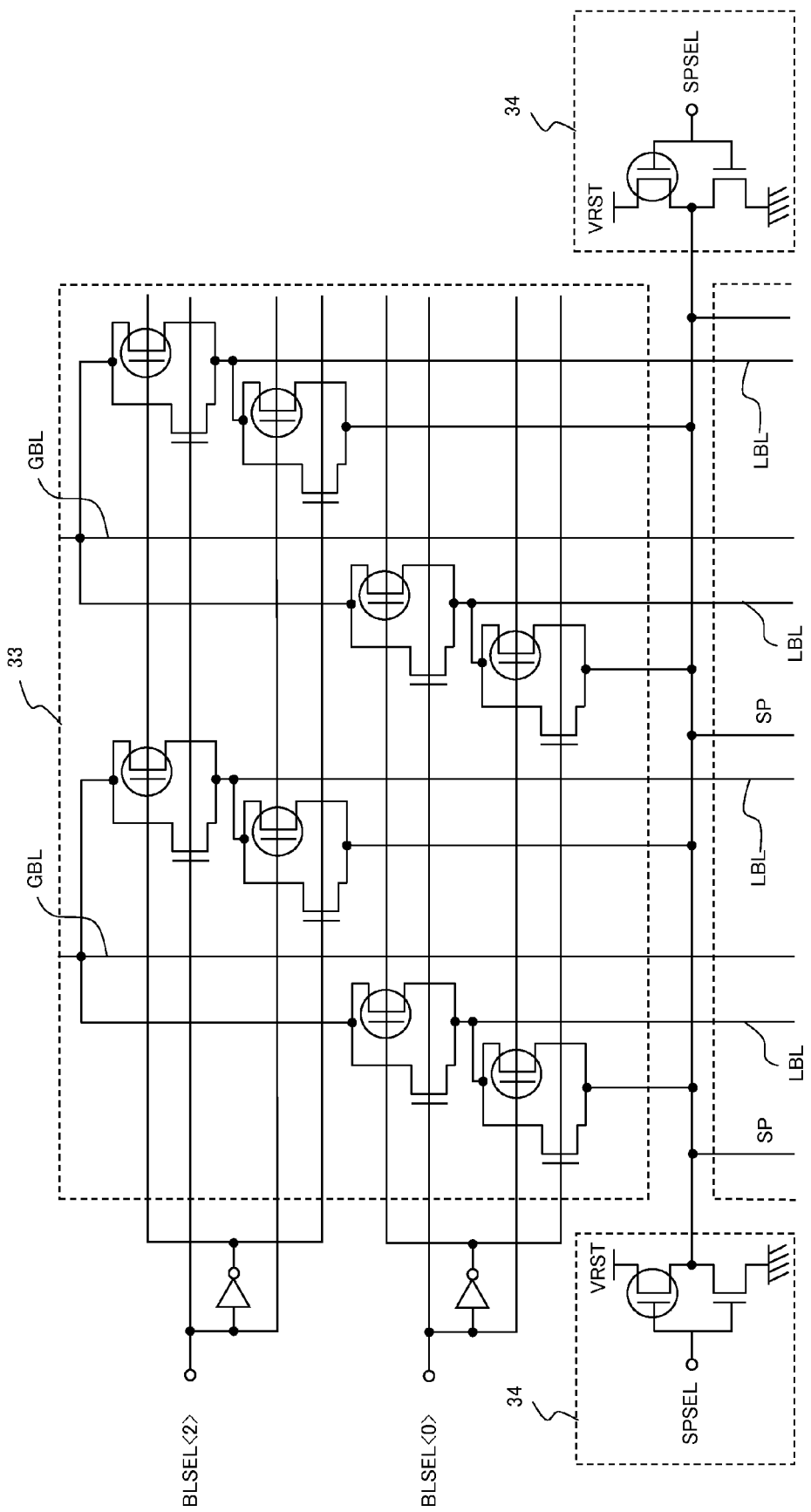
FIG. 7 is a circuit diagram illustrating an example of a circuit configuration of a bit line selector and a source plate driver shown in FIG. 3.

As shown in FIG. 3, each bit line selector 33 is arranged in the column direction (vertical in FIG. 3) of a single sub-array 31, and is configured to drive the odd-numbered local bit lines LBL by the bit line selector 33 on one side and to drive the even-numbered local bit lines LBL by the bit line selector 33 on the other side. As shown in FIG. 7, one global bit line GBL branches into two local bit lines LBL in each bit line selector 33, and one of a total of four local bit lines LBL is selected by any one of local bit line selection signals BLSEL <0 to 3>. According to the present embodiment, each of the two global bit lines GBL connected to the blocks 30 in the same column has a selection level corresponding to the action mode (setting action, resetting action, or reading action) at that time. The selected one local bit line LBL of the four local bit lines LBL corresponding to each global bit line GBL is driven to the aforementioned selection level by the one set of vertical bit line selectors 33. Each of the local bit lines LBL that are not selected by the local bit line selection signals BLSEL <0 to 3> is driven to the same level as the source plate SP.

From the above description, according to the present embodiment, in each action mode, all the global bit lines GBL are selected simultaneously, and one main word line MWLB is selected. That is, the N number of blocks 30 of the same row are selected simultaneously. Additionally, because two local bit lines LBL and one sub-word line SWL are selected so that two memory cells MC are selected for each selected block 30, 2N number of the memory cells MC are selected simultaneously in each memory cell array 10.

As shown in FIG. 3, a source plate driver 34 is provided at each of the four corners of every block 30. Because all the memory cells MC within one sub-array 31 are connected to the same source plate SP, it is desired that at least one source plate driver 34 is provided in each block 30. As shown in FIG. 7, a source plate driver 34 is configured from a CMOS inverter circuit, and while the input is connected to the source plate selection signal SPSEL, the output is connected to the source plate SP. When the source plate selection signal SPSEL is at a high level, the source plate driver 34 drives the source plate SP to the ground potential VSS, and when the signal is at a low level, the source plate driver 34 drives the source plate SP to the resetting potential VRST. In the present embodiment, it is assumed that the source plate SP is driven independently in each block 30. The source plate selection signal SPSEL is generated by the array control circuit 20 and the row decoder 16. According to the present embodiment, in each block 30, in the standby state, the source plate selection signal SPSEL is at high level, and the source plate SP is driven to the ground potential VSS.

As described above, according to the present embodiment, the memory cell array 10 has a hierarchical array structure in which the sub-arrays 31, in which the memory cells MC are arranged in the shape of a matrix, are further arranged in the shape of a matrix, and while a word line has a hierarchical word line structure of the main word lines MWLB and the sub-word lines SWL, a bit line has a hierarchical bit line structure of the global bit lines GBL and the local bit lines LBL.

The block configuration of FIG. 1 is for the case where the device 1 of the present invention is used for large-capacity data storage, and therefore, in order to restrict the number of terminals, each of the command codes, address input, input data, output data, and status codes are either inputted to or outputted from the I/O control circuit 11 via eight I/O terminals (I/O 1 through 8).

Additionally, the device 1 of the present invention adopts not random access in which the data is read and written randomly in the byte unit, but the page reading and page writing method in which reading and writing is performed by assuming a page including a plurality of bytes as the basic unit of one action, and the output of the read data and the input of the data to be written of a maximum of one page is performed serially and sequentially in the byte unit. In the present embodiment, it is assumed that one bit (binary data) is stored in the memory cell MC, and the size (unit: bytes) of one page is the value obtained by dividing the number (2N) of memory cells MC selected simultaneously by the I/O count (8), which is (N/4).

In the present embodiment, the configuration is that M×N number of blocks 30 are provided in each bank, and 64 memory cells MC are provided in each block 30, and therefore, the memory capacity of one bank is 64 MN bits (8 MN bytes), and the number of pages included therein is 32M. Because the number of banks is two, the total number of pages is 64M.

Of the address input, input data, output data, or input or output of status codes, which one is to be performed by the I/O control circuit 11 is controlled by the control signal inputted into the control signal input circuit 12. In the present embodiment, a chip enable signal CEB, a command latch enable signal CLE, an address latch enable signal ALE, a write enable signal WEB, a read enable signal REB, a write protect signal WPB and the like may be used as the control signals inputted to the control signal input circuit 12. The signals whose names end in a "B" are signals that are activated at a low level, and whether the activation level is low or high is not limited by the present embodiment.

One to a few bytes of a command code are read by the I/O control circuit 11 in synchronization with the write enable signal WEB when the command latch enable signal CLE is at a high level, which is then transferred to the command register 18. The command code transferred to the command register 18 is decoded by the control logic circuit 19, and the processing procedure in the action mode corresponding to the content of the decoded command code is controlled by the control logic circuit 19.

Various contents can be set in the action mode as appropriate, however, in the description below, the three action modes related to the contents of the present invention, that is, the page programming action in which data "1" is written in the page specified by address input in accordance with the data input of the corresponding one page, the sector erasing action in which data "0" is written in all bits of the sector configured by a plurality of pages specified by the address input, and the page reading action in which the data stored in the page specified by the address input is read sequentially in the byte unit will be described. In the present embodiment, it is assumed that the page programming action is performed for the already reset memory cells. Additionally, in the present embodiment, it is assumed that one sector is configured from N number of blocks 30 in the same row. Because one page is configured from 2N number of memory cells MC by selecting two memory cells from each of the N number of blocks 30 of the same row, when one block 30 is configured from 64 memory cells MC as shown in FIG. 3, one sector is configured from 32 pages. The number of pages configuring one sector is not limited to 32.

In the present embodiment, the programming action is defined as a series of actions in which a setting action and a reading action (appropriately abbreviated as the "setting verification action") for checking the resistance state of the memory cells MC after the setting action are repeated either for a predetermined number of times or until the setting action is complete in the memory cell MC unit. In the page programming action, in order to sequentially perform the programming action for every single page simultaneously in parallel, before starting the programming action, a data input process for sequentially executing data input of every single page in the byte unit is performed as the pre-processing. The memory cells MC corresponding to data "1" of the input data of every single page are the target of the programming action. Additionally, in the present embodiment, the erasing action is defined as a series of actions in which a resetting action and a reading action (appropriately abbreviated as the "resetting verification action") for checking the resistance state of the memory cells MC after the resetting action are repeated either for a predetermined number of times or until the resetting action is complete in the memory cell MC unit. In the sector erasing action, the page erasing action in which the erasing action for every single page is executed simultaneously and in parallel for all the memory cells MC of the corresponding page is repeated in a sequence for the plurality of pages within the sector to be erased. Therefore, in each page erasing action of the sector erasing action, the data input process in which data input for every single page is to be performed sequentially in the byte unit is unnecessary. However, if the resetting action is performed for a memory cell MC that is already in a reset state, there is a risk of unnecessary consumption of power as well as the occurrence of conversion to extremely high resistance in the memory cell MC. Therefore, in the present embodiment, in each page erasing action, before starting the first resetting action, a preliminary reading action that is the same reading action as the resetting verification action is executed as the pre-processing. Note that the details of each action will be described later.

In addition to those described above, the action modes also include a status reading action in which the status code indicating the internal state of the device 1 of the present invention is read. The status codes obtained by converting the internal states updated sequentially in the control logic circuit 19 to codes are temporarily stored in the status register 23, and during the status reading action, the contents of the status register 23 are transferred to the I/O control circuit 11, and then outputted from the I/O terminal. Furthermore, the state signal output circuit 24 is an open drain circuit in which the drain is connected to the RY/BY terminal, and the gate level is controlled by the control logic circuit 19. When the device 1 of the present invention is in a state in which other commands cannot be received due to writing actions such as the page programming action and the sector erasing action being in progress, the RY/BY terminal is driven to a low level, and in other cases, the RY/BY terminal is in a high impedance state.

In the description below, when simply "reading action" is indicated, it implies an action in which regardless of the action mode, the resistance state of the variable resistance element RCE of the memory cell MC is detected by the reading circuit 21, and the information stored in the memory cell MC is read. That is, each of the reading actions performed in the aforementioned page reading action, setting verification action, and resetting verification action corresponds to the reading action.

The address input is read by the I/O control circuit 11 in synchronization with the write enable signal WEB when the address latch enable signal ALE is at a high level. Because the total memory capacity of the device 1 of the present invention is calculated as page size (N/4)×total number of pages (64M), it becomes 16 MN bytes, and if it is assumed that M=N=64, then this value will become 65536 bytes, and since the address input count is 16, the address input is read in two batches. The 16-bit address input read by the I/O control circuit 11 is stored in the address register 13.

When M is assumed to be 64, the number of main word lines MWLB per bank is 128, and four sub-word lines SWL exist for each main word line MWLB in each block 30, and therefore, the number of row addresses used to select one sub-word line SWL in each of the 64 selected blocks 30 of one block row will be nine. The row addresses of the address input stored in the address register 13 are transferred to the row address buffer 14, and provided to the row decoder 16. The single row stipulated by a single sub-word line SWL in the 64 selected blocks selected by the row address is conveniently called the "selected row".

The total number of memory cells MC in the selected row is 8N, which indicates that four pages exist therein. When N is assumed as 64, there will be two column addresses (hereinafter, conveniently called the "first column addresses") that will be used for selecting one of the four pages within the selected row, and four column addresses (hereinafter, conveniently called the "second column addresses") specifying the storage location (address) of one-byte data within one page. Note that the corresponding relationship between each I/O of the one-byte data and the 128 global bit lines GBL is fixed beforehand. The column addresses (first column addresses and second column addresses) within the address input stored in the address register 13 are transferred to the column address buffer 15, and provided to the column decoder 17.

In the present embodiment, because there are two banks, there is one bank address for selecting one of the two banks. In the present embodiment, the bank address is considered to be the most significant bit of the row address and the most significant bit of the column address, and is transferred to the row address buffer 14 and the column address buffer 15, and then provided to the row decoder 16 and the column decoder 17. Thus, the row decoder 16 of one of the banks is activated, and the row decoder 16 of the other bank is inactivated. Additionally, the column decoder 17, reading circuit 21, and writing circuit 22 of one of the banks are activated, and the column decoder 17, reading circuit 21, and writing circuit 22 of the other bank are inactivated.

The row decoder 16 decodes the upper row address, excluding the lower two bits, of the row address outputted from the row address buffer 14, activates one of the 2M main word lines MWLB, and drives it to a low level. Furthermore, the row decoder 16 decodes the row address of the lower two bits, selects one of the four sub-word line selection signals WLSEL <0 to 3>, and drives it to a high level. One of the 8M sub-word lines SWL is selected in each block column by the row decoder 16 and the sub-word line driver 32, and is driven to a high level.

The column decoder 17 includes a first column decoder that decodes a first column address outputted from the column address buffer 15, and then selects one of the four local bit line selection signals BLSEL <0 to 3> and drives it to a high level, and a page address counter that sets the address specified in the second column address to the first address of the page, and either counts up or counts down the addresses within a page from the first address under control of the array control circuit 20.

Based on the control procedure set beforehand for each action mode specified by the command code stored in the command register 18, for example, when the action mode is a writing or reading action for the memory cell array 10 in the page programming action, the sector erasing action, or the page reading action, the control logic circuit 19 outputs the necessary control signal to the array control circuit 20 according to the control procedure corresponding to the specified action mode. Based on the control signal from the control logic circuit 19, the array control circuit 20 controls each action of the row decoder 16, the column decoder 17, the reading circuit 21, and the writing circuit 22.

Figure 8:
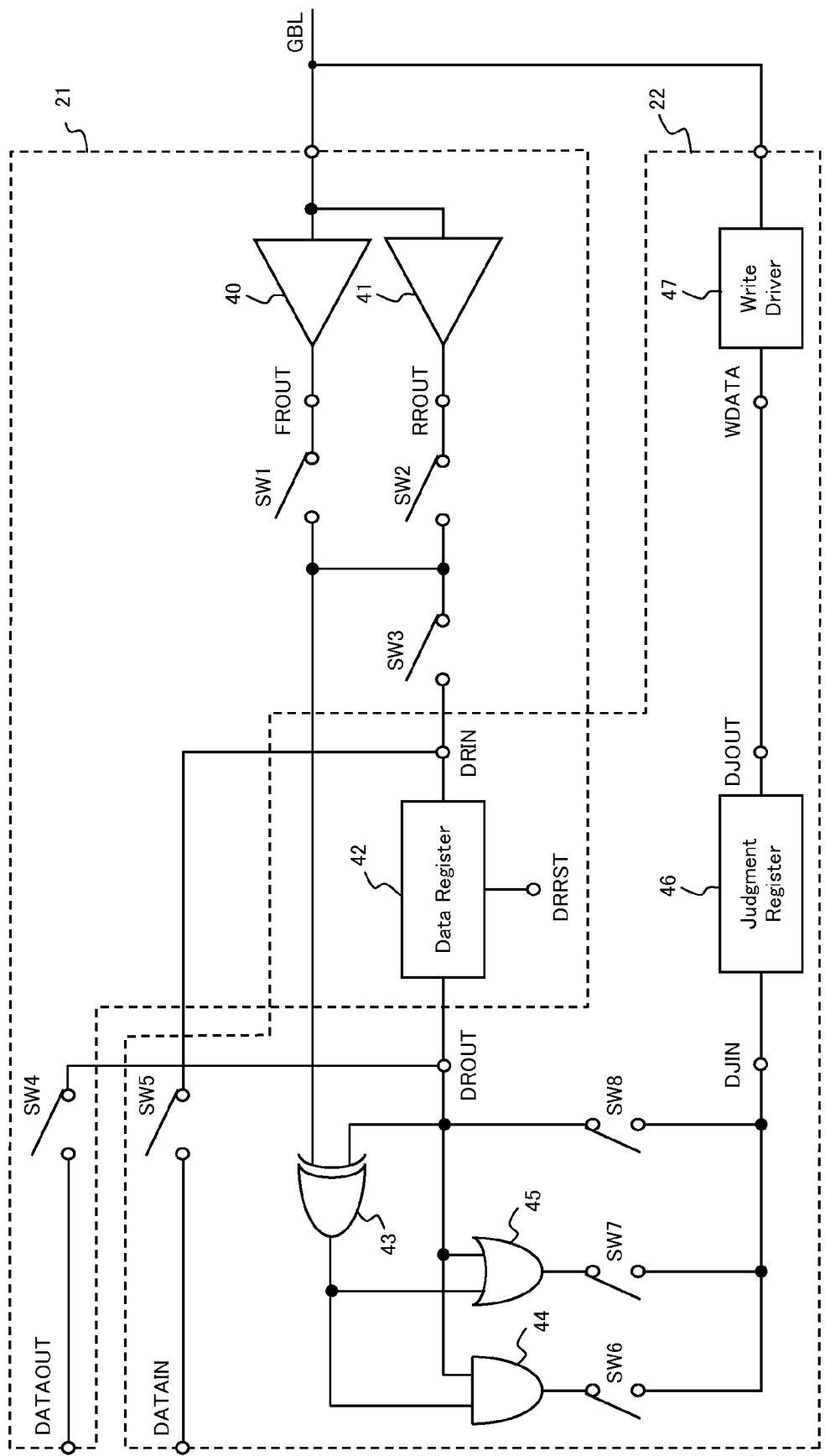
FIG. 8 is a block diagram illustrating an outline of a block configuration of a reading circuit and a writing circuit shown in FIG. 1 and FIG. 2, according to a first embodiment.

FIG. 8 illustrates an outline of a block configuration of the reading circuit 21 and the writing circuit 22 for a single bit of the data that is to be read or written. In the present embodiment, there are the same number (2N) of reading circuits 21 and writing circuits 22 illustrated in FIG. 8 as the global bit lines GBL.

The reading circuit 21 includes a forward-direction sense amplifier 40, a backward-direction sense amplifier 41, a one-bit data register 42, and switches SW1 through SW4. The writing circuit 22 includes a data register 42, an exclusive OR circuit 43, an AND circuit 44, an OR circuit 45, a judgment register 46, a write driver 47, and switches SW5 through SW8. Each of the switches SW1 through SW8 is implemented in the CMOS transfer gate, for example. The case where each of the switches SW1 through SW8 is ON is summarized in FIG. 9. Each of the switches SW1 through SW8 is in the OFF state, except the case where each of the switches is in the ON state illustrated in FIG. 9.

Each operation of the forward-direction sense amplifier 40, the backward-direction sense amplifier 41, the data register 42, the judgment register 46, the write driver 47, and each of the switches SW1 through SW8 is controlled by the array control circuit 20 in synchronization with the system clock in the device 1 of the present invention.

Figure 10:
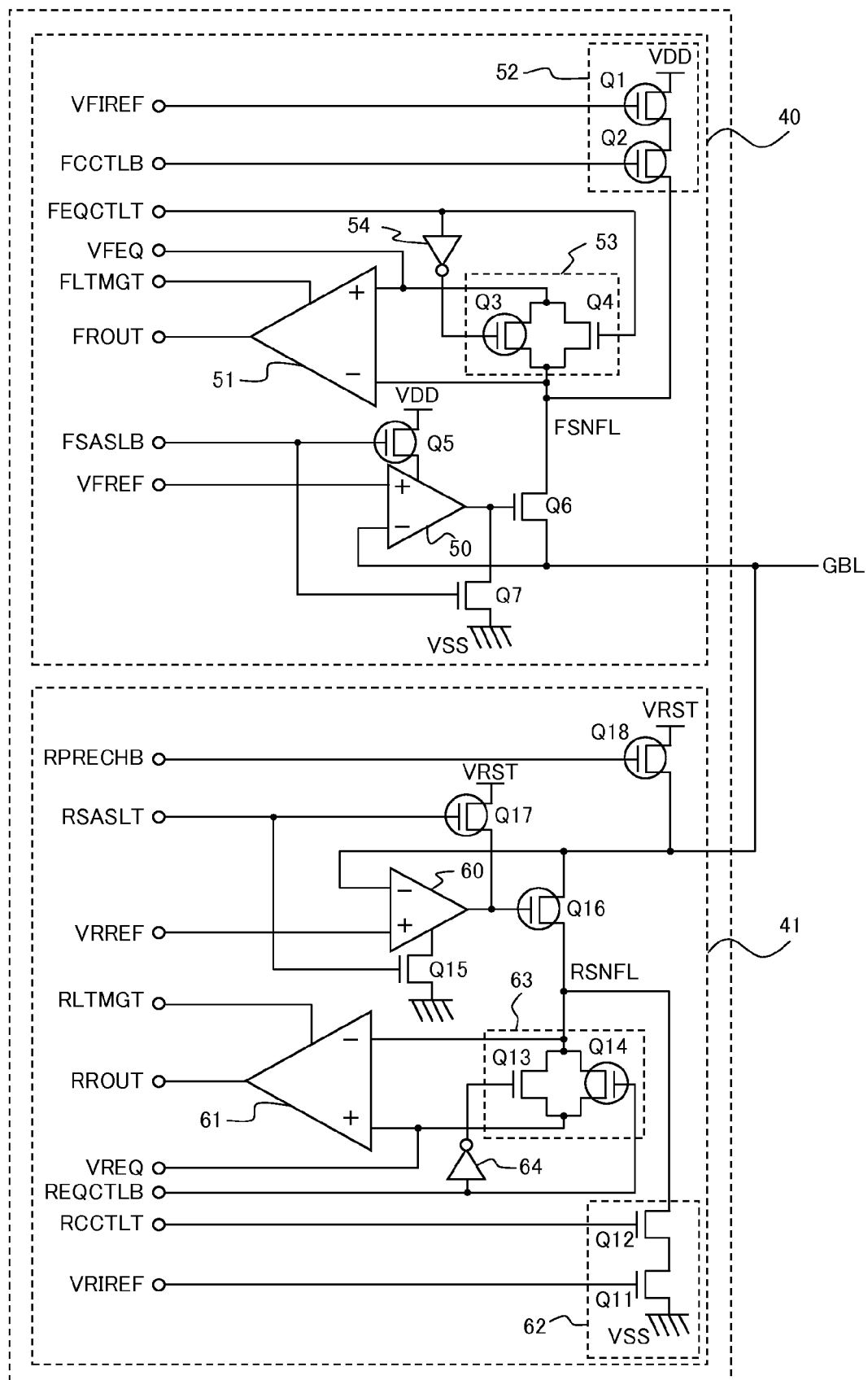
FIG. 10 is a circuit diagram illustrating an example of a circuit configuration of a forward-direction sense amplifier and a backward-direction sense amplifier shown in FIG. 8.

FIG. 10 illustrates a circuit configuration of the forward-direction sense amplifier 40 and the backward-direction sense amplifier 41. The forward-direction sense amplifier 40 includes a differential amplifier 50, a comparator 51 with latch, a constant current source circuit 52 including PMOS transistors Q1 and Q2, a CMOS transfer gate 53 including a PMOS transistor Q3 and an NMOS transistor Q4, an inverter 54, a PMOS transistor Q5 for controlling the power supply voltage at the high-potential side of the differential amplifier 50, and NMOS transistors Q6 and Q7. In the differential amplifier 50, a constant reference voltage VFREF of approximately 0.2 V to 0.3 V is inputted to the non-inverting input, the inverting input is connected to the global bit line GBL and the source of the NMOS transistor Q6, and the non-inverting output is connected to the gate of the NMOS transistor Q6 and the drain of the NMOS transistor Q7. As for the comparator 51, the non-inverting input is connected to the other end of the CMOS transfer gate 53, a reference voltage VFEQ higher than the reference voltage VFREF is inputted to the non-inverting input, the inverting input is connected to an internal node FSNFL formed by mutually connecting the drain of the NMOS transistor Q6, the output end of the constant current source circuit 52, and one end of the CMOS transfer gate 53, and the non-inverting output is connected to the switch SW1 as the output FROUT of the forward-direction sense amplifier 40. An activation signal FSASLB for the differential amplifier 50 is inputted to the gate of each of the PMOS transistor Q5 and the NMOS transistor Q7. The source of the NMOS transistor Q7 is connected to the ground potential VSS. An intermediate voltage VFIREF for operating the PMOS transistor Q1 as a constant current source is inputted to the gate of the PMOS transistor Q1, and an activation signal FCCTLB for the constant current source circuit 52 is inputted to the gate of the PMOS transistor Q2. An activation signal FEQCTLT for the CMOS transfer gate 53 is inputted to the gate of the NMOS transistor Q4 and the input of the inverter 54, and the gate of the PMOS transistor Q3 and the output of the inverter 54 are connected to each other. An activation signal FLTMGT for the comparator 51 is inputted to the comparator 51. During the activation period, the comparator 51 can latch the output data. The various reference voltages and activation signals inputted to the forward-direction sense amplifier 40 are supplied from the array control circuit 20 at a predetermined timing.

As illustrated in FIG. 10, basically, the backward-direction sense amplifier 41 has a circuit configuration with a "top-bottom symmetry" with respect to the forward-direction sense amplifier 40, that is, a power supply voltage VDD and the ground potential VSS have been interchanged, and the conductivity type (PMOS and NMOS) of each transistor has been interchanged. As a result, the polarity of the voltage applied to the corresponding circuit elements or that of the current that is flowing is reversed between the forward-direction sense amplifier 40 and the backward-direction sense amplifier 41.

The backward-direction sense amplifier 41 is configured from a differential amplifier 60, a comparator 61 with latch, a constant current source circuit 62 including NMOS transistors Q11 and Q12, a CMOS transfer gate 63 including an NMOS transistor Q13 and a PMOS transistor Q14, an inverter 64, an NMOS transistor Q15 for controlling the power supply voltage at the low-potential side of the differential amplifier 60, and PMOS transistors Q16 through Q18. In the differential amplifier 60, a constant reference voltage VRREF (≈VRST−0.2 V to 0.3 V) that is approximately 0.2 V to 0.3 V lower than a resetting voltage VRST is inputted to the non-inverting input, the inverting input is connected to the global bit line GBL, the source of the PMOS transistor Q16, and the drain of the PMOS transistor Q18, and the non-inverting output is connected to the gate of the PMOS transistor Q16 and the drain of the PMOS transistor Q17. As for the comparator 61, the non-inverting input is connected to the other end of the CMOS transfer gate 63, a reference voltage VREQ lower than the reference voltage VRREF is inputted to the non-inverting input, the inverting input is connected to an internal node RSNFL formed by mutually connecting the drain of the PMOS transistor Q16, the output end of the constant current source circuit 62, and one end of the CMOS transfer gate 63, and the non-inverting output is connected to the switch SW2 as the output RROUT of the backward-direction sense amplifier 41. An activation signal RSASLT for the differential amplifier 60 is inputted to the gate of each of the NMOS transistor Q15 and the PMOS transistor Q17. The source of the PMOS transistor Q17 is connected to the power supply voltage VDD. An intermediate voltage VRIREF for operating the NMOS transistor Q11 as a constant current source is inputted to the gate of the NMOS transistor Q11, and an activation signal RCCTLT for the constant current source circuit 62 is inputted to the gate of the NMOS transistor Q12. An activation signal REQCTLB for the CMOS transfer gate 63 is inputted to the gate of the PMOS transistor Q14 and the input of the inverter 64, and the gate of the NMOS transistor Q13 and the output of the inverter 64 are connected to each other. An activation signal RLTMGT for the comparator 61 is inputted to the comparator 61. The PMOS transistor Q18 is a transistor for precharging the global bit line GBL to the resetting voltage VRST, and while its source is connected to the resetting voltage VRST, the drain is connected to the global bit line GBL, and the gate is connected to a precharging signal RPRECHB. During the activation period, the comparator 61 can latch the output data. The various reference voltages, the activation signals, and the precharging signal inputted to the backward-direction sense amplifier 41 are supplied from the array control circuit 20 at a predetermined timing.

Except for the activation signals for the comparators 51 and 61, the activation levels of the corresponding activation signals inputted to the forward-direction sense amplifier 40 and the backward-direction sense amplifier 41 are opposite to each other. The CMOS transfer gate 63 need not necessarily have the aforementioned interchange, and may have the same circuit configuration as the CMOS transfer gate 53. Furthermore, because the backward-direction sense amplifier 41 has a circuit configuration with a "top-bottom symmetry" with respect to the forward-direction sense amplifier 40, when the resistance state of the memory cells MC is the same, the output levels of the non-inverting outputs FROUT and RROUT of the comparators 51 and 61 are opposite to each other. In the present embodiment, the logical value "1" is assigned to the setting state and the logical value "0" is assigned to the resetting state, however, in the case of the comparator 61, the assignment of the logical value is reversed in the non-inverting output FROUT, and when the resistance state of the variable resistance element RCE of the memory cell MC that is the target of reading is the setting state, the logical value "0" is outputted, and when the resistance state is the resetting state, the logical value "1" is outputted.

The data register 42 is a one-bit register that is used by both the reading circuit 21 and the writing circuit 22, and during the page reading action, that is, during the reading action that is not the setting verification action or the resetting verification action, the data register 42 stores the output data that is read by the forward-direction sense amplifier 40, and during the page programming action and the sector erasing action, the data register 42 stores the input data of the setting action and the resetting action. The input data is the "expected value" data that must be stored in the memory cell MC after the completion of the setting action or the resetting action.

During the setting verification action, the exclusive OR circuit 43 compares the logical value read from the forward-direction sense amplifier 40 and indicated by the resistance state of the variable resistance element RCE of the memory cell MC in which the setting action is performed, with the expected value stored in the data register 42, and during the resetting verification action, the exclusive OR circuit 43 compares the logical value read from the reverse-direction sense amplifier 41 and indicated by the resistance state of the variable resistance element RCE of the memory cell MC in which the resetting action is performed, with the expected value stored in the data register 42.

In the setting verification action, the AND circuit 44 determines the AND operation between the output (comparison result) of the exclusive OR circuit 43 and the expected value stored in the data register 42, and then writes the determined result to the judgment register 46, via the switch SW6. In the preliminary reading action and the resetting verification action, the OR circuit 45 determines the OR operation between the output (comparison result) of the exclusive OR circuit 43 and the expected value stored in the data register 42, and then writes the determined result to the judgment register 46, via the switch SW7. In FIG. 11, the relationship among the expected values stored in the data register 42, the resistance states of the variable resistance element RCE, and the logical values (level of the signal WDATA) written to the judgment register 46 is illustrated in a table.

In the processing procedure of the sector erasing action of the present embodiment, the data register 42 is reset and the expected values are fixed to "0" before the preliminary reading action and the resetting verification action. Therefore, in FIG. 11, the expected values do not become "1". However, as illustrated in another embodiment (3) described later, when the resetting action is performed after selecting only the variable resistance element RCE which is in the setting state with the input data (expected value) written to the data register 42 being "0", the expected value might become "1".

As shown in FIG. 11, during the setting verification action, when the expected value in the data register 42 is "1", and the setting action is not complete in the memory cell MC that is the target of the setting action (the resistance state is the resetting state: Logical value "0"), the logical value "1" same as the expected value is stored in the judgment register 46, and during the preliminary reading action and the resetting verification action, when the expected value in the data register 42 is "0", and the resetting action is not complete in the memory cell MC that is the target of the resetting action (the resistance state is the setting state: Logical value "1"), the logical value "0" same as the expected value is stored in the judgment register 46. The logical values stored in the judgment register 46 of each writing circuit 22 are used for controlling the page programming action and the sector erasing action in the array control circuit 20.

Figure 12:
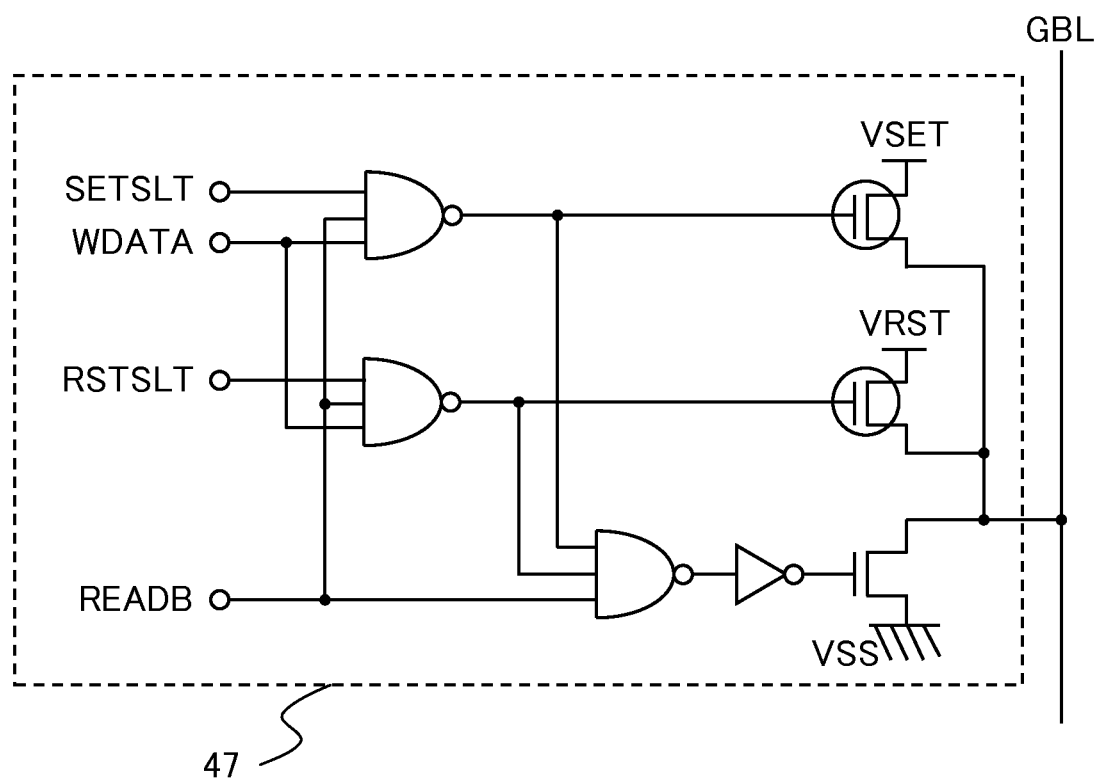
FIG. 12 is a circuit diagram illustrating an example of a circuit configuration of a write driver shown in FIG. 8.

The write driver 47 is a circuit that drives the global bit line GBL to a predetermined voltage level during the setting action and the resetting action, and the output of the write driver is connected to the global bit line GBL. FIG. 12 illustrates a configuration example of the circuit of the write driver 47. Control signals READB, SETSLT, and RSTSLT from the array control circuit 20, and the output signal WDATA from the judgment register 46 are received as input signals. As seen in FIG. 12, the signal READB is a signal that becomes low level during the reading action and high level during the setting action and the resetting action. The signal SETSLT is a signal that becomes high level during the setting action and that activates the write driver 47, and the signal RSTSLT is a signal that becomes high level during the resetting action and that activates the write driver 47. When the write driver 47 is activated during the setting action and the resetting action, the global bit line GBL is driven to an output level having the same phase as the output signal WDATA. Specifically, when the signal WDATA is at a high level, the global bit line GBL is driven to a setting voltage VSET during the setting action, and to the resetting voltage VRST during the resetting action, and when the signal WDATA is at a low level, the global bit line GBL is driven to the ground potential VSS during the setting action as well as the resetting action. When the signal READB is at a low level (during the reading action), the write driver 47 is brought into a high impedance state. Therefore, when the output signal WDATA is at a high level "1", the setting action is activated, and the resetting action is inactivated (masked). Conversely, when the output signal WDATA is at a low level "0", the resetting action is activated, and the setting action is inactivated (masked).

A characteristic of the device 1 of the present invention is that the reading circuit 21 includes two sense amplifiers, namely a forward-direction sense amplifier 40 and a backward-direction sense amplifier 41, and selectively uses one of the two sense amplifiers depending on if the writing action is the setting action or the resetting action. The reading circuit 21 uses the forward-direction sense amplifier 40 in the setting verification action, and uses the backward-direction sense amplifier 41 in the resetting verification action. The page programming action and the sector erasing action in each of which one of the two sense amplifiers is selectively used will be described below in detail with reference to drawings.

Figure 13:
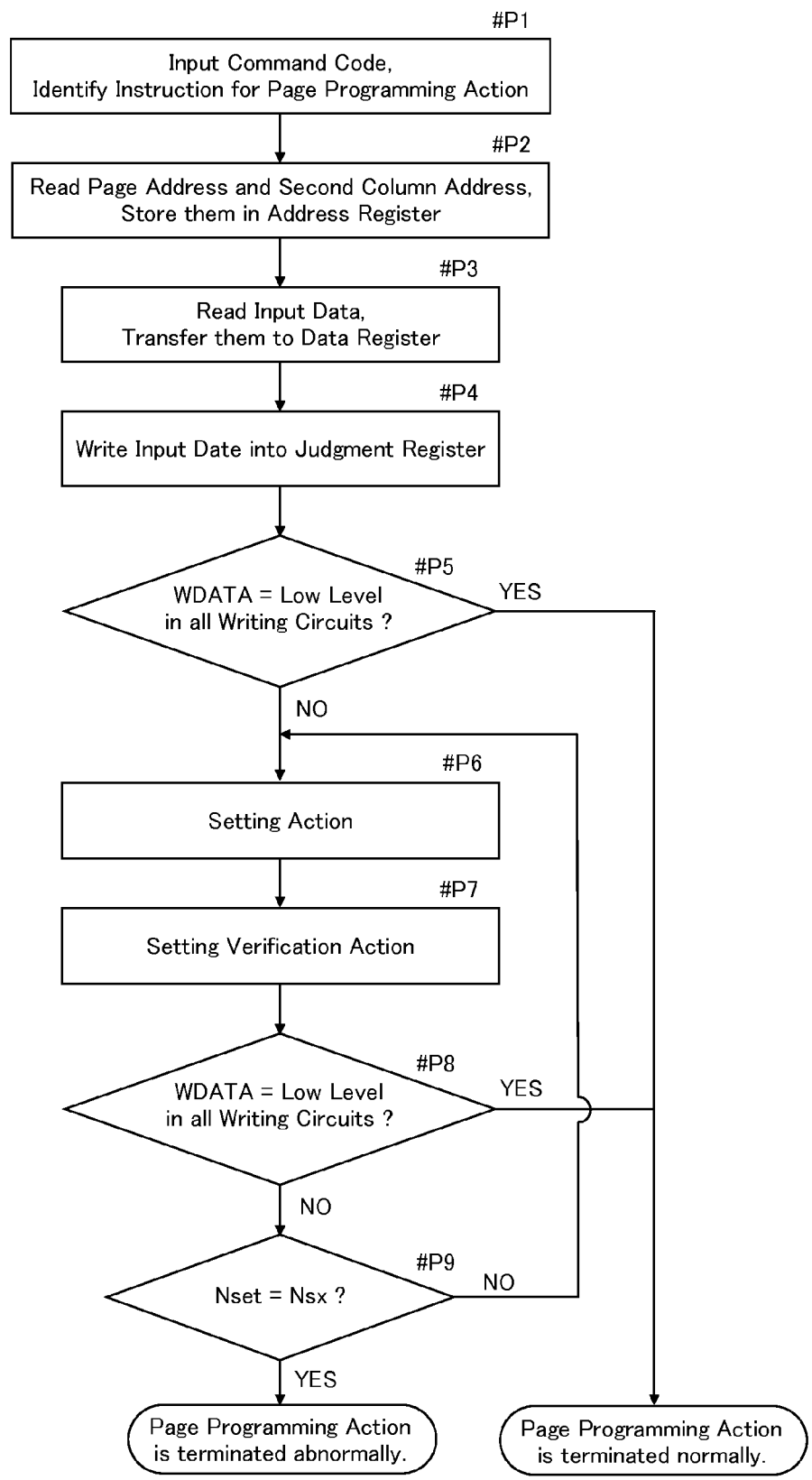
FIG. 13 is a flowchart illustrating a processing procedure of a page programming action.

First of all, the page programming action is described. FIG. 13 illustrates a flowchart of the page programming action. In a command input sequence, a command code corresponding to the page programming action is read into the I/O control circuit 11, the read command code is transferred to the command register 18, and the instruction for the page programming action is identified in the control logic circuit 19 (step #P1). Subsequently, the page address (combination of the bank address, the row address, and the first column address) specifying the page that is the target of the programming action, and the entire second column addresses specifying the first address of the page are read into the I/O control circuit 11 in two or more batches in synchronization with the write enable signal WEB, and then stored in the address register 13 (step #P2). At this time, all the reading circuits 21 are inactivated, and the switches SW1 through SW4 are set to the OFF state.

Following this, the input data of a maximum of one page is read into the I/O control circuit 11 in one byte unit in synchronization with the write enable signal WEB, and is first of all transferred to each data register 42 of the eight writing circuits 22 corresponding to the address in the page specified by the second column address. Here, in the case where all of the single page is to be programmed, the second column address specifies the first address. The data register 42 to which the data is to be transferred is selected when the switches SW5 of the eight writing circuits 22 corresponding to the specified address are set to the ON state in accordance with the count value of the address counter in the page. Each time the input data is read into the I/O control circuit 11 in one byte unit, the count value of the address counter in the page is counted up, and the eight writing circuits 22 corresponding to the sequentially updated count value are selected, and the input data is transferred to each data register 42 of the writing circuits 22 (step #P3). The process of transferring the input data to the data registers 42 is repeated at the most as many times as the byte value of the page size, by sequentially selecting eight writing circuits 22, and the data input process is thus complete. If data input is cut off in the middle of a page, the transfer process is cleared up to the data entered in the end. Before the data input process is started, the data retained in each data register 42 is reset to "0" by the reset signal DRRST, and the output terminal DROUT is set to a low level. In the present embodiment, partial action (programming to only a section of the page) is possible, and the import of data by this partial action starts from the specified address and ends where the input of data finishes (up to at the most the last address of the second column address).

Once the data input process is complete and before the first setting action is started, the switch SW8 is set to the ON state while maintaining the switches SW6 and SW7 in the OFF state, and the input data transferred to the data register 42 is written into the judgment register 46 as is (step #P4). Once writing into the judgment register 46 is complete, the switch SW8 is returned to the OFF state, and the signal level of the signal WDATA outputted from the judgment register 46 is determined (step #P5). It is determined as to whether the signal WDATA is set to a low level in all writing circuits 22. The wired OR configuration can be adopted as a method for determining the output of all signal WDATAs at once. If the signal WDATA is at a high level in at least one of the writing circuits 22 ("NO" branch), the first setting action (step #P6) is executed only in the writing circuit 22 in which the signal WDATA is at a high level. If the signal WDATA is at a low level in all writing circuits 22 ("YES" branch), the setting action need not be performed, and therefore, the page programming action is terminated normally without performing the first setting action (step #P6).

If the first setting action (step #P6) is started, then before the write driver 47 is activated, the row decoder 16 activates one of the 2M main word lines MWLB and drives it to a low level, and at the same time, selects one of the four sub-word line selection signals WLSEL <0 to 3> and drives it to a high level. As a result, the selected sub-word line SWL transitions to a high level, and the cell transistor CT of the selected memory cell MC is set to the ON state. Because the source plate selection signal SPSEL retains the high level, the source plate driver 34 continuously drives the source plate SP to the ground potential VSS. The drive states of the selected main word line MWLB and the sub-word line SWL, and of the source plate SP are maintained at the same states, respectively without any change through the setting action and the setting verification action, during the time period of the page programming action.

Next, due to the transition of the control signal SETSLT to a high level, the write driver 47 is activated, and drives the global bit line GBL to the setting voltage VSET when the signal WDATA is at a high level, and to the ground potential VSS when the signal WDATA is at a low level. Additionally, when one of the selected local bit line selection signals BLSEL <0 to 3> moves to the high level, the selected local bit line LBL is conducted to the global bit line GBL, via the bit line selector 33. When the signal WDATA is at a high level, the selected local bit line LBL is driven to the setting voltage VSET via the global bit line GBL.

Figure 14:
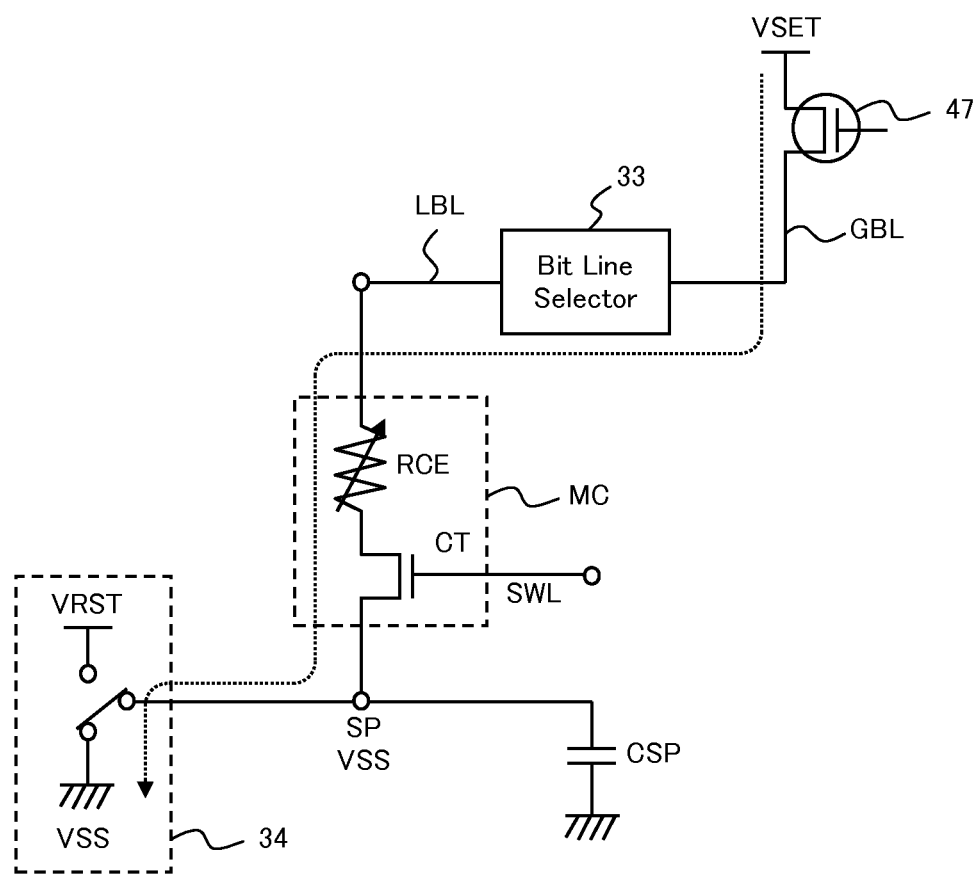
FIG. 14 is a diagram explaining an electric current path passing through a selected memory cell during a setting action.

Therefore, as illustrated in FIG. 14, when the signal WDATA is at the high level, an electric current path is formed from the write driver 47 up to the source plate driver 34 via the global bit line GBL, the bit line selector 33, the local bit line LBL, the variable resistance element RCE and the cell transistor CT of the selected memory cell MC, and the source plate SP, and an electric current is applied to the variable resistance element RCE from the side of the second electrode (local bit line LBL) to the side of the first electrode (cell transistor CT), and the electrical resistance of the variable resistance element RCE is converted to a low resistance. FIG. 14 illustrates only the PMOS transistor that is in the ON state at the final stage of the write driver 47. The capacitance element CSP in FIG. 14 schematically indicates the parasitic capacitance of the source plate SP. The same is applicable to the after-mentioned capacitance elements CSP illustrated in FIG. 16, FIG. 20, and FIG. 21.

In FIG. 14, the electric current path passing though the variable resistance element RCE is formed continuously during the time period each of the write driver 47, the bit line selector 33, the sub-word line driver 32, and the source plate driver 34 is activated simultaneously. During the time period of the setting action, after the write driver 47 is activated, one of the selected local bit line selection signals BLSEL <0 to 3> moves to the high level, and the aforementioned electric current path is formed for a predetermined period, one of the selected local bit line selection signals BLSEL <0 to 3> returns to the low level, the selected local bit line LBL separates from the global bit line GBL, is driven to the ground potential VSS, and is set to the unselected state. As a result, the electric current path is intercepted, the substantial setting action state ends, and the selected local bit line LBL is set to the unselected state, and at the same time or thereafter, the control signal SETSLT returns to the low level, the write driver 47 is inactivated, and the setting action ends. When the setting action ends, the global bit line GBL is driven to the ground potential VSS once by the write driver 47. All the local bit lines LBL in the unselected state are also driven to the ground potential VSS that is at the same electric potential as the source plate SP.

When the first setting action ends, the process moves to the first setting verification action (step #P7), and the forward-direction sense amplifier 40 of the reading circuit 21 is activated. The reading action performed by the forward-direction sense amplifier 40 will be described below.

Figure 15:
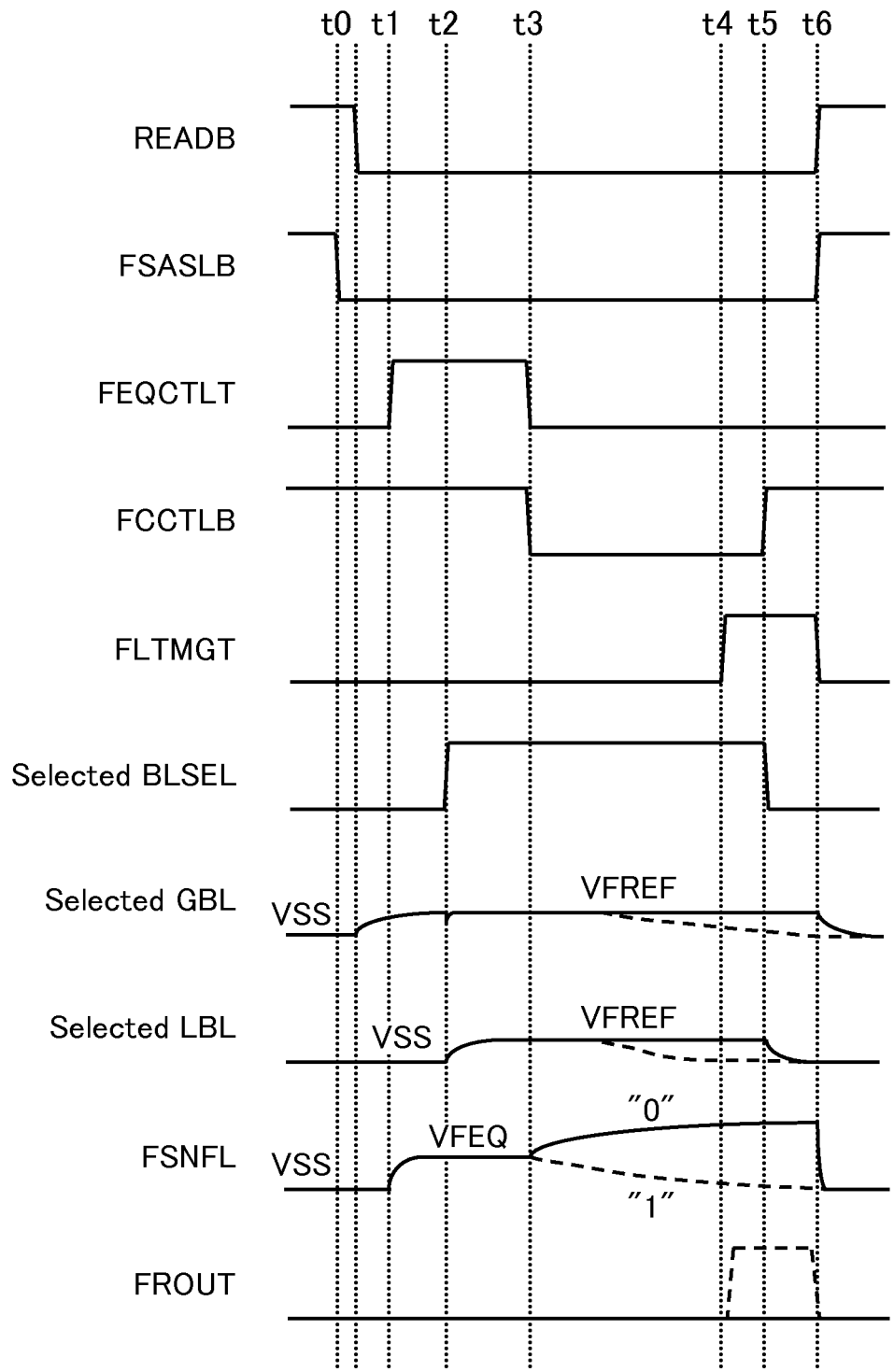
FIG. 15 is a timing chart illustrating the procedure of activation of the forward-direction sense amplifier shown in FIG. 10.

First of all, the procedure of activation of the forward-direction sense amplifier 40 will be described with reference to the timing chart of FIG. 15. At time t0, the activation signal FSASLB transitions from the high level to the low level, and the differential amplifier 50 is activated. At time t1, the activation signal FEQCTLT transitions from the low level to the high level, the CMOS transfer gate 53 is set to the ON state, and a reference voltage VFEQ is inputted to both the non-inverting input and the inverting input of the comparator 51. Because the control signal READB transitions to the low level during the time period between time t0 and time t1, the write driver 47 is inactivated, the output is set to the high impedance state, and the process of driving the global bit line GBL to the ground voltage VSS is canceled. Because the level of the global bit line GBL is initialized to the ground potential VSS immediately before the start of the setting verification action, the non-inverting output of the differential amplifier 50 is set to a high level, the NMOS transistor Q6 is set to the ON state, and the global bit line GBL is charged up to almost the same level as the reference voltage VFREF, via the CMOS transfer gate 53 and the NMOS transistor Q6. The reference voltage VFREF is set to a low voltage such that the variable resistance element RCE does not get converted to a low resistance by mistake.

Next, at time t2, when one of the selected local bit line selection signals BLSEL <0 to 3> moves to a high level, the selected local bit line LBL is conducted to the global bit line GBL via the bit line selector 33. As a result, the local bit line LBL is charged up to the VFREF level. At this time, when the variable resistance element RCE of the selected memory cell MC is in a low resistance state, the electric current flows from the local bit line LBL to the source plate via the selected memory cell MC, however, the electric current that offsets this drawn current is supplied via the transistor Q6 in the sense amplifier 40, and therefore, the electric potential of the local bit line LBL is maintained at the VFREF level.

Figure 16:
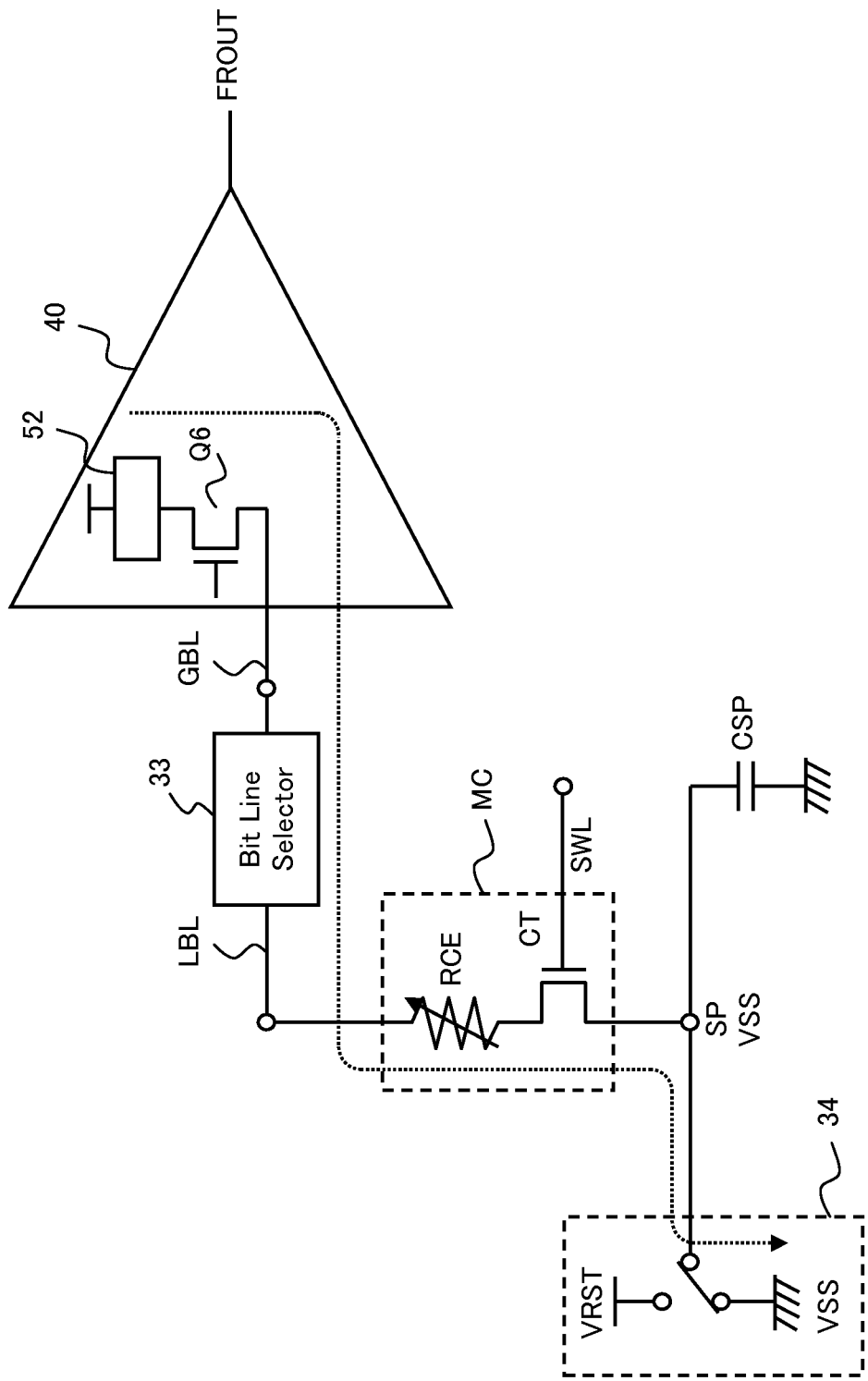
FIG. 16 is a diagram explaining an electric current path passing through a selected memory cell during a setting verification action.

Next, at time t3, the activation signal FEQCTLT and the activation signal FCCTLB transition from the high level to the low level, the CMOS transfer gate 53 is set to the OFF state, and at the same time, the constant current source circuit 52 is activated. As a result, the application of voltage from the reference voltage VFEQ to the global bit line GBL and the local bit line LBL via the internal node FSNF and the transistor Q6 ends, and as illustrated in FIG. 16, an electric current path is formed from the constant current source circuit 52 up to the source plate driver 34 via the NMOS transistor Q6, the global bit line GBL, the bit line selector 33, the local bit line LBL, the variable resistance element RCE and the cell transistor CT of the selected memory cell MC, and the source plate SP. At this time, a memory cell current corresponding to the resistance state of the variable resistance element RCE flows in the variable resistance element RCE, from the side of the second electrode (local bit line LBL) to the side of the first electrode (cell transistor CT). Depending on the magnitude correlation of the reference current IREF flowing from the constant current source circuit 52 to the internal node FSNFL, and the memory cell current IMC flowing in the selected memory cell MC, the voltage level of the internal node FSNFL changes from the reference voltage VFEQ of the initialization level. Specifically, when the memory cell current is larger than the reference current (IREF <IMC), the electric potential of the internal node FSNF declines gradually from the reference voltage VFEQ. In such a case, if the electric potential of the internal node FSNF falls until it reaches the VFREF level, the level of the global bit line GBL also falls below the reference voltage VFREF, accordingly. Conversely, when the memory cell current is smaller than the reference current (IREF >IMC), the level of the global bit line GBL is maintained at the reference voltage VFREF, and the voltage level of the internal node FSNFL rises higher than the reference voltage VFEQ. As a result of the above, a difference in potential corresponding to the resistance state of the variable resistance element RCE occurs between the non-inverting input and the inverting input of the comparator 51. Specifically, when the resistance state of the variable resistance element RCE is not converted sufficiently to a low resistance, that is, the resetting state ("0") is maintained, the inverting input will have a higher electric potential than the non-inverting input (reference voltage VFEQ). Conversely, when the resistance state of the variable resistance element RCE is sufficiently converted to a low resistance, that is, transition to the setting state ("1") takes place, the inverting input will have a lower electric potential than the non-inverting input (reference voltage VFEQ).

Next, at time t4, when the activation signal FLTMGT transitions from the low level to the high level, the comparator 51 is activated, the difference in potential between the non-inverting input and the inverting input is amplified, and a voltage level corresponding to the resistance state of the variable resistance element RCE is outputted from the output FROUT to the exclusive OR circuit 43, via the switch SW1. Specifically, when the resistance state of the variable resistance element RCE is maintained at the resetting state ("0") and the setting action is not complete, the low level ("0") is outputted, and conversely, when the resistance state of the variable resistance element RCE transitions to the setting state ("1") and the setting action is complete, the high level ("1") is outputted. The output state is latched during the time period when the activation signal FLTMGT is at a high level.

Next, at time t5, one of the selected local bit line selection signals BLSEL <0 to 3> transitions from the high level to the low level, and the activation signal FCCTLB transitions from the low level to the high level, and the electric current paths of both the reference current and the memory cell current are intercepted. Following this, at time t6, the activation signal FLTMGT transitions from the high level to the low level, and the activation signal FSASLB and the control signal READB transition from the low level to the high level, both the differential amplifier 50 and the comparator 51 are inactivated, and the internal node FSNFL is set to the floating state. The transition of each signal at the time t5 may be performed simultaneously with time t6, or thereafter.

During the setting verification action, the switches SW7 and SW8 are maintained in the OFF state and the switch SW6 is set to the ON state, and the value of the AND operation between the output of the exclusive OR circuit 43 and the expected values stored in the data register 42 is outputted from the AND circuit 44 to the judgment register 46 via the switch SW6, and is written and retained in the judgment register 46 between the time t4 and the time t6. The first setting verification action (step #P7) is thus complete.

Because the expected value stored in the data register 42 in the writing circuit 22 in which the signal WDATA is at a high level at the start of the first setting action is "1", when the resistance state of the variable resistance element RCE is maintained at the resetting state ("0") and the setting action is not complete, the high level ("1") is written into the judgment register 46 and the signal WDATA is maintained at the high level, and conversely, when the resistance state of the variable resistance element RCE transitions to the setting state ("1") and the setting action is complete, the low level ("0") is written into the judgment register 46 and the signal WDATA transitions to the low level.

On the other hand, the expected value stored in the data register 42 in the writing circuit 22 in which the signal WDATA is at a low level at the start of the first setting action is "0", and furthermore, in reality, the setting action is not executed, and the resistance state of the variable resistance element RCE is the same as the initial state before the start of the page programming action. Because the expected value is "0", regardless of the output level from the forward-direction sense amplifier 40, the logical value "0" is outputted from the AND circuit 44 to the judgment register 46 via the switch SW6, and since this value is written and retained in the judgment register 46 at the time t5, the level of the signal WDATA is maintained at the low level, without any change.

Next, it is determined whether the signal WDATA in all writing circuits 22 is at a low level (step #P8). If the signal WDATA is at a high level in at least one of the writing circuits 22 ("NO" branch), it is determined whether the frequency Nset of the setting action that has already been performed has reached a predetermined limit value Nsx (step #P9), and if the frequency has reached the limit value Nsx ("YES" branch), the page programming action is terminated abnormally. If the frequency Nset of the setting action has not reached the limit value Nsx ("NO" branch), the process returns to step #P6 so as to start the second setting action. In a writing circuit 22 in which the signal WDATA is at a low level, the substantial setting action cannot be performed. Hereinafter, the setting action of step #P6, the setting verification action of step #P7, and the judgment processes of step #P8 and step #P9 are repeated until it is determined in step #P8 that the signal WDATA is at a low level in all the writing circuits 22, or it is determined in step #P9 that the frequency Nset of the setting action has reached the limit value Nsx. If it is determined in step #P8 that the signal WDATA is at a low level in all the writing circuits 22 ("YES" branch), the page programming action terminates normally.

When the page programming action terminates either normally or abnormally, a status code corresponding to the termination state is written into the status register 23, the RY/BY terminal is set to the open state, and the next action mode is in the ready state. In the present embodiment, when each of the setting action and the setting verification action is started, a status code corresponding to each action state is written into the status register 23.

Figure 17:
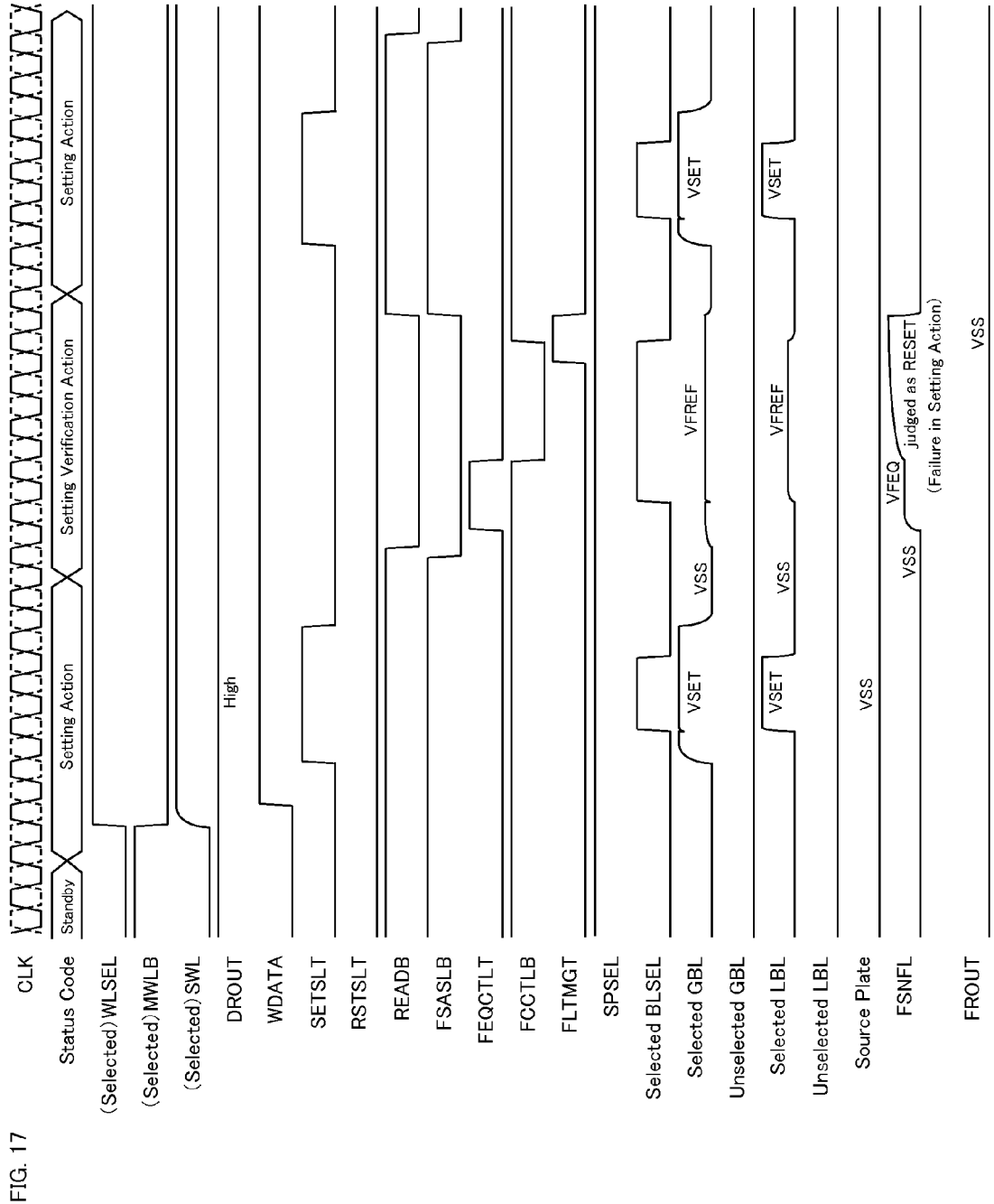
FIG. 17 is a voltage waveform diagram of the main signals and internal nodes during the time period of each of the first setting action, the first setting verification action, and the second setting action in the page programming action according to the first embodiment.

FIG. 17 is a voltage waveform diagram of the main signals and internal nodes during the time period of each of the first setting action, the first setting verification action, and the second setting action (first repeated setting action) in the page programming action. The setting verification action indicates the condition when the conversion to a low resistance in the first setting action is not sufficient, and a resetting state is detected. The selected GBL and unselected GBL in the figure indicate the global bit lines GBL when the signal WDATA is at a high level and a low level, respectively, during the setting action. Furthermore, the status codes indicate the internal state (progress status) during the page programming action after the start of the first setting action, and can be read from the I/O terminal after passing the I/O control circuit 11 from the status register 23.

Figure 18:
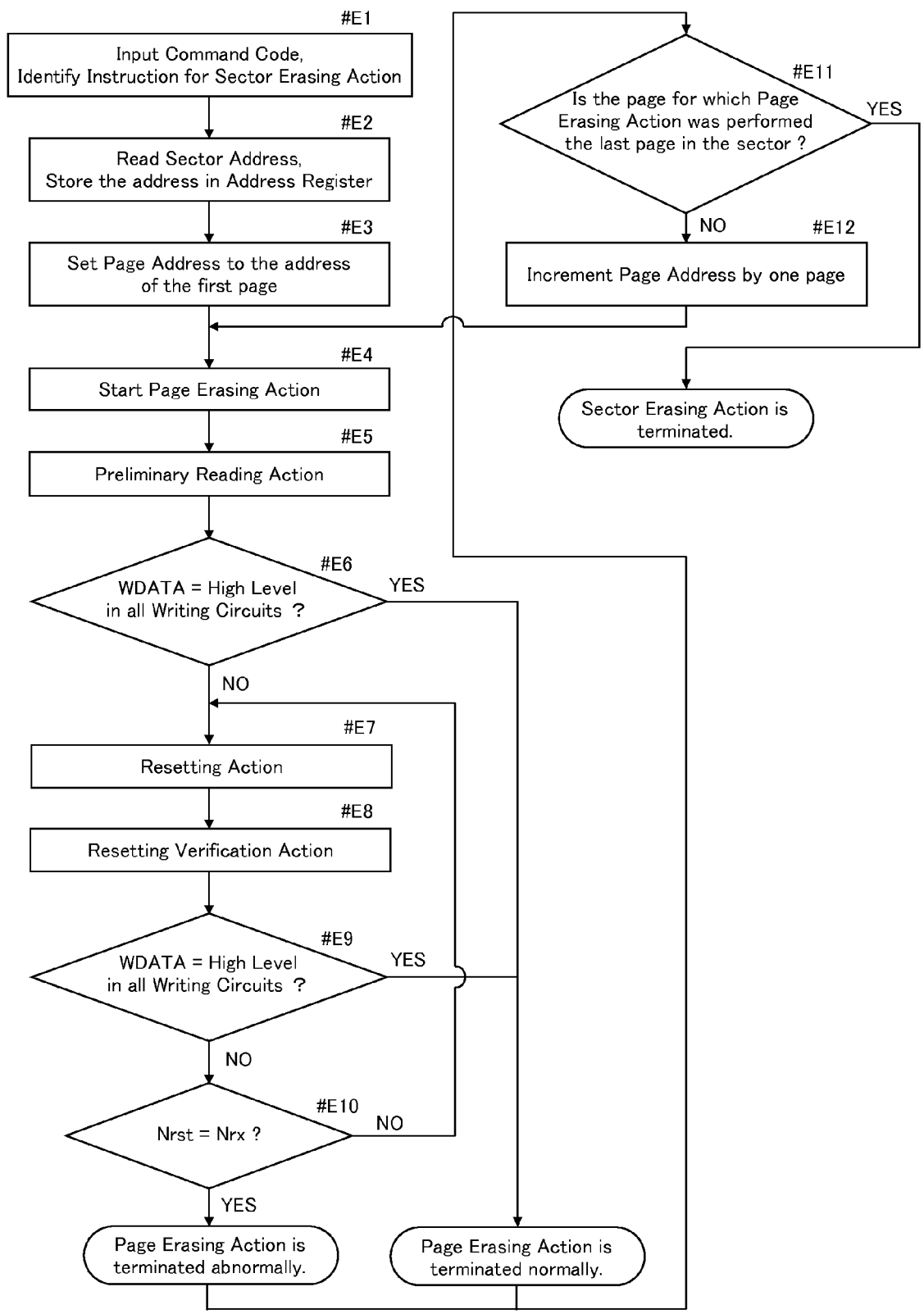
FIG. 18 is a flowchart illustrating the processing procedure of a sector erasing action.

Next, the sector erasing action will be described. FIG. 18 illustrates a flowchart of the sector erasing action. In a command input sequence, when a command code corresponding to the sector erasing action is read into the I/O control circuit 11, transferred to the command register 18, and the instruction for the sector erasing action is identified in the control logic circuit 19 (step #E1), the sector address (combination of the bank address and a part of the row address) specifying the sector that is the target of the erasing action is consecutively read into the I/O control circuit 11 in two or more batches, if necessary, in synchronization with the write enable signal WEB, and then stored in the address register 13 (step #E2). At this time, all the reading circuits 21 are inactivated, and the switches SW1 through SW4 are set to the OFF state.

When reading of the sector address is complete, the page address is set to the address of the first page in the sector specified by the sector address (step #E3), and the page erasing action is started. As regards the page erasing action, when the page erasing action of one page ends, the process moves to the next page address in the same sector, the following page erasing action is executed sequentially, and is repeated sequentially until the page erasing action is complete for all pages in the same sector.

When the page erasing action is started (step #E4), each data register 42 of all the writing circuits 22 is reset. The data retained in each data register 42 is reset to "0" by the reset signal DRRST, and the output terminal DROUT is set to a low level. Next, the source plate selection signal SPSEL is set to a low level, and the source plate driver 34 drives the source plate SP to the resetting voltage VRST. As a result, all the local bit lines LBL in the unselected state are driven to the resetting voltage VRST. Additionally, the row decoder 16 activates one of the 2M main word lines MWLB corresponding to the selected page that is currently the target of the page erasing action, and drives it to a low level, and at the same time, selects one of the four sub-word line selection signals WLSEL <0 to 3> corresponding to the same selected page and drives it to a high level. Thus, the sub-word lines SWL of the selected page transition to the high level, and the cell transistor CT of the selected memory cell MC is set to the ON state. The resetting state of each data register 42, and the drive states of the selected main word line MWLB and sub-word line SWL, and of the source plate SP are maintained at the same states, respectively without any change through the resetting action and the resetting verification action, during the time period of the page erasing action. Additionally, the drive state of the source plate SP is maintained at the same state during the time period of the sector erasing action.

Before starting the first resetting action of each page erasing action, the backward-direction sense amplifier 41 of the reading circuit 21 is activated, and the preliminary reading action is performed for the page that is currently the target of the page erasing action (step #E5). The reading action performed by the backward-direction sense amplifier 41 will be described below.

Figure 19:
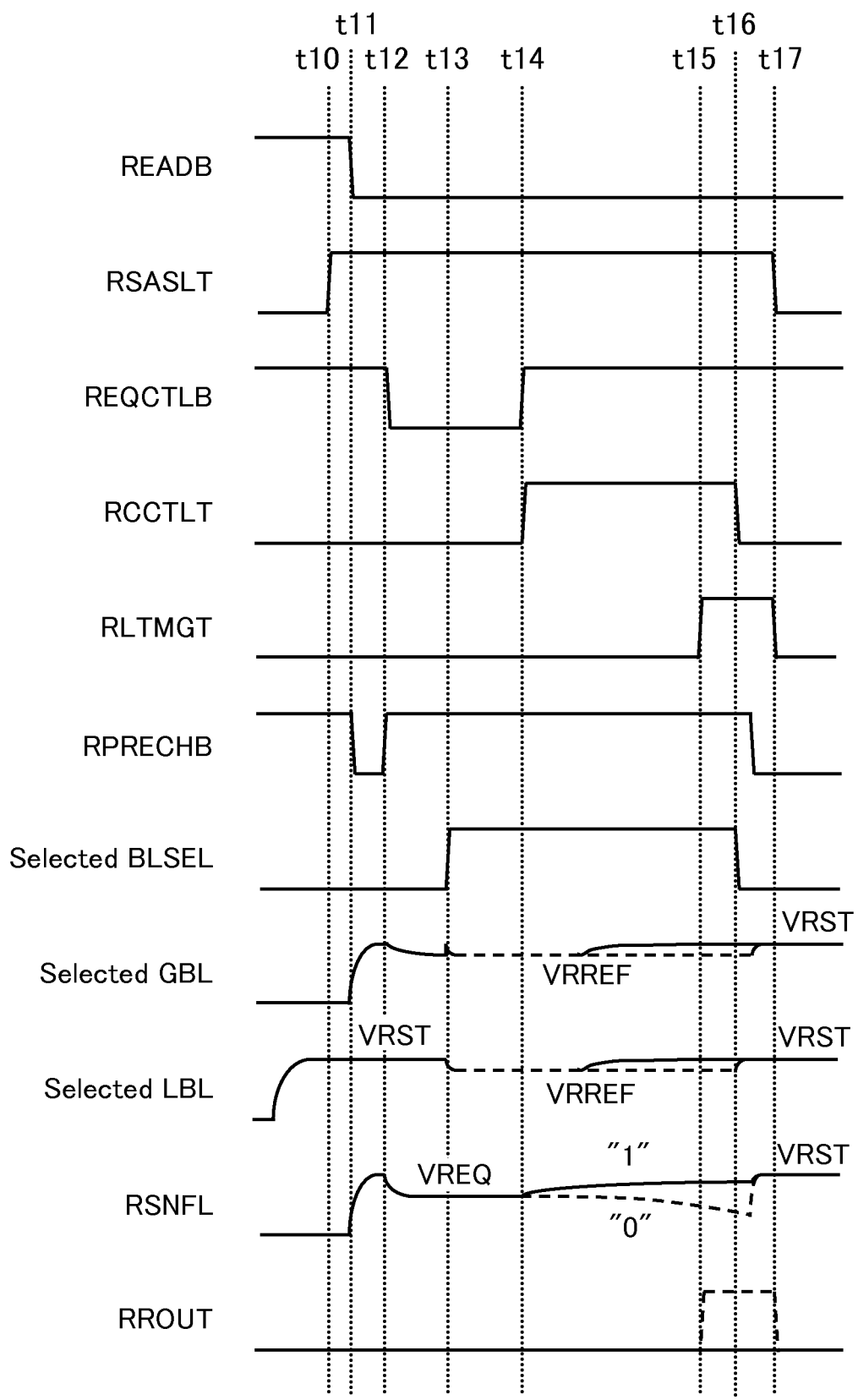
FIG. 19 is a timing chart illustrating the procedure of activation of the backward-direction sense amplifier shown in FIG. 10.

First of all, the procedure of activation of the backward-direction sense amplifier 41 will be described with reference to a timing chart of FIG. 19. At time t10, the activation signal RSASLT transitions from the low level to the high level, and the differential amplifier 60 is activated. At time t11, because the control signal READB transitions to the low level, the write driver 47 is inactivated, the output is set to the high impedance state, and the process of driving the global bit line GBL to the ground voltage VSS is canceled. Additionally, the precharge signal RPRECHB transitions from the high level to the low level, and the precharge process for charging the global bit line GBL up to a resetting voltage VRST higher than the reference voltage VRREF is started. It is to be noted that each action at time t11 and the activation of the differential amplifier 60 at time t10 may be executed simultaneously. Next, at time t12, the precharge signal RPRECHB returns from the low level to the high level, precharging of the global bit line GBL ends, the activation signal REQCTLB transitions from the high level to the low level, the CMOS transfer gate 63 is set to the ON state, and a reference voltage VREQ is inputted to both the non-inverting input and the inverting input of the comparator 61. If the level of the global bit line GBL is equal to or higher than the reference voltage VRREF, the precharging may be completed before the time t12. Because the level of the global bit line GBL is initialized up to a level higher than the reference voltage VRREF due to the precharging, the non-inverting output of the differential amplifier 60 is set to a low level, the PMOS transistor Q16 is set to the ON state, and the level of the global bit line GBL is pulled down up to almost the same level as the reference voltage VRREF, via the CMOS transfer gate 63 and the PMOS transistor Q16. The difference in potential between the resetting voltage VRST and the reference voltage VRREF is set to a low voltage such that the variable resistance element RCE does not get converted to a high resistance by mistake.

Next, at time t13, when one of the selected local bit line selection signals BLSEL <0 to 3> moves to a high level, the selected local bit line LBL is conducted to the global bit line GBL via the bit line selector 33. Because all the local bit lines LBL prior to the conduction to the global bit line GBL are in an unselected state, they are driven to the resetting voltage VRST, similar to the source plate SP. Because of the conduction to the global bit line GBL, the level of the local bit lines LBL is discharged up to the reference voltage VRREF. Here, although the local bit lines LBL receive a supply of electrical charge via the memory cells, they are set off because of the electrical charge drawn from the transistor Q16, and are maintained at the reference voltage VRREF.

Figure 20:
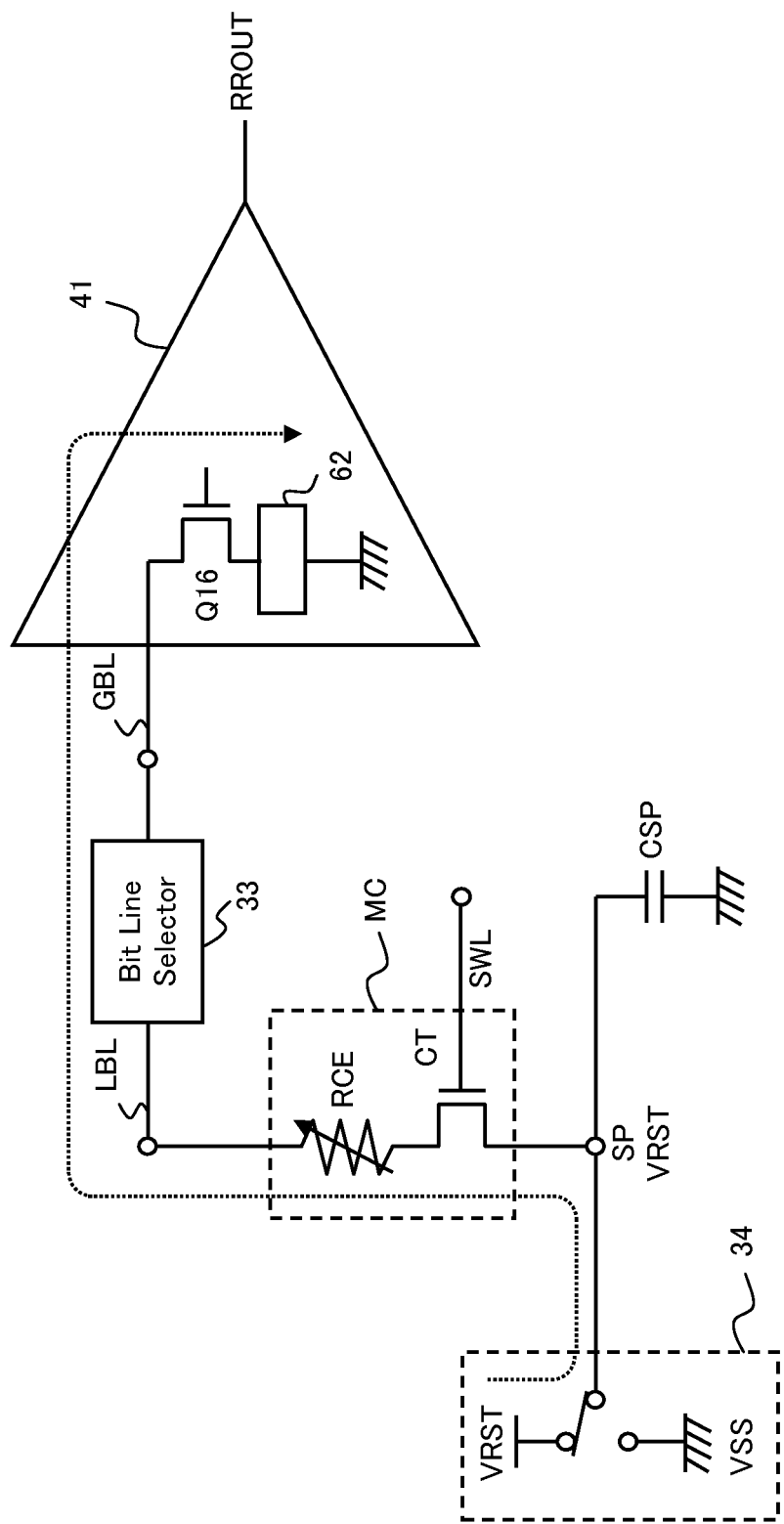
FIG. 20 is a diagram explaining an electric current path passing through a selected memory cell during a preliminary reading action and a resetting verification action according to the first embodiment.

Next, at time t14, the activation signal REQCTLB and the activation signal RCCTLT transition from a low level to a high level, and the CMOS transfer gate 63 is set to the OFF state, and at the same time, the constant current source circuit 62 is activated. Therefore, as illustrated in FIG. 20, an electric current path is formed from the source plate driver 34 up to the constant current source circuit 62 via the source plate SP, the cell transistor CT and the variable resistance element RCE of the selected memory cell MC, the local bit line LBL, the bit line selector 33, the global bit line GBL, and the PMOS transistor Q16. A memory cell current corresponding to the resistance state of the variable resistance element RCE flows in the variable resistance element RCE, from the side of the first electrode (cell transistor CT) to the side of the second electrode (local bit line LBL). Depending on the magnitude correlation of the reference current IREF flowing from the internal node RSNFL to the constant current source circuit 62, and the memory cell current IMC flowing in the selected memory cell MC, the voltage level of the internal node RSNFL changes from the reference voltage VREQ of the initialization level. Specifically, when the memory cell current is larger than the reference current (IREF <IMC), the level of the global bit line GBL rises higher than the reference voltage VRREF, and the voltage level of the internal node RSNFL rises higher than the reference voltage VREQ. Conversely, when the memory cell current is smaller than the reference current (IREF >IMC), the level of the global bit line GBL falls up to the reference voltage VRREF, and the voltage level of the internal node RSNFL falls below the reference voltage VREQ. As a result of the above, a difference in potential corresponding to the resistance state of the variable resistance element RCE occurs between the non-inverting input and the inverting input of the comparator 61. Specifically, when the resistance state of the variable resistance element RCE is the resetting state ("0") at a high resistance, the inverting input will have a lower electric potential than the non-inverting input (reference voltage VREQ). Conversely, when the resistance state of the variable resistance element RCE is the setting state ("1") at a low resistance, the inverting input will have a higher electric potential than the non-inverting input (reference voltage VREQ).

Next, at time t15, when the activation signal RLTMGT transitions from the low level to the high level, the comparator 61 is activated, the difference in potential between the non-inverting input and the inverting input is amplified, and a voltage level corresponding to the resistance state of the variable resistance element RCE is outputted to the exclusive OR circuit 43, via the switch SW2, in the state where the level of the logical value is inversed, as described above. Specifically, when the resistance state of the variable resistance element RCE is the resetting state ("0"), the high level ("1") is outputted, and conversely, when the resistance state of the variable resistance element RCE is the setting state ("1"), the low level ("0") is outputted. The output state is latched during the time period when the activation signal RLTMGT is at a high level.

Next, at time t16, one of the selected local bit line selection signals BLSEL <0 to 3> and the activation signal RCCTLT transition from the high level to the low level, and the electric current paths of both the reference current and the memory cell current are intercepted. Following this, at time t17, the activation signal RLTMGT and the activation signal RSASLT transition from the high level to the low level, both the differential amplifier 60 and the comparator 61 are inactivated, and the internal node RSNFL is set to the floating state. Note that the transition of each signal at time t16 may be performed simultaneously with time t17, or later than that. Additionally, around the time t17, the precharge signal RPRECHB transitions from the high level to the low level, and charges the global bit line GBL to the resetting voltage VRST.

During the preliminary reading action, the switches SW6 and SW8 are maintained in the OFF state and the switch SW7 is set to the ON state, and the value of the OR operation between the output of the exclusive OR circuit 43 and the expected values stored in the data register 42 is outputted from the OR circuit 45 to the judgment register 46 via the switch SW7, and is written and retained in the judgment register 46 between the time t15 and the time t17. The preliminary reading action (step #E5) is thus complete.

Because the data register 42 is reset in step #E4 and the expected value is "0", when the resistance state of the variable resistance element RCE is the resetting state ("0"), the high level ("1") is written into the judgment register 46 and the signal WDATA is set to a high level, and conversely, when the resistance state of the variable resistance element RCE is the setting state ("1"), the low level ("0") is written into the judgment register 46 and the signal WDATA transitions to the low level.

When the preliminary reading action is complete, the signal level of the signal WDATA outputted from the judgment register 46 is determined (step #E6). When the signal WDATA is at a low level in at least one of the writing circuits 22 ("NO" branch), the first resetting action (step #E7) is performed only in the writing circuit 22 in which the signal WDATA is at a low level. When the signal WDATA is at a high level in all the writing circuits 22 ("YES" branch), the resetting action need not be performed, and therefore, the page erasing action is terminated normally without executing the first resetting action (step #E7).

If the first resetting action (step #E7) is started, the precharge signal RPRECHB transitions from the low level to the high level, the charging of the global bit line GBL is stopped, and additionally, because of the transition of each of the control signals READB and RSTSLT to the high level, the write driver 47 is activated to drive the global bit line GBL to the resetting voltage VRST when the signal WDATA is at a high level, and to the ground potential VSS when the signal WDATA is at a low level. Next, when one of the selected local bit line selection signals BLSEL <0 to 3> moves to the high level, the selected local bit line LBL is conducted to the global bit line GBL, via the bit line selector 33. When the signal WDATA is at a low level, the selected local bit line LBL is driven to the ground potential VSS via the global bit line GBL.

Figure 21:
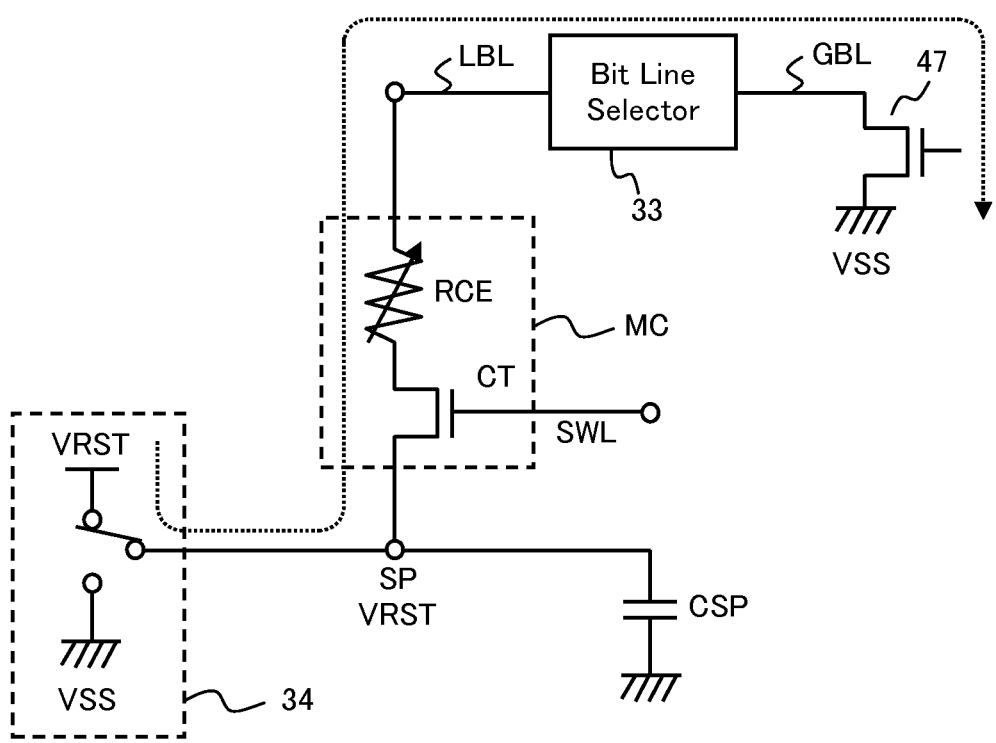
FIG. 21 is a diagram explaining an electric current path passing through a selected memory cell during a resetting action.

Therefore, as illustrated in FIG. 21, when the signal WDATA is at a low level, an electric current path is formed from the source plate driver 34 up to the write driver 47 via the source plate SP, the cell transistor CT and the variable resistance element RCE of the selected memory cell MC, the local bit line LBL, the bit line selector 33, and the global bit line GBL, and an electric current is applied to the variable resistance element RCE from the side of the first electrode (cell transistor CT) to the side of the second electrode (local bit line LBL), and the electrical resistance of the variable resistance element RCE is converted to a high resistance. FIG. 21 illustrates only the NMOS transistor that is in the ON state at the final stage of the write driver 47.

In FIG. 21, the electric current path passing though the variable resistance element RCE is formed continuously during the time period when each of the write driver 47, the bit line selector 33, the sub-word line driver 32, and the source plate driver 34 is activated simultaneously. During the time period of the resetting action, after the write driver 47 is activated, one of the selected local bit line selection signals BLSEL <0 to 3> moves to the high level, and the aforementioned electric current path is formed for a predetermined period, one of the selected local bit line selection signals BLSEL <0 to 3> returns to the low level, the selected local bit line LBL separates from the global bit line GBL, is driven to the ground potential VSS, and is set to the unselected state. As a result, the aforementioned electric current path is intercepted, the substantial resetting action state ends, and the selected local bit line LBL is set to the unselected state, and at the same time or thereafter, each of the control signals READB and SETSLT returns to the low level, the write driver 47 is inactivated, and the resetting action (step #E7) ends. When the resetting action ends, the precharge signal RPRECHB transitions from the high level to the low level, and charges the selected global bit line GBL to the resetting voltage VRST.

When the first resetting action (step #E7) ends, the process moves to the first resetting verification action (step #E8), the backward-direction sense amplifier 41 of the reading circuit 21 is activated, and the reading action is performed for the page that is the target of the resetting action. The procedure of the reading action in the resetting verification action is exactly the same as the procedure of activation of the backward-direction sense amplifier 41 in the preliminary reading action as described above, and as such, duplicate description is avoided.

Similar to during the preliminary reading action, during the resetting verification action, while the switches SW6 and SW8 are maintained in the OFF state, the switch SW7 is set to the ON state, and the value of the OR operation between the output of the exclusive OR circuit 43 and the expected values stored in the data register 42 is outputted from the OR circuit 45 to the judgment register 46 via the switch SW7, and is written and retained in the judgment register 46 between the time t15 and the time t17. The resetting verification action (step #E8) is thus complete.

Because the data register 42 is reset in step #E4 and the expected value is "0", when the resistance state of the variable resistance element RCE transitions to the resetting state ("0") and the resetting action is complete, the high level ("1") is written into the judgment register 46 and the signal WDATA transitions to a high level, and conversely, when the resistance state of the variable resistance element RCE is maintained in the setting state ("1") and the resetting action is not complete, the low level ("0") is written into the judgment register 46 and the signal WDATA is maintained at the low level.

On the other hand, in reality, the resetting action is not executed in the writing circuit 22 in which the signal WDATA is set to a high level at the start of the first resetting action, and furthermore, the resistance state of the variable resistance element RCE is determined to be the resetting state during the preliminary reading action. Because the expected value stored in the data register 42 is "0", and the output level from the backward-direction sense amplifier 41 is "1" (the logical value is inversed), the logical value "1" is outputted from the OR circuit 45 to the judgment register 46 via the switch SW7, and since this value is written and retained in the judgment register 46 at time t16, the level of the signal WDATA is maintained at the high level, without any change.

Next, when the first resetting verification action (step #E8) ends, it is determined whether the signal WDATA in all the writing circuits 22 is at a high level (step #E9). Here, the wired OR configuration can be adopted as a method for determining the output of all the signal WDATAs at once. If the signal WDATA is at a low level in any one of the writing circuits 22 ("NO" branch), it is determined whether the frequency Nrst of the resetting action that has already been performed has reached a predetermined limit value Nrx (step #E10), and if the frequency has reached the limit value Nrx ("YES" branch), the page erasing action is terminated abnormally. If the frequency Nrst of the resetting action has not reached the limit value Nrx ("NO" branch), the process returns to step #E7 so as to start the second resetting action. In a writing circuit 22 in which the signal WDATA is at a high level, the substantial resetting action cannot be performed. Hereinafter, the resetting action of step #E7, the resetting verification action of step #E8, and the judgment process of step #E9 and step #E10 are repeated until it is determined in step #E9 that the signal WDATA is at a high level in all the writing circuits 22, or it is determined in step #E10 that the frequency Nrst of the resetting action has reached the limit value Nrx. If it is determined in step #E9 that the signal WDATA is at a high level in all the writing circuits 22 ("YES" branch), the page erasing action terminates normally.

In the procedure described above, if the series of page erasing actions terminates normally or abnormally, it is determined whether the page for which the page erasing action was performed is the last page in the sector that is the target of the sector erasing action (step #E11). If the page for which the most recent page erasing action was performed is not the last page ("NO" branch), the process to increment the page address by one page (step #E12) is performed in order to change the page that is the target of the page erasing action to the next page, the process returns to step #E4, and the series of page erasing actions is repeatedly executed. During the judgment of step #E11, if it is determined that the page for which the most recent page erasing action was performed is the last page ("YES" branch), the sector erasing action is complete.

When the sector erasing action ends, the source plate selection signal SPSEL is set to a high level, and the source plate driver 34 drives the source plate SP to the ground potential VSS. Additionally, a status code corresponding to the termination state of the plurality of page erasing actions is written into the status register 23, the RY/BY terminal is set to the open state, and the next action mode is in the ready state. In the present embodiment, when each of the resetting action and the resetting verification action is started, a status code corresponding to each action state is written into the status register 23.

Figure 22:
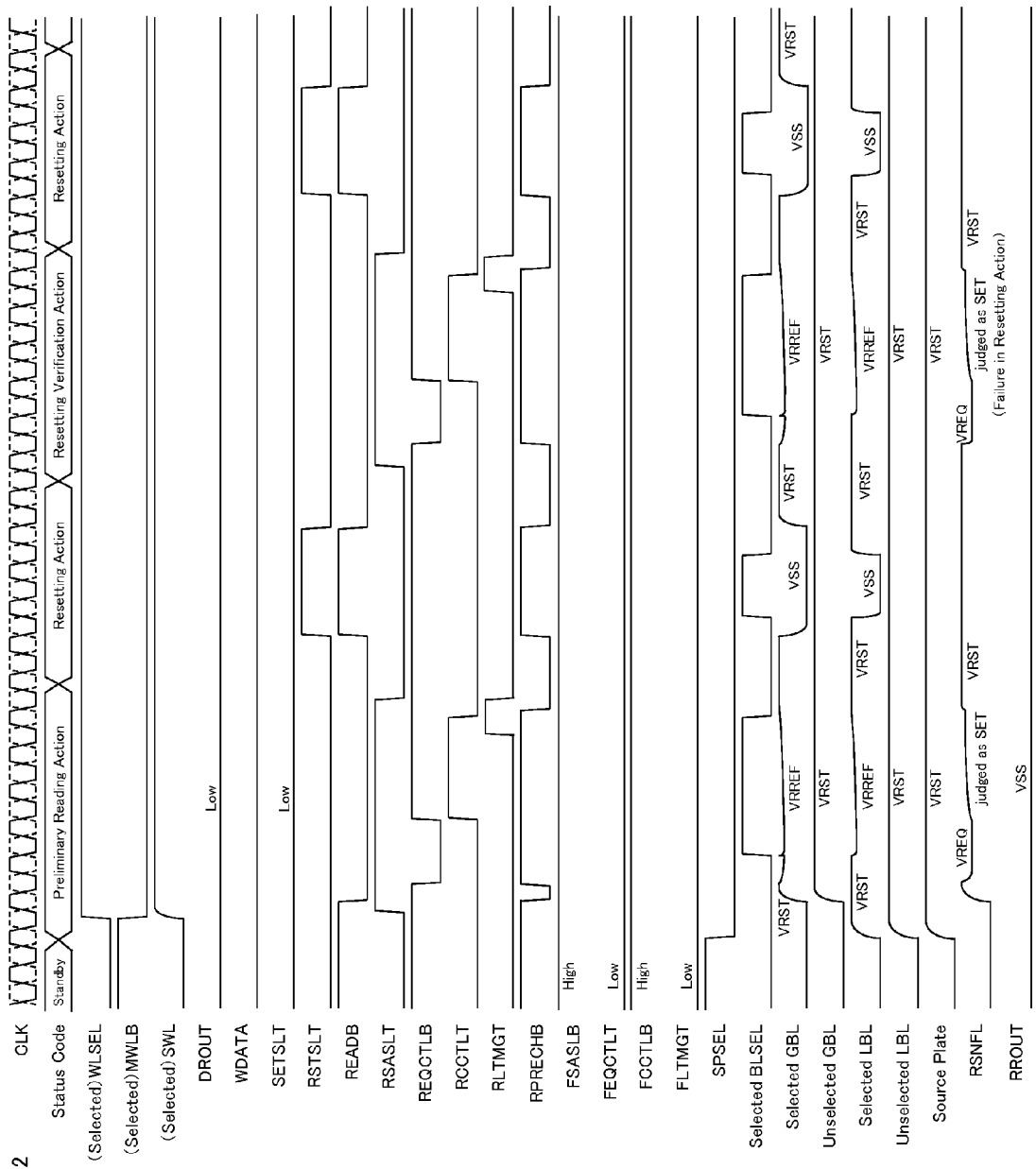
FIG. 22 is a voltage waveform diagram of the main signals and internal nodes during the time period of each of the first resetting action, the first resetting verification action, and the second resetting action in the first page of the sector erasing action according to the first embodiment.

FIG. 22 is a voltage waveform diagram of the main signals and internal nodes during the various time periods such as the preliminary reading action, the first resetting action, the first resetting verification action, and the second resetting action (first repeated setting action) in the first page of the sector erasing action. The first resetting verification action indicates the condition where the conversion to a high resistance in the first resetting action is not sufficient, and a setting state is detected. The selected GBL and the unselected GBL in the figure indicate the global bit lines GBL when the signal WDATA is at a low level and a high level, respectively, during the resetting action. Furthermore, the status codes indicate the internal state (progress status) during the sector erasing action after the start of the first resetting action, and can be read from the I/O terminal after passing the I/O control circuit 11 from the status register 23.

Figure 29:
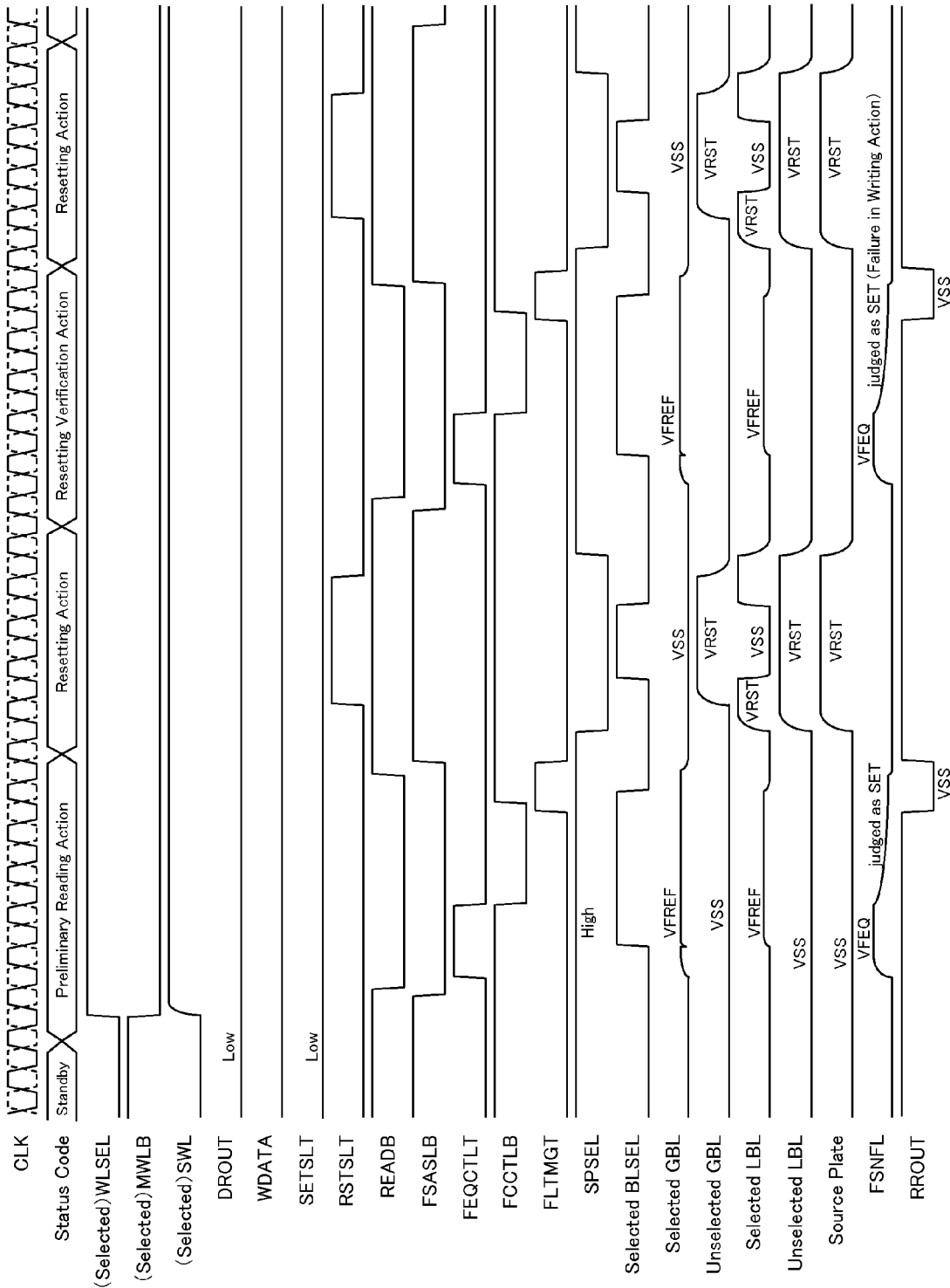
FIG. 29 is a voltage waveform diagram of the main signals and internal nodes during the time period of each of the first resetting action, the first resetting verification action, and the second resetting action in the first page of a conventional sector erasing action.

Next, the differences between the sector erasing action of the present embodiment and the conventional sector erasing action will be described below by comparing both erasing actions. FIG. 29 is a voltage waveform diagram of the main signals and internal nodes during the time period of each of the preliminary reading action, the first resetting action, the first resetting verification action, and the second resetting action (first repeated setting action) in the first page of a conventional sector erasing action. In the conventional sector erasing action, the resetting verification action and the preliminary reading action are performed similarly to the setting verification action of the page programming action by using the forward-direction sense amplifier 40 rather than the backward-direction sense amplifier 41. Specifically, it is assumed that in the reading circuit 21 according to the present embodiment that is illustrated in FIG. 8, rather than providing the backward-direction sense amplifier 41, a signal obtained by inverting the level of the output FROUT of the forward-direction sense amplifier 40 with an inverter is substituted for the output RROUT of the backward-direction sense amplifier 41. That is, the configuration is that all the reading actions are covered only by the forward-direction sense amplifier 40. The conventional sector erasing action will be described below by focusing on the differences with respect to the sector erasing action of the present embodiment that is illustrated in FIG. 22.

The flow of the process of the conventional sector erasing action is the same as the sector erasing action of the present embodiment that is illustrated in FIG. 18. The conventional sector erasing action will be explained below with reference to FIG. 18 and FIG. 29. As for the details of the process content from steps #E1 through #E3 illustrated in FIG. 18, the conventional sector erasing action is the same as the sector erasing action of the present embodiment. Excluding the drive states of the source plate SP and all the local bit lines LBL in the unselected state, as for the process content in step #E4, the conventional sector erasing action is the same as the sector erasing action of the present embodiment. Specifically, because the source plate selection signal SPSEL retains the high level without transitioning to the low level, the source plate SP is driven to the ground potential VSS by the source plate driver 34, and additionally, all the local bit lines LBL in the unselected state are also driven to the ground potential VSS. As described later, the conventional sector erasing action is significantly different from the sector erasing action of the present embodiment in that the drive state of the source plate SP is not maintained at the same state during the period of the page erasing action.

Next, in step #E5, the preliminary reading action is executed. The activation procedure of the forward-direction sense amplifier 40 in the preliminary reading action is the same as the procedure during the setting verification action described earlier with reference to the timing chart of FIG. 15, and is therefore omitted due to duplicate explanation. A voltage level corresponding to the resistance state of the variable resistance element RCE is outputted from the output FROUT of the forward-direction sense amplifier 40. Specifically, when the resistance state of the variable resistance element RCE is the resetting state ("0"), the low level ("0") is outputted, and conversely, when the resistance state of the variable resistance element RCE is the setting state ("1"), the high level ("1") is outputted. Therefore, the level of the signal RROUT is the inverted level of the output FROUT, and is inputted to the exclusive OR circuit 43 via the switch SW2. In the example illustrated in FIG. 29, it is assumed that the resistance state of the variable resistance element RCE is the setting state ("1").

During the preliminary reading action, the switches SW6 and SW8 are maintained in the OFF state and the switch SW7 is set to the ON state, and the value of the OR operation between the output of the exclusive OR circuit 43 and the expected values stored in the data register 42 is outputted from the OR circuit 45 to the judgment register 46 via the switch SW7, and is written and retained in the judgment register 46. The preliminary reading action (step #E5) is thus complete.

When the preliminary reading action is complete, the signal level of the signal WDATA outputted from the judgment register 46 is determined (step #E6). When the signal WDATA is at a low level in at least one of the writing circuits 22 ("NO" branch), the first resetting action (step #E7) is performed only in the writing circuit 22 in which the signal WDATA is at a low level. When the signal WDATA is at a high level in all the writing circuits 22 ("YES" branch), the resetting action need not be performed, and therefore, the page erasing action is terminated normally without executing the first resetting action (step #E7).

If the first resetting action (step #E7) is started, the source plate selection signal SPSEL transitions to the low level, and the source plate driver 34 drives the source plate SP to the resetting voltage VRST. Thus, all the local bit lines LBL are driven once to the resetting voltage VRST. Following this, in the state where the control signal READB has already transitioned to the high level, the control signal RSTSLT transitions to the high level due to which the write driver 47 is activated and drives the global bit line GBL to the resetting voltage VRST when the signal WDATA is at a high level, and to the ground potential VSS when the signal WDATA is at a low level. Next, when one of the selected local bit line selection signals BLSEL <0 to 3> moves to the high level, the selected local bit line LBL is conducted to the global bit line GBL, via the bit line selector 33. When the signal WDATA is at a low level, the selected local bit line LBL is driven to the ground potential VSS via the global bit line GBL.

Therefore, even in the resetting action of the conventional sector erasing action, similar to the sector erasing action of the present embodiment, as illustrated in FIG. 21, when the signal WDATA is at a low level, an electric current path is formed from the source plate driver 34 up to the write driver 47 via the source plate SP, the cell transistor CT and the variable resistance element RCE of the selected memory cell MC, the local bit line LBL, the bit line selector 33, and the global bit line GBL, and an electric current is applied to the variable resistance element RCE from the side of the first electrode (cell transistor CT) to the side of the second electrode (local bit line LBL), and the electrical resistance of the variable resistance element RCE is converted to a high resistance.

During the time period of the resetting action, after the write driver 47 is activated, one of the selected local bit line selection signals BLSEL <0 to 3> moves to the high level, and the aforementioned electric current path is formed for a predetermined period, one of the selected local bit line selection signals BLSEL <0 to 3> returns to the low level, the selected local bit line LBL separates from the global bit line GBL, is driven to the resetting voltage VRST, and is set to the unselected state. As a result, the aforementioned electric current path is intercepted, the substantial resetting action state ends, and the selected local bit line LBL is set to the unselected state. Next, the write driver 47 is inactivated due to the transition of the control signal RSTSLT to the low level, and the unselected global bit line GBL is driven to the ground potential VSS. Additionally, the source plate selection signal SPSEL transitions to the high level, and the source plate driver 34 drives the source plate SP to the ground potential VSS. As a result, all the local bit lines LBL are driven to the ground potential VSS. Additionally, each of the control signals READB and SETSLT returns to the low level, the write driver 47 is inactivated, and the resetting action (step #E7) ends.

When the first resetting action (step #E7) ends, the process moves to the first resetting verification action (step #E8), the forward-direction sense amplifier 40 of the reading circuit 21 is activated, and the reading action is performed for the page that is the target of the resetting action. The procedure of the reading action in the resetting verification action is exactly the same as the procedure of activation of the forward-direction sense amplifier 40 and writing to the judgment register 46 in the aforementioned preliminary reading action of the conventional sector erasing action, and as such, duplicate description is avoided.

Next, when the first resetting verification action (step #E8) ends, the judgment process from step #E9 up to step #E10 is performed with the same procedure as the sector erasing action of the present embodiment, and the resetting action of step #E7, the resetting verification action of step #E8, and the judgment process of step #E9 and step #E10 are repeated until it is determined in step #E9 that the signal WDATA is at a high level in all the writing circuits 22, or it is determined in step #E10 that the frequency Nrst of the resetting action has reached the limit value Nrx.

In the procedure as described above, if the series of page erasing actions terminates normally or abnormally, then with the same procedure as the sector erasing action of the present embodiment, the series of page erasing actions are repeatedly executed, passing through the processes of step #E11 and step #E12. During the judgment of step #E11, if it is determined that the page for which the most recent page erasing action was performed is the last page ("YES" branch), the sector erasing action is complete.

Next, the voltage waveform diagram of the main signals and internal nodes illustrated in FIG. 29 in the conventional sector erasing action processed according to the aforementioned procedure, and the voltage waveform diagram of the main signals and internal nodes in the sector erasing action according to the present embodiment illustrated in FIG. 22 will be compared. It is clearly understood from the voltage waveform of each of the source plate SP, the unselected global bit line GBL, and the unselected local bit lines LBL shown in FIG. 22 and FIG. 29 that, while in the sector erasing action according to the present embodiment, these signal voltages are maintained at the resetting voltage VRST, without being changed, after passing through a series of page erasing actions, in the conventional sector erasing action, at the start of and end of the first, second, and the following resetting actions, these signal voltages vary immensely between the ground potential VSS during the reading action and the resetting voltage VRST during the resetting action. Because the source plate SP and the unselected local bit lines LBL have a comparatively large parasitic capacitance, in the conventional sector erasing action, it takes time to perform charging and discharging, and the power consumption for this charging and discharging is increased. In comparison, in the sector erasing action according to the present embodiment, because no voltage variation occurs in the source plate SP and the unselected local bit lines LBL, which have a large parasitic capacitance, between the preliminary reading action and the resetting action, and between the resetting action and the resetting verification action, the transition between these actions can be performed at a low power consumption and high speed.

The page programming action and the sector erasing action have been explained above in detail, however, according to the circuit configuration of the reading circuit 21 of the present embodiment, the direction of flow of electric current in the memory cells MC is the same between the setting action and the setting verification action of the page programming action, and the voltage level of the source plate SP and the unselected local bit lines LBL, which have a large parasitic capacitance, can be maintained at a constant value through the setting action and the setting verification action. On the other hand, the direction of flow of electric current in the memory cells MC is the same between the resetting action and the resetting verification action of the sector erasing action as well, and the voltage level of the source plate SP, which has a large parasitic capacitance, can be maintained at a constant value through the resetting action and the resetting verification action. Therefore, a reduction in the power consumption and an improvement in speed can be achieved in both the page programming action and the sector erasing action.

Figure 23:
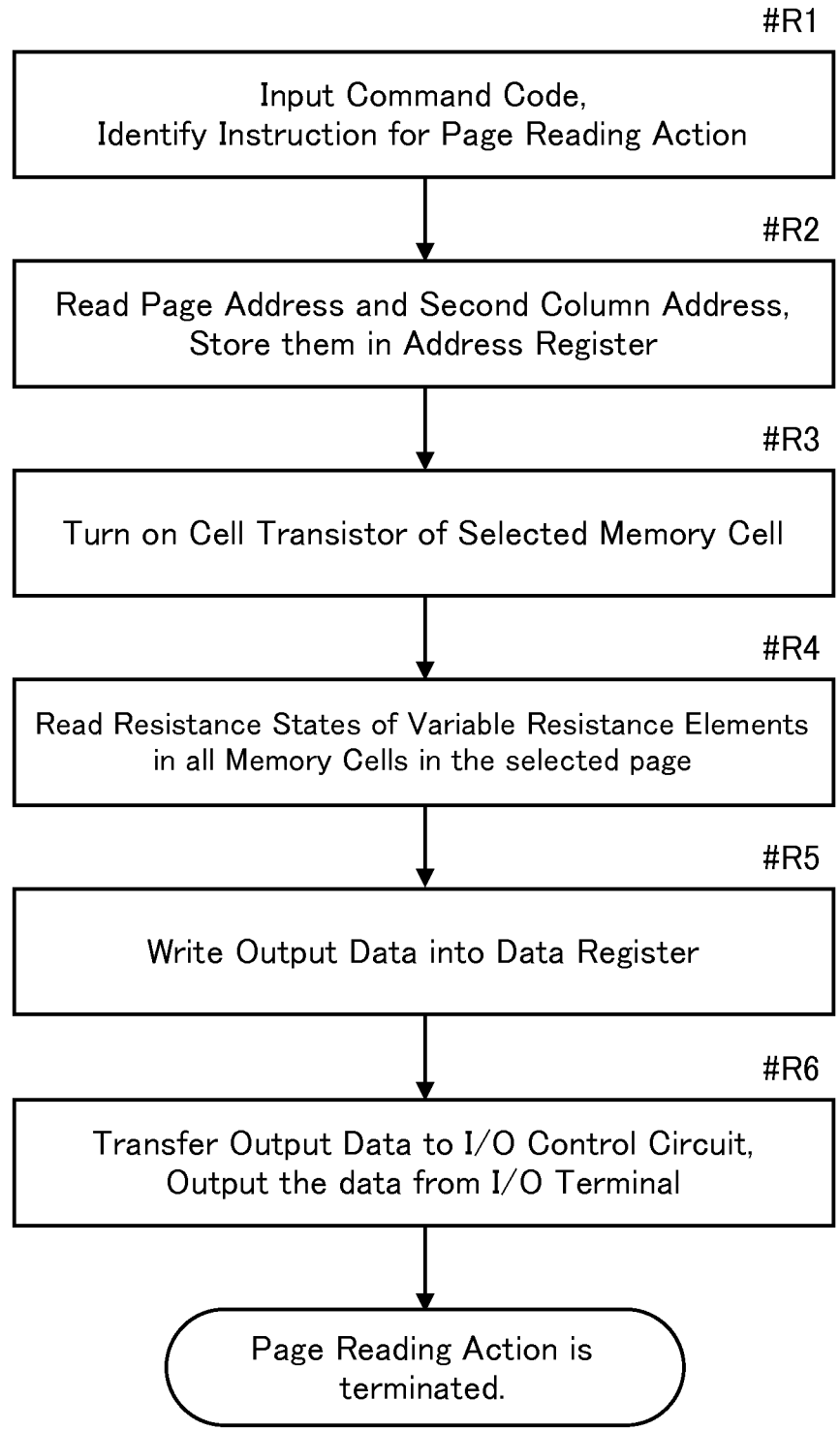
FIG. 23 is a flowchart illustrating the processing procedure of a page reading action.

The page reading action will be described below. FIG. 23 illustrates a flowchart of the page reading action. In a command input sequence, when a command code corresponding to the page reading action is read into the I/O control circuit 11, transferred to the command register 18, and the instruction for the page reading action is identified in the control logic circuit 19 (step #R1), the page address (combination of the bank address, the row address, and the first column address) specifying the page that is the target of the page reading action, and the entire second column address specifying the first address of the page are read into the I/O control circuit 11 in two or more batches in synchronization with the write enable signal WEB, and then stored in the address register 13 (step #R2). At this time, all the writing circuits 22 are inactivated, the data retained in each data register 42 is reset to "0" by the resetting signal DRRST, the switches SW2, and SW5 through SW8 are set to the OFF state, and the switches SW1 and SW3 are set to the ON state.

Next, the row decoder 16 activates one of the 2M main word lines MWLB and drives it to a low level, and at the same time, selects one of the four sub-word line selection signals WLSEL <0 to 3> and drives it to a high level, and the source plate driver 34 drives the source plate SP to the ground potential Vss (step #R3) when the source plate selection signal SPSEL becomes at a high level. As a result, the selected sub-word line SWL transitions to a high level, and the cell transistor CT of the selected memory cell MC is set to the ON state.

Next, the forward-direction sense amplifier 40 of the reading circuit 21 is activated, and reads the resistance states of the variable resistance elements RCE of all the memory cells MC in the selected page (step #R4). The procedure of the reading action in the page reading action is exactly the same as the procedure of activation of the forward-direction sense amplifier 40 in the aforementioned setting verification action, and as such, duplicate description is avoided.

The output data read from the forward-direction sense amplifier 40 of each reading circuit 21 is written into the data register 42 via the switches SW1 and SW3 (step #R5). Next, the switches SW4 of the eight reading circuits 21 corresponding to the specified address of the page is set to the ON state in accordance with the count value of the address counter in the page, so that the eight reading circuits 21 are selected. The output data stored in the data registers 42 of the eight reading circuits 21 is transferred to the I/O control circuit 11 in one byte unit, in synchronization with transition (toggle) between two signal levels of the read enable signal REB, and is outputted from the eight I/O terminals (I/O 1 through 8). Each time the output data is transferred to the I/O control circuit 11 in one byte unit, the count value of the address counter in the page is counted up, and the eight reading circuits 21 corresponding to the sequentially updated count value are selected, the output data is transferred to the I/O control circuit 11 from each data register 42 of the reading circuits 21, and is outputted from the eight I/O terminals (I/O 1 through 8) (step #R6). The process of transferring the output data from the data register 42 to the I/O control circuit 11 and the process of output from the eight I/O terminals (I/O 1 through 8) are repeated at the most as many times as the byte value of the page size, by sequentially selecting eight reading circuits 21, and the page reading action is complete when the aforementioned toggle of the aforementioned read enable signal REB is complete.

In the present embodiment, the forward-direction sense amplifier 40 is used in the page reading action, but instead of the forward-direction sense amplifier 40, the backward-direction sense amplifier 41 can also be used, and when the backward-direction sense amplifier 41 is used, the reading circuit 21 needs to be changed such that the output level of the output RROUT of the comparator 61 is inversed, and then the output data is stored in the data register 42.

Second Embodiment

In the first embodiment, as illustrated in FIG. 8, the reading circuit 21 includes two sense amplifiers, namely the forward-direction sense amplifier 40 and the backward-direction sense amplifier 41, and as illustrated in FIG. 8, the reading circuit 21 and the writing circuit 22 are operated for the same global bit line GBL, and additionally, the data register 42 is shared. However, the circuit configuration of the reading circuit 21 may be separated for the resetting verification action and for the other actions, and while one forward-direction sense amplifier 40 can be provided for each global bit line GBL, the backward-direction sense amplifier 41 can be provided at the source plate SP side by replacing the forward-direction sense amplifier 40. A second embodiment of the device of the present invention in which one of the two forward-direction sense amplifiers is provided at the global bit line GBL side, and the other is provided at the source plate SP side will be described below.

Figure 24:
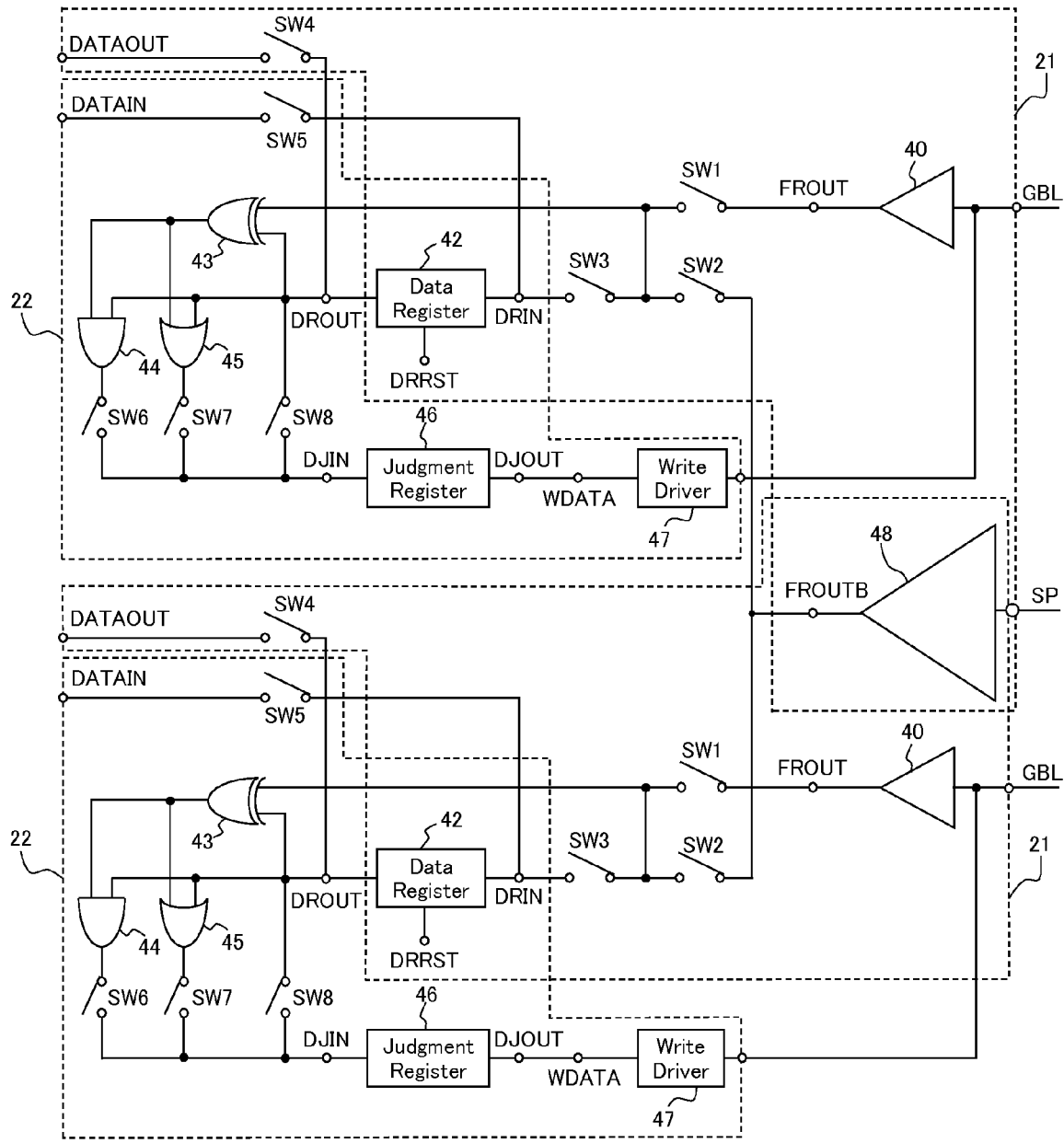
FIG. 24 is a block diagram illustrating an outline of a block configuration of a reading circuit and a writing circuit shown in FIG. 1 and FIG. 2, according to a second embodiment.

FIG. 24 illustrates an outline of a block configuration of the reading circuit 21 and the writing circuit 22 for two bits of the data that is to be read or written. The reading circuit 21 includes a first forward-direction sense amplifier 40 used during the setting verification action and the page reading action, a second forward-direction sense amplifier 48 used during the resetting verification action, a one-bit data register 42, and switches SW1 through SW4. In the present embodiment, respective source plates SP of the M number of blocks 30 of the same column are interconnected, and are also connected to the second forward-direction sense amplifier 48. Two global bit lines GBL and one source plate SP are provided in each one-block column.

The first forward-direction sense amplifier 40, the data register 42, and the switches SW1 through SW4 are provided for each global bit line GBL, and the second forward-direction sense amplifier 48 is provided for each source plate SP. That is, the second forward-direction sense amplifier 48 is shared between the two global bit lines GBL of the same block column. Although the circuit configurations of the first and the second forward-direction sense amplifiers 40 and 48 are exactly the same, the inverting output of the comparator 51 is connected to each of the two switches SW2 as the output FROUTB of the forward-direction sense amplifier 48 in order to output reading data having an output level that is inverse of the output FROUT of the first forward-direction sense amplifier 40, similar to the output RROUT of the backward-direction sense amplifier 41 of the first embodiment. Hereinafter, for the sake of convenience, "2" is added at the end of the names of the voltage inputted during the page erasing action so as to differentiate from those used with the first forward-direction sense amplifier 40.

In the present embodiment, in order to maintain the drive state of the source plate SP in the vicinity of the resetting voltage VRST throughout a series of page erasing actions in the sector erasing action, the bias state of the second forward-direction sense amplifier 48 is shifted to the high voltage side, compared to the first forward-direction sense amplifier 40. Specifically, the value of a reference voltage VFREF2 to be inputted to the forward-direction sense amplifier 48 is set to the same value as the resetting voltage VRST, and accordingly, the other reference voltage VFEQ2, an intermediate voltage VFIREF2, and a power supply voltage VDD2 are also shifted to the high voltage side while maintaining the same voltage differences.

The page programming action and the page reading action in the present embodiment uses the reading circuit 21 and the writing circuit 22 that are exactly the same as those used in the first embodiment and are executed according to the same procedure, and therefore, duplicate explanation is avoided. Also in the sector erasing action, because the resetting action uses the same writing circuit 22 as that used in the first embodiment, and is executed according to the same procedure, duplicate explanation is avoided.

The sector erasing action of the present embodiment is different from that of the first embodiment in that the preliminary reading action and the resetting verification action use the second forward-direction sense amplifier 48 in place of the backward-direction sense amplifier 41, and that the two global bit lines GBL are selected alternately, and the resistance state of the variable resistance element RCE of the memory cell MC connected to the selected global bit line GBL is read from the source plate SP side. Furthermore, in the first embodiment, the source plate driver 34 drives the source plate SP to the resetting voltage VRST through the preliminary reading action, the resetting action, and the resetting verification action, but in the second embodiment, the source plate driver 34 drives the source plate SP to the resetting voltage VRST during the resetting action, and sets it to the high impedance state during the preliminary reading action and the resetting verification action. On the other hand, the two global bit lines GBL are driven to the ground potential VSS by the write driver 47 during the resetting action, and during the preliminary reading action and the resetting verification action, the selected global bit line GBL is driven to a constant voltage (≈VRST−0.2 V to 0.3 V, the same voltage as the reference voltage VRREF of the first embodiment) that is approximately 0.2 V to 0.3 V lower than the resetting voltage VRST, and the unselected global bit line GBL is either driven to the resetting voltage VRST, or set to the high impedance state. Therefore, the circuit configurations of the source plate driver 34 and the write driver 47 of the second embodiment are different from the circuit configurations illustrated in FIG. 7 and FIG. 12. Because the action of the second forward-direction sense amplifier 48 is the same as that of the forward-direction sense amplifier 40 during the setting verification action, duplicate explanation is avoided.

Figure 25:
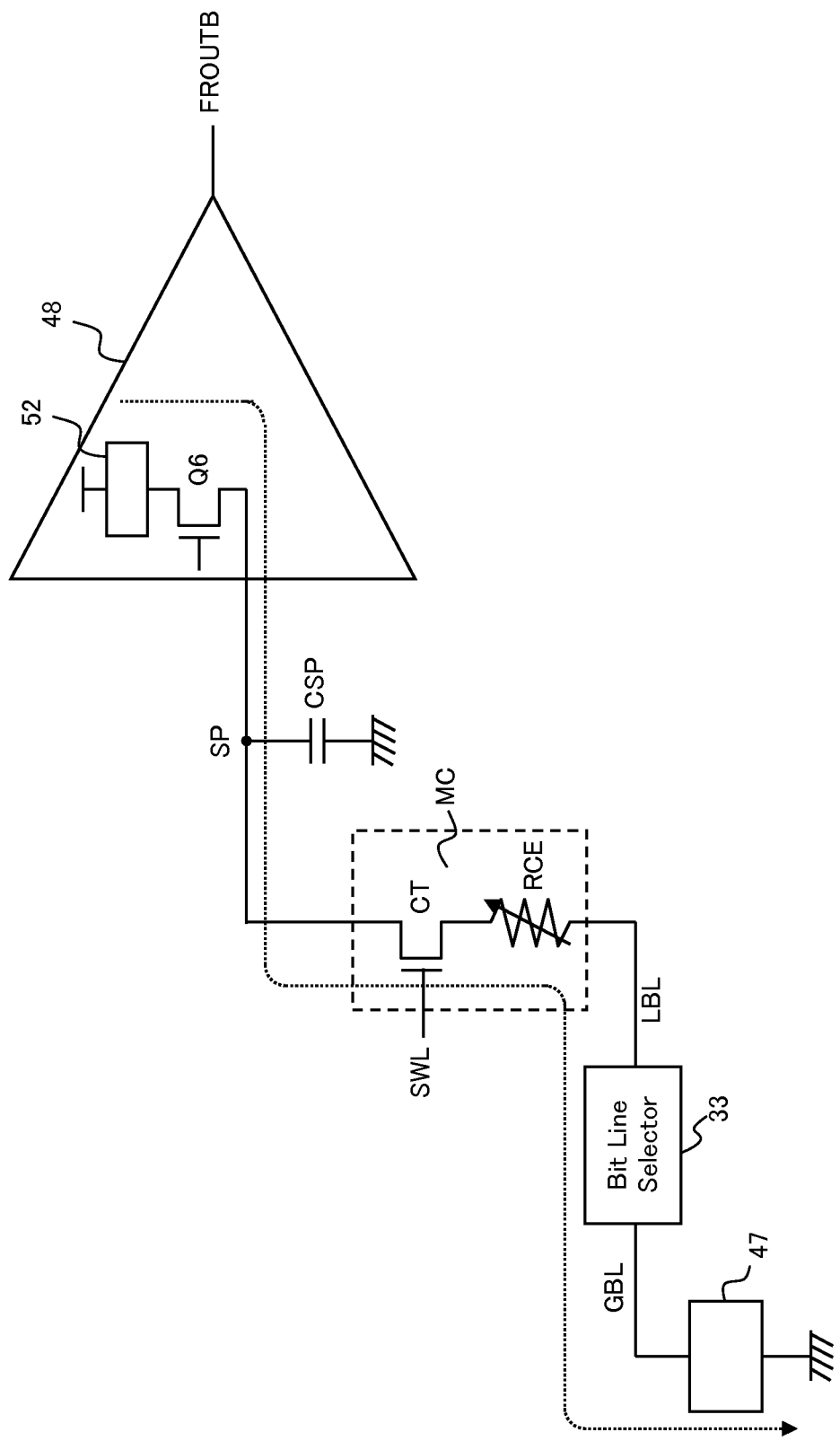
FIG. 25 is a diagram explaining an electric current path passing through a selected memory cell during a preliminary reading action and a resetting verification action according to the second embodiment.

FIG. 25 illustrates an electric current path during the preliminary reading action and the resetting verification action. As illustrated in FIG. 25, an electric current path is formed from the constant current source circuit 52 of the forward-direction sense amplifier 48 up to the write driver 47 via the NMOS transistor Q6, the source plate SP, the cell transistor CT and the variable resistance element RCE of the selected memory cell MC, the local bit line LBL, the bit line selector 33, and the selected global bit line GBL, and a memory cell current corresponding to the resistance state of the variable resistance element RCE flows in the variable resistance element RCE, from the side of the first electrode (cell transistor CT) to the side of the second electrode (local bit line LBL). The write driver 47 during the preliminary reading action and the resetting verification action has a larger current driving capability than the memory cell current, and maintains the electric potential of the selected global bit line GBL at a constant voltage (≈VRST−0.2 V to 0.3 V) that is approximately 0.2 V to 0.3 V lower than the resetting voltage VRST.

As for the circuit configuration of the place that is activated during the preliminary reading action and the resetting verification action of the write driver 47, for example, the same circuit configuration as that of the circuit part including the differential amplifier 60, the constant current source circuit 62 consisting of the NMOS transistors Q11 and Q12, the PMOS transistors Q16 and Q17, and the NMOS transistor Q15 of the backward-direction sense amplifier 41 illustrated in FIG. 10 can be used. Here, because the unselected local bit lines LBL have the same electric potential as the source plate SP, no electric current flows in a memory cell MC connected to an unselected local bit line LBL.

The output FROUTB from the forward-direction sense amplifier 48 is outputted to the judgment register 46 of the writing circuit 22 connected to the selected global bit line GBL via the switch SW2, the exclusive OR circuit 43, the OR circuit 45, and the switch SW7, and the output value of the OR circuit 45 is written and retained in the judgment register 46. Because the expected value in the data register 42 is "0", when the resistance state of the variable resistance element RCE is the resetting state ("0"), the high level ("1") is written into the judgment register 46 and the signal WDATA is set to a high level, and conversely, when the resistance state of the variable resistance element RCE is the setting state ("1"), the low level ("0") is written into the judgment register 46 and the signal WDATA transitions to the low level.

When the above action is repeatedly executed twice by interchanging the global bit lines GBL, the preliminary reading action or the resetting verification action ends once.

The preliminary reading action and the resetting verification action according to the second embodiment are executed from the source plate SP side, which has a large parasitic capacitance, and although it cannot be always said that these actions are best suited for large-scale memory cell arrays, they can be used in small-scale memory cell arrays.

A case in which the preliminary reading action and the resetting verification action are repeatedly executed by interchanging the global bit lines GBL is explained above, but, if the number of global bit lines GBL for each block column is set as one, or if the source plate SP of one block 30 is divided up into as many number as the number of global bit lines GBL (two in the present embodiment), so as to correlate the global bit line GBL and the source plate SP in a one-to-one ratio, there will be no need to repeatedly execute the aforementioned actions by interchanging the global bit lines GBL.

Third Embodiment

Figure 26:
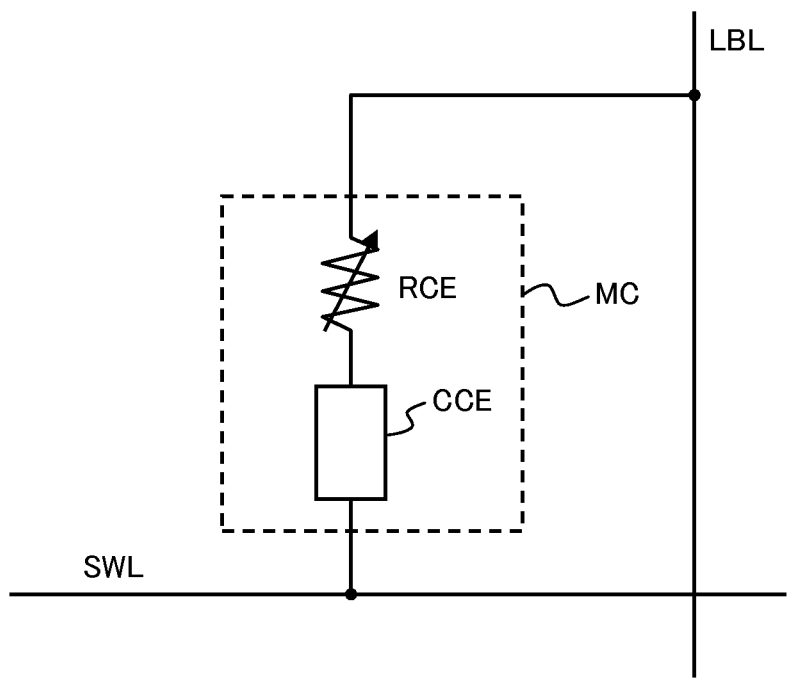
FIG. 26 is an equivalent circuit diagram illustrating an example of a memory cell having a two-terminal structure used in the semiconductor memory device according to the present invention.

In each of the embodiments described above, as illustrated in FIG. 4, a case in which a memory cell MC having a three-terminal structure configured by connecting an end of the variable resistance element RCE, and one of the source and drain of the cell transistor CT is used has been explained. The cell transistor CT is a three-terminal type current control element configured to control the flow of electric current between the source and the drain by controlling the gate potential, and a bipolar transistor can also be used as the three-terminal current control element. However, even by using a memory cell MC having a two-terminal structure configured by connecting one end of the variable resistance element RCE and one end of a current control element CCE having a two-terminal structure as illustrated in FIG. 26, or a memory cell having a two-terminal structure configured only by the variable resistance element RCE, the direction of the electric current flowing in the variable resistance element RCE of each of the memory cells MC can be made the same between the setting action and the setting verification action, and between the resetting action and the resetting verification action. As for the two-terminal current control element CCE, it is preferred to use an element, such as a varistor, by which the electric current can be applied in both directions when a voltage that is higher than a predetermined threshold voltage in accordance with the applied polarity is applied. Furthermore, in the memory cell MC illustrated in FIG. 26, the arrangement of the variable resistance element RCE and the current control element CCE may be interchanged.

As illustrated in FIG. 26, when the memory cell MC has a two-terminal structure, one end is connected to a local bit line LBL, and the other end is connected to a sub-word line SWL rather than the source plate SP. Therefore, the source plate SP and the source plate driver 34 that drives the source plate are not needed in each block 30. The electric current path passing through the memory cell MC passes through the sub-word line SWL and the sub-word line driver 32, rather than the source plate SP and the source plate driver 34. Furthermore, the voltages applied to the selected and unselected sub-word line SWL, and to the unselected local bit line LBL during each action are also different from those in the first embodiment. Therefore, the sub-word line driver 32 and the bit line selector 33 have a different circuit configuration than that in the first embodiment.

A third embodiment of the device of the present invention in which the memory cell MC has a two-terminal structure, the memory cell array configuration is the same as the first embodiment, and the same reading circuit 21 and writing circuit 22 are provided for each global bit line GBL will be described below.

During the setting action and the setting verification action, the selected sub-word line SWL is driven to the ground potential VSS, and the unselected sub-word line SWL and the unselected local bit line LBL are driven to an intermediate voltage VMSET of the setting voltage VSET and the ground potential VSS. The intermediate voltage VMSET, for example, is preferably a value (VFREF+VTSET) obtained by adding the threshold voltage VTSET, which is the value when the current control element CCE is in the ON state where it allows an electric current to flow in the direction of flow of the memory cell current during the action, to the reference voltage VFREF of the forward-direction sense amplifier 40. Furthermore, as compared to the first embodiment, the setting voltage VSET is preferably set to a voltage that is higher by the threshold voltage VTSET. Thus, during the setting action, when the signal WDATA is at a high level, an electric current path is formed from the write driver 47 up to the sub-word line driver 32 via the global bit line GBL, the bit line selector 33, the selected local bit line LBL, the variable resistance element RCE and the current control element CCE of the selected memory cell MC, and the selected sub-word line SWL, and an electric current flows in the variable resistance element RCE, from the side of the second electrode (local bit line LBL) to the side of the first electrode (current control element CCE), and the electrical resistance of the variable resistance element RCE is converted to a low resistance. During the setting action, the difference voltage (VSET−VMSET) of the setting voltage VSET and the intermediate voltage VMSET is applied to between the selected local bit line LBL and the unselected sub-word line SWL, and therefore, the setting voltage VSET and the reference voltage VFREF are adjusted such that the electrical resistance of the variable resistance element RCE does not change even at this applied voltage.

During the setting verification action, an electric current path is formed from the constant current source circuit 52 up to the sub-word line driver 32 via the NMOS transistor Q6, the global bit line GBL, the bit line selector 33, the selected local bit line LBL, the variable resistance element RCE and the cell transistor CT of the selected memory cell MC, and the selected sub-word line SWL, and a memory cell current corresponding to the resistance state of the variable resistance element RCE flows in the variable resistance element RCE, from the side of the second electrode (local bit line LBL) to the side of the first electrode (cell transistor CT). During the setting verification action, the difference in voltage between the selected local bit line LBL and the unselected sub-word line SWL varies in accordance with the resistance state of the variable resistance element RCE, but, if it is adjusted within the scope of variation such that the current control element CCE does not turn ON, the interference from the unselected memory cell MC connected to the selected local bit line LBL can be eliminated. During the setting action and the setting verification action, although an electric current path is formed from the bit line selector 33 up to the sub-word line driver 32 via the unselected local bit line LBL, the variable resistance element RCE and the current control element CCE of the unselected memory cell MC, and the selected sub-word line SWL, the voltage applied across the unselected memory cell MC is only the intermediate voltage VMSET, and therefore the electrical resistance of the variable resistance element RCE does not change.

Additionally, during the resetting action and the resetting verification action, the selected sub-word line SWL is driven to the resetting voltage VRST, and the unselected sub-word line SWL and the unselected local bit line LBL are driven to an intermediate voltage VMRST of the resetting voltage VRST and the ground potential VSS. The intermediate voltage VMRST, for example, is preferably a value (VRREF−VTRST) obtained by subtracting the threshold voltage VTRST (absolute value), which is the value when the current control element CCE is in the ON state where it allows an electronic current to flow in the direction of flow of the memory cell current during the action, from the reference voltage VRREF of the backward-direction sense amplifier 41. Furthermore, as compared to the first embodiment, the resetting voltage VRST and the reference voltage VRREF are preferably set to a voltage that is higher by the threshold voltage VTRST. Thus, during the resetting action, when the signal WDATA is at a low level, an electric current path is formed from the sub-word line driver 32 up to the write driver 47 via the selected sub-word line SWL, the current control element CCE and the variable resistance element RCE of the selected memory cell MC, the selected local bit line LBL, the bit line selector 33, and the global bit line GBL, and an electric current flows in the variable resistance element RCE, from the side of the first electrode (current control element CCE) to the side of the second electrode (local bit line LBL), and the electrical resistance of the variable resistance element RCE is converted to a high resistance. During the resetting action, because the voltage applied between the selected local bit line LBL and the unselected sub-word line SWL becomes the intermediate voltage VMRST, the electrical resistance of the variable resistance element RCE does not change.

During the resetting verification action, an electric current path is formed from the sub-word line driver 32 up to the constant current source circuit 62 via the selected sub-word line SWL, the current control element CCE and the variable resistance element RCE of the selected memory cell MC, the selected local bit line LBL, the bit line selector 33, the global bit line GBL, and the PMOS transistor Q16. A memory cell current corresponding to the resistance state of the variable resistance element RCE flows in the variable resistance element RCE, from the side of the first electrode (current control element CCE) to the side of the second electrode (local bit line LBL). During the resetting verification action, the difference in voltage between the selected local bit line LBL and the unselected sub-word line SWL varies in accordance with the resistance state of the variable resistance element RCE, but, if it is adjusted within the scope of variation such that the current control element CCE does not turn ON, the interference from the unselected memory cell MC connected to the selected local bit line LBL can be eliminated. During the resetting action and the resetting verification action, although an electric current path is formed from the sub-word line driver 32 up to the bit line selector 33 via the selected sub-word line SWL, the current control element CCE and the variable resistance element RCE of the unselected memory cell MC, and the unselected local bit line LBL, the voltage applied across the unselected memory cell MC is only the difference voltage of the resetting voltage VRST and the intermediate voltage VMRST, and therefore the electrical resistance of the variable resistance element RCE does not change.

Even when a memory cell MC having a two-terminal structure is used, by configuring the reading circuit 21 and the writing circuit 22 similarly to those of the first embodiment, the direction of the electric current flowing in the variable resistance element RCE of each of the memory cells MC can be made the same between the setting action and the setting verification action, and also between the resetting action and the resetting verification action. As a result, also in the third embodiment, the selected and unselected sub-word lines SWL used in place of the source plate SP of the first embodiment can be maintained at the same level, or alternatively, the variation in potential can be controlled, and a reduction in power consumption along with an improvement in speed can be achieved during the programming action and the erasing action.

Fourth Embodiment

In each of the aforementioned embodiments, cases in which the forward-direction sense amplifiers 40 and 48, and the backward-direction sense amplifier 41 used in the reading circuit 21 are configured from a current-detecting sense amplifier (current sensing amplifier) that detects the variation in the memory cell current are explained as examples, but the circuit configuration of each sense amplifier is not limited to the circuit configurations of the embodiments described above.

Figure 27:
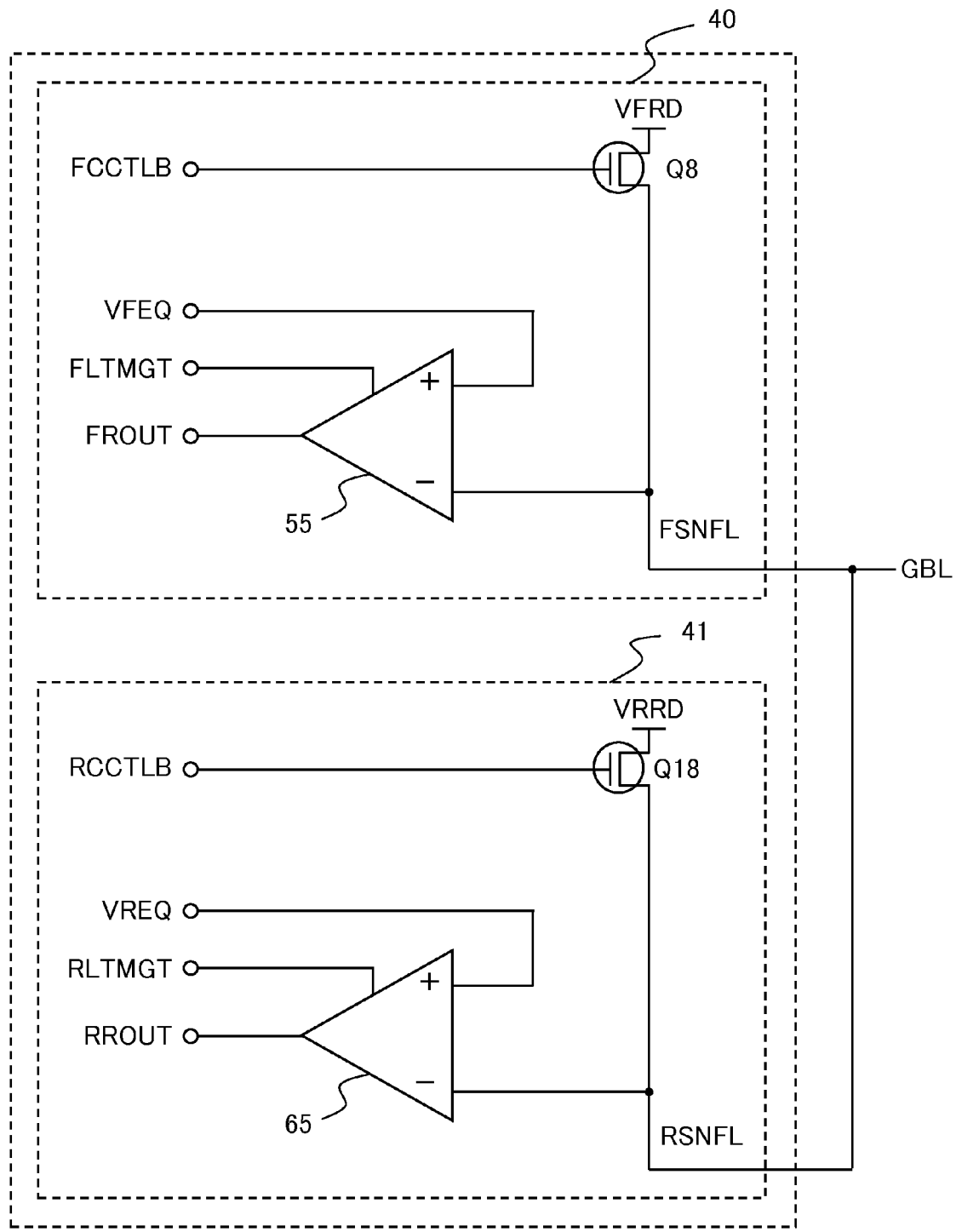
FIG. 27 is a circuit diagram illustrating another example of a circuit configuration of a forward-direction sense amplifier and a backward-direction sense amplifier shown in FIG. 8.

For example, as a modification of the first embodiment, as illustrated in FIG. 27, the forward-direction sense amplifier 40 and the backward-direction sense amplifier 41 may be configured by a voltage-detecting sense amplifier (voltage sensing amplifier) for detecting the variation in the voltage level of the global bit line GBL. Specifically, the forward-direction sense amplifier 40 is configured from a comparator 55 with latch, and a PMOS transistor Q8 for precharging, the backward-direction sense amplifier 41 is configured from a comparator 65 with latch, and a PMOS transistor Q18 for precharging, and the global bit line GBL is connected to the inverting input of the two comparators 55 and 65 with latch. The comparator 55 with latch accepts a forward-direction reference voltage VFEQ as the non-inverting input, and the non-inverting output is connected to the switch SW1 as the output FROUT of the forward-direction sense amplifier 40. The comparator 65 with latch accepts a backward-direction reference voltage VREQ as the non-inverting input, and the non-inverting output is connected to the switch SW2 as the output RROUT of the backward-direction sense amplifier 41.

The action of the forward-direction sense amplifier 40 will be described below. First of all, with the same procedure as in the first embodiment, the selected sub-word line SWL transitions to a high level, the cell transistor CT of the selected memory cell MC is set to the ON state, and the source plate driver 34 drives the source plate SP to a ground potential VSS, when the source plate selection signal SPSEL is set to a high level. In this state, the activation signal FCCTLB transitions to a low level, sets the PMOS transistor Q8 to the ON state, and charges the global bit line GBL to the forward-direction reading voltage VFRD. The forward-direction reading voltage VFRD is set to a low voltage such that the variable resistance element RCE does not get converted to a low resistance by mistake. When the charging of the global bit line GBL is complete, the activation signal FCCTLB returns to the high level, and the PMOS transistor Q8 is set to the OFF state because of which one of the selected local bit line selection signals BLSEL <0 to 3> moves to a high level, and the selected local bit line LBL is conducted to the global bit line GBL, via the bit line selector 33. As a result, an electric current path is formed from the global bit line GBL up to the source plate driver 34 via the bit line selector 33, the selected local bit line LBL, the variable resistance element RCE and cell transistor CT of the selected memory cell MC, and the source plate SP, and a memory cell current corresponding to the resistance state of the variable resistance element RCE flows in the variable resistance element RCE, from the side of the second electrode (local bit line LBL) to the side of the first electrode (cell transistor CT). When the variable resistance element RCE is in the setting state "1" for low resistance, the memory cell current is larger than that flowing when the variable resistance element RCE is in the resetting state "0" for high resistance, and the time period until when the global bit line GBL is discharged up to a voltage lower than the forward-direction reference voltage VFEQ is short, and as a result, if the activation signal FLTMGT is shifted from a low level to a high level at this timing, the comparator 55 with latch is activated, the voltage of the global bit line GBL and the constant reference voltage VFEQ are compared, the comparison results are latched, and then outputted as an output FROUT. Therefore, when the variable resistance element RCE is in the setting state "1", the high level "1" is outputted, and when the variable resistance element RCE is in the resetting state "0", the low level "0" is outputted.

Next, the action of the reverse-direction sense amplifier 41 will be described below in brief. First of all, with the same procedure as in the first embodiment, the selected sub-word line SWL transitions to a high level, the cell transistor CT of the selected memory cell MC is set to the ON state, and the source plate driver 34 drives the source plate SP to the resetting voltage VRST, when the source plate selection signal SPSEL is set to a low level. In this state, the activation signal RCCTLB transitions to a low level, sets the PMOS transistor Q18 to the ON state, and charges the global bit line GBL to the backward-direction reading voltage VRRD that is lower than the resetting voltage VRST. The difference in voltage of the resetting voltage VRST and the backward-direction reading voltage VRRD is set to a low voltage such that the variable resistance element RCE does not get converted to a high resistance by mistake. When the charging of the global bit line GBL is complete, the activation signal RCCTLB returns to the high level, and the PMOS transistor Q18 is set to the OFF state because of which one of the selected local bit line selection signals BLSEL <0 to 3> moves to a high level, and the selected local bit line LBL is conducted to the global bit line GBL, via the bit line selector 33. As a result, an electric current path is formed from the source plate driver 34 up to the global bit line GBL via the source plate SP, the cell transistor CT and the variable resistance element RCE of the selected memory cell MC, the selected local bit line LBL, and the bit line selector 33, and a memory cell current corresponding to the resistance state of the variable resistance element RCE flows in the variable resistance element RCE, from the side of the first electrode (cell transistor CT) to the side of the second electrode (local bit line LBL). When the variable resistance element RCE is in the setting state "1" for low resistance, the memory cell current is larger than that flowing when the variable resistance element RCE is in the resetting state "0" for high resistance, and the time period until when the global bit line GBL is charged up to a voltage higher than the backward-direction reference voltage VREQ is short, and as a result, the voltage of the global bit line GBL and the constant reference voltage VREQ are compared in the comparator 65 with latch at this timing, the comparison results thereof are latched, and then outputted as an output RROUT. Therefore, when the variable resistance element RCE is in the setting state "1", the low level "0" is outputted, and when the variable resistance element RCE is in the resetting state "0", the high level "1" is outputted.

Alternative Embodiments

Alternative embodiments will be described below.

(1) A characteristic of the device of the present invention is that the direction of the electric current flowing in the variable resistance element RCE of each of the memory cells MC is the same between the setting action and the setting verification action, and between the resetting action and the resetting verification action, and as a result, the variation in the potential of nodes having a large parasitic capacitance, such as the source plate SP, during the programming action and the erasing action, can be prevented, which leads to a reduction in power consumption and an improvement in speed during the programming action and the erasing action. Therefore, as long as a device has this characteristic, the method of performing the setting verification action and the resetting verification action, and the circuit configurations used therein are not limited to each of the aforementioned embodiments.

(2) In the fourth embodiment, a modification of the first embodiment in which a voltage sensing amplifier is used has been explained, but similar modifications are possible for the third embodiment as well. Furthermore, in the first or the third embodiment, one of the forward-direction sense amplifier 40 and the backward-direction sense amplifier 41 may be configured by a current sensing amplifier, and the other may be configured by a voltage sensing amplifier. Additionally, as a modification of the second embodiment, either one or both of the two forward-direction sense amplifiers 40 and 48 of the reading circuit 21 may be configured by a voltage sensing amplifier rather than a current sensing amplifier.

Figure 28:
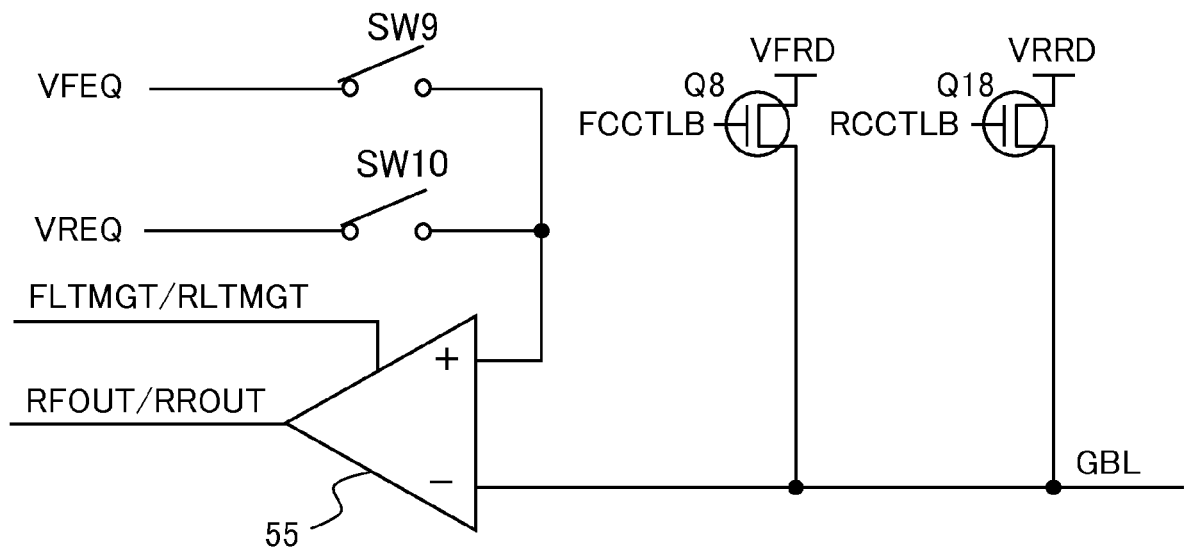
FIG. 28 is a circuit diagram illustrating another example of a circuit configuration of a forward-direction sense amplifier and a backward-direction sense amplifier shown in FIG. 27.

Additionally, the two comparators 55 and 65 with latch, as illustrated in FIG. 27 and explained in the fourth embodiment, may be configured by a single comparator 55 with latch, as illustrated in FIG. 28, and either one of the forward-direction reference voltage VFEQ and the backward-direction reference voltage VREQ may be selected and inputted to the inverting input, via switches SW9 and SW10. In such a case, the activation signal FLTMGT/RLTMGT of the comparator 55 with latch is the OR operation of the activation signal FLTMGT and the activation signal RLTMGT of the fourth embodiment.

Additionally, the circuit configurations of the current sensing amplifier illustrated in the aforementioned first embodiment and of the voltage sensing amplifier illustrated in the fourth embodiment are just examples, and sense amplifiers with various circuit configurations can be used.

Additionally, the writing circuits 22 illustrated in each of the aforementioned embodiments are also not limited to the aforementioned embodiments, and can be changed to various circuit configurations, and furthermore, a circuit configuration suitable to the action mode to be used can be adopted.

Additionally, the power supply voltage of the writing circuits 22 illustrated in each of the aforementioned embodiments need not necessarily be a constant value during the repetitive writing and verification actions, and may be varied depending on the writing frequency and the like.

Additionally, the timing of each action and the pulse width illustrated in each of the aforementioned embodiments need not necessarily be the same during the repetitive writing and verification actions, and may be varied depending on the writing frequency and the like.

(3) In each of the aforementioned embodiments, the page programming action, sector erasing action, and page reading action have been explained as the action modes, but the programming action, erasing action, and reading action need not necessarily be performed in page unit or sector unit. Additionally, the size and configuration of one page, and the size and configuration of one sector are also not limited to the aforementioned embodiments.

For example, in the first embodiment, the size of one page (unit: bytes) is set to the value (N/4) obtained by dividing the number (2N) of memory cells MC selected simultaneously by the I/O count (8), but when the setting action and the setting verification action are performed in several batches while changing the memory cells MC selected simultaneously, the size of one page can be expanded in multiples of the execution count. If a single execution is termed as a "phase", for example, the expansion of the size of one page can be implemented by extending the number of bits of the data register 42 and the judgment register 46 in multiples of the number of phases in the reading circuit 21 and the writing circuit 22 illustrated in FIG. 8. Specifically, when each of the setting action and the setting verification action is executed by sequentially switching four local bit lines LBL, and selecting them in order across four phases, with respect to one global bit line GBL, the size of one page (unit: bytes) will be the value (N) obtained by dividing the number (2N) of memory cells MC selected simultaneously by the I/O count (8) and multiplying the result (N/4) by four. In the setting action and setting verification action of the first phase, the data of the first bit of the data register 42 and the judgment register 46 is used, in the setting action and setting verification action of the second phase, the data of the second bit of the data register 42 and the judgment register 46 is used, and thereafter, in a similar manner, by correlating the order number of the phase and the data used in the data register 42 and the judgment register 46, the size of one page in the page programming action can be extended. An additional circuit for a counter and the like used for switching the phase may be configured in the array control circuit 20.

Additionally, the programming action, erasing action, and reading action may be executed either in the byte unit or word unit (when the I/O count is other than 8) based on a random access action. For example, if each action is executed only in the byte unit, the reading circuit 21 and the writing circuit 22 need not be provided for each global bit line GBL. The reading circuit 21 and the writing circuit 22 may be provided for each I/O, and a global bit line selection circuit may be provided between the reading circuit 21 and writing circuit 22, and the global bit line GBL, so as to perform each action for the selected global bit line GBL.

Additionally, in each of the aforementioned embodiments, each of the command codes, address input, input data, output data, and status codes is either inputted to or outputted from the I/O control circuit 11 via eight I/O terminals (I/O 1 through 8), but a dedicated input terminal for address input may also be provided. Additionally, if only the random access action is performed in the byte unit or the word unit, the action mode need not necessarily be decided by the input of the command code. Similar to a general SRAM, the action mode may be decided by an externally input control signal.

Additionally, in each of the aforementioned embodiments, the programming action and the erasing action are handled as separate writing actions, but these may be processed as a single writing action. For example, the programming action for one page may be performed by writing the input data for one page into the data register 42, then performing the preliminary reading action, followed by a series of page erasing actions, and then, performing the page programming action. Furthermore, the page erasing action and the page programming action may be performed in the reverse order. Furthermore, the page erasing action may be performed not by executing the resetting action for all the variable resistance elements RCE that are in the setting state, but by selecting only the variable resistance elements RCE in the setting state for which the input data (expected value) written in the data register 42 is "0", and performing the resetting action to the selected variable resistance elements RCE.

Additionally, by setting the source plates SP connected to the memory cells MC that are connected to the same global bit line to the same electric potential, and by enabling the source plates SP to be driven independently for each global bit line, the programming actions or erasing actions corresponding to the expected value may be executed, for each global bit line, simultaneously in parallel, in accordance with the input data (expected value) written in the data register 42.

(4) In each of the aforementioned embodiments, as illustrated in FIG. 2, a hierarchical array configuration including two hierarchies of bit lines and word lines, respectively, has been explained as the memory cell array configuration, but in the case of a small memory cell array configuration, a single-layer memory cell array configuration may be set, without providing the global bit lines and main word lines. Furthermore, even when the hierarchical array configuration is adopted, the number of rows and columns of the memory cells MC in the sub-array 31, the number of rows and columns of blocks 30 in one bank, and furthermore, the number of banks are not limited to the aforementioned embodiments, and can be changed appropriately.

(5) In each of the aforementioned embodiments, the definition of the setting action, setting verification action, resetting action, resetting verification action, programming action, and erasing action is provided for the sake of convenience, and is not limited to the definition of the aforementioned embodiments. For example, the action by which the electrical resistance of a variable resistance element RCE is converted to a high resistance may be termed as the setting action, and the action by which the electrical resistance is converted to a low resistance may be termed as the resetting action. Additionally, the logical value "0" may be assigned to the state in which the electrical resistance of the variable resistance element RCE is converted to a low resistance, and the logical value "1" may be assigned to the state in which the electrical resistance of the variable resistance element RCE is converted to a high resistance. By reversing the assignment of the logical values, the circuit configuration of the reading circuit 21 and the writing circuit 22 may be changed, as required.

(6) In each of the aforementioned embodiments, the detailed timings of circuit actions and the voltage values are only examples, and are not limited to those illustrated in the aforementioned embodiments as long as the desired action can be implemented.

(7) In each of the aforementioned embodiments, the device of the present invention is assumed to be an independent semiconductor memory device, but the device of the present invention may be a built-in type of semiconductor memory device provided on the same substrate or embedded within the same package as the semiconductor device such as a microprocessor and an application specific integrated circuit (ASIC), and in such a case, a part of the circuits, excluding the memory cell array 10 in the block configuration of the device of the present invention illustrated in FIG. 1, may be configured by external circuits of the device of the present invention.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device, comprising:
a memory cell array configured by arranging a plurality of memory cells, each of which includes a variable resistance element for storing information based on a variation in electrical resistance, in a row direction and a column direction, respectively, such that one ends of the memory cells of the same column are connected to a common first control line, and the other ends of the memory cells of at least the same row or the same column are connected to a common second control line;
a selection circuit for selecting the memory cell to be written or read;
a writing circuit for changing an electrical resistance of the variable resistance element of the selected memory cell; and
a reading circuit for reading a resistance state of the variable resistance element of the selected memory cell, wherein
the writing circuit is configured to execute each of a setting action in which the electrical resistance of the variable resistance element is converted to a low resistance by applying an electric current from the one end side to the other end side of the memory cell via the variable resistance element, and a resetting action in which the electrical resistance of the variable resistance element is converted to a high resistance by applying an electric current from the other end side to the one end side of the memory cell via the variable resistance element, and
the reading circuit is configured to execute each of a first reading action in which the resistance state of the variable resistance element is read by applying an electric current from the one end side to the other end side of the memory cell via the variable resistance element, and a second reading action in which the resistance state of the variable resistance element is read by applying an electric current from the other end side to the one end side of the memory cell via the variable resistance element.

2. The semiconductor memory device according to claim 1, wherein,
in a case where the writing circuit performs the setting action, the reading circuit is activated at a predetermined timing, and performs the setting verification action to determine whether the setting action is complete or not by reading the resistance state of the memory cell which is a target of the setting action through the first reading action, and
in a case where the writing circuit performs the resetting action, the reading circuit is activated at a predetermined timing, and performs the resetting verification action to determine whether the resetting action is complete or not by reading the resistance state of the memory cell which is a target of the resetting action through the second reading action.

3. The semiconductor memory device according to claim 1, wherein
the memory cell is configured by connecting the variable resistance element and a current control element in series.

4. The semiconductor memory device according to claim 1, wherein
the reading circuit electrically connects to either one of the first control line and the second control line to which the selected memory cell is connected, and then detects an electric current flowing in either of the control lines, or variation in voltage that occurs therein, so as to read the resistance state of the selected memory cell through an activated reading action that is either one of the first reading action and the second reading action.

5. The semiconductor memory device according to claim 1, wherein
the reading circuit includes a first reading circuit that executes the first reading action and a second reading circuit that executes the second reading action,
the first reading circuit electrically connects to either one of the first control line and the second control line to which the selected memory cell is connected,
the second reading circuit electrically connects to the other of the first control line and the second control line to which the selected memory cell is connected, and
each of the first reading circuit and the second reading circuit detects an electric current flowing in either the first or the second control line to which each of the first reading circuit and the second reading circuit is electrically connected, or magnitude or variation in voltage that occurs therein, so as to read the resistance state of the selected memory cell.

6. The semiconductor memory device according to claim 1, wherein
the reading circuit includes two types of sense amplifiers which have circuit configurations symmetrical to each other, and use active elements opposite to each other in conductivity type and electric field direction, and while one of the two types of sense amplifiers is used for the first reading action, the other is used for the second reading action.

7. The semiconductor memory device according to claim 1, wherein,
in a case where the reading circuit performs a reading action that is an independent action and accompanies neither the setting action nor the resetting action, to read the resistance state of the memory cell in an already-written state in which either the setting action or the resetting action is complete, the reading circuit performs a predetermined reading action that is one of the first reading action and the second reading action.

8. A semiconductor device, comprising:
a first and a second control lines; and
a first memory cell whose one end and the other end are connected to the first and the second control lines, respectively, and which includes a first variable resistance element that is set to a first resistance state when a predetermined electric current is applied from the one end to the other end, and that is reset to a second resistance state when another predetermined electric current is applied from the other end to the one end; and a first reading circuit connected to the first control line, wherein the first reading circuit includes a first control unit configured to read a resistance state of the first variable resistance element by applying an electric current from the one end side to the other end side of the first memory cell via the first variable resistance element, and a second control unit configured to read the resistance state of the first variable resistance element by applying an electric current from the other end side to the one end side of the first memory cell via the first variable resistance element.

9. The semiconductor device according to claim 8, wherein the first control unit of the first reading circuit operates in response to the application of the predetermined electric current from the one end to the other end of the first memory cell, and the second control unit operates in response to the application of the another predetermined electric current from the other end to the one end of the first memory cell.

10. The semiconductor device according to claim 8, further comprising:

a third control line;

a fourth control line electrically connected to the second control line; and a second memory cell whose one end and the other end are connected to the third and fourth control lines, respectively, and which includes a second variable resistance element that is set to the first resistance state when the predetermined electric current is applied from the one end to the other end, and that is reset to the second resistance state when the another predetermined electric current is applied from the other end to the one end; and a second reading circuit connected to the third control line, wherein the second reading circuit includes a third control unit configured to read the resistance state of the second variable resistance element by applying an electric current from the one end side to the other end side of the second memory cell via the second variable resistance element, and a fourth control unit configured to read the resistance state of the second variable resistance element by applying an electric current from the other end side to the one end side of the second memory cell via the second variable resistance element.

11. The semiconductor device according to claim 10, wherein the third control unit of the second reading circuit operates in response to the application of the predetermined electric current from the one end to the other end of the second memory cell, and the fourth control unit operates in response to the application of the another predetermined electric current from the other end to the one end of the second memory cell.

12. A semiconductor device comprising:

first and second control lines;

a first memory cell including first and second nodes respectively connected to the first and second control lines and a variable resistance element provided between the first and second nodes;

a write operation circuit connected to the first control line, the write operation circuit being configured to render a resistance state of the variable resistance element a first resistance state by applying an electric current from the first node to the second node and a second resistance state by applying an electric current from the second node to the first node; and a read operation circuit including first and second detection circuits connected in common to the first control line, the first detection circuit being configured to detect the resistance state of the variable resistance element by applying an electric current from the first node to the second node, the second detection circuit being configured to detect the resistance state of the variable resistance element by applying an electric current from the second node to the first node.

13. The semiconductor device as claimed in claim 12, wherein the write operation circuit includes first and second voltage terminals respectively supplied with first and second electrical potentials, the first electrical potential being greater in absolute value than the second electrical potential, the semiconductor device further comprising:

a read/write operation circuit connected to the second control line, the read/write operation circuit including third and fourth voltage terminals respectively supplied with third and fourth electrical potentials, the third electrical potential being greater in absolute value than the fourth electrical potential;

the first electrical potential being greater in absolute value than the fourth electrical potential and the third electrical potential being greater in absolute value than the second electrical potential.

14. The semiconductor device as claimed in claim 13, wherein the write operation circuit connects the first voltage terminal to the first control line and the read/write operation circuit connects the fourth voltage terminal to the second control line to render the resistance state of the variable resistance element the first resistance state, and the write operation circuit connects the second voltage terminal to the first control line and the read/write operation circuit connects the third voltage terminal to the second control line to render the resistance state of the variable resistance element the second resistance state.

15. The semiconductor device as claimed in claim 12, wherein the first detection circuit of the read operation circuit includes a fifth voltage terminal supplied with a fifth electrical potential, the second detection circuit of the read operation circuit includes a sixth voltage terminal supplied with a sixth electrical potential, the fifth electrical potential being greater in absolute value than the sixth electrical potential, the first detection circuit of the read operation circuit connecting the fifth voltage terminal to the first control line and the read/write operation circuit connecting the fourth voltage terminal to the second control line to detect the resistance state of the variable resistance element, and the second detection circuit of the read operation circuit connecting the sixth voltage terminal to the first control line and the read/write operation circuit connecting the third voltage terminal to the second control line to detect the resistance state of the variable resistance element.

16. The semiconductor device as claimed in claim 14, wherein the second and fourth electrical potentials are substantially equal in absolute value to each other.

17. The semiconductor device as claimed in claim 15, wherein the second and sixth electrical potentials are substantially equal in absolute value to each other.

* * * * *

UNITED STATES PATENT AND TRADEMARK OFFICE
CERTIFICATE OF CORRECTION

PATENT NO. : 9,042,156 B2  Page 1 of 1
APPLICATION NO. : 13/647573
DATED : May 26, 2015
INVENTOR(S) : Nakura et al.

It is certified that error appears in the above-identified patent and that said Letters Patent is hereby corrected as shown below:

On the title page, please correct the Assignee (73) to read as follows:

(73) Assignee: SHARP KABUSHIKI KAISHA, Osaka-shi, Osaka (JP)
ELPIDA MEMORY, INC., Tokyo, (JP)

Signed and Sealed this
Tenth Day of November, 2015

Michelle K. Lee
*Director of the United States Patent and Trademark Office*